US009203393B2

(12) United States Patent
Takasu et al.

(10) Patent No.: US 9,203,393 B2
(45) Date of Patent: Dec. 1, 2015

(54) SEMICONDUCTOR APPARATUS

(71) Applicant: DENSO CORPORATION, Kariya, Aichi-pref. (JP)

(72) Inventors: Hisashi Takasu, Nishio (JP); Atsushi Kobayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/411,988

(22) PCT Filed: Aug. 23, 2013

(86) PCT No.: PCT/JP2013/004987
§ 371 (c)(1),
(2) Date: Dec. 30, 2014

(87) PCT Pub. No.: WO2014/034063
PCT Pub. Date: Mar. 6, 2014

(65) Prior Publication Data
US 2015/0155863 A1 Jun. 4, 2015

(30) Foreign Application Priority Data

Aug. 30, 2012 (JP) .................................. 2012-190065
Nov. 27, 2012 (JP) .................................. 2012-258499

(51) Int. Cl.
*H03B 1/00* (2006.01)
*H03K 3/00* (2006.01)
(Continued)

(52) U.S. Cl.
CPC ........ *H03K 17/0812* (2013.01); *H01L 27/0629* (2013.01); *H01L 29/2003* (2013.01);
(Continued)

(58) Field of Classification Search
CPC ........... H03K 17/0812; H03K 17/0412; H01L 29/2003; H01L 27/0629

USPC ......... 327/108–112, 427, 434, 437, 374–377, 327/379–391; 326/82, 83
See application file for complete search history.

(56) References Cited

U.S. PATENT DOCUMENTS 5,475,333 A 12/1995 Kumagai
5,717,343 A * 2/1998 Kwong .......................... 326/27
(Continued)

FOREIGN PATENT DOCUMENTS

JP 2000-59191 A 2/2000
JP 2002-44934 A 2/2002
(Continued)

OTHER PUBLICATIONS

International Search Report of the International Searching Authority mailed Oct. 15, 2013 for the corresponding International application No. PCT/JP2013/004987 (and English translation).
(Continued)

*Primary Examiner* — Lincoln Donovan
*Assistant Examiner* — Thomas Skibinski
(74) *Attorney, Agent, or Firm* — Posz Law Group, PLC

(57) ABSTRACT

A semiconductor apparatus includes a switching device, a voltage detection circuit, a switch circuit, and a control circuit. The voltage detection circuit outputs a detection voltage according to a voltage applied between the first and second terminals of the switching device. The switch circuit is provided in series with a gate drive wire connected to the gate terminal of the switching device and switches between a high impedance state and a low impedance state according to a control signal. The control circuit outputs the control signal to put the switch circuit into the low impedance state when the detection voltage is not greater than a predetermined threshold voltage and outputs the control signal to put the switch circuit into the high impedance state when the detection voltage is greater than the threshold voltage.

31 Claims, 35 Drawing Sheets

(51) Int. Cl.

| | | |
|---|---|---|
| *H03K 17/0812* | (2006.01) | |
| *H03K 17/0814* | (2006.01) | |
| *H03K 17/082* | (2006.01) | |
| *H03K 17/16* | (2006.01) | |
| *H01L 27/06* | (2006.01) | |
| *H01L 29/20* | (2006.01) | |
| *H03K 17/0412* | (2006.01) | |
| *H02M 1/08* | (2006.01) | |

(52) U.S. Cl.
CPC ........ *H03K17/0412* (2013.01); *H03K 17/0822* (2013.01); *H03K 17/08142* (2013.01); *H03K 17/166* (2013.01); *H02M 1/08* (2013.01); *H03K 2217/0027* (2013.01)

(56) References Cited

U.S. PATENT DOCUMENTS

| | | | | |
|---|---|---|---|---|
| 6,060,937 | A * | 5/2000 | Singer et al. | 327/390 |
| 6,335,577 | B1 | 1/2002 | Baba | |
| 6,385,028 | B1 * | 5/2002 | Kouno | 361/111 |
| 6,424,131 | B1 | 7/2002 | Yamamoto et al. | |
| 2001/0015670 | A1 * | 8/2001 | Sakai et al. | 327/434 |
| 2002/0131276 | A1 * | 9/2002 | Katoh et al. | 363/16 |
| 2005/0258890 | A1 | 11/2005 | Miyazaki | |
| 2008/0230834 | A1 * | 9/2008 | Akagi et al. | 257/337 |
| 2012/0139589 | A1 * | 6/2012 | Machida et al. | 327/109 |

FOREIGN PATENT DOCUMENTS

| | | |
|---|---|---|
| JP | 2002-84174 A | 3/2002 |
| JP | 2002-171746 A | 6/2002 |
| JP | 2008-61290 A | 3/2008 |

OTHER PUBLICATIONS

Written Opinion of the International Searching Authority mailed Oct. 15, 2013 for the corresponding International application No. PCT/JP2013/004987 (and English translation).

\* cited by examiner

SEMICONDUCTOR APPARATUS

CROSS REFERENCE TO RELATED APPLICATION

The present disclosure is a U.S. national stage application of International Patent Application No. PCT/JP2013/004987 filed on Aug. 23, 2013 and is based on Japanese Patent Application No. 2012-190065 filed on Aug. 30, 2012 and No. 2012-258499 filed on Nov. 27, 2012, the contents of which are incorporated herein by reference.

TECHNICAL FIELD

The present disclosure relates to a semiconductor apparatus having increased resistance to overvoltage.

BACKGROUND

Like an inductive element such as a coil, a resistive load generally has an inductance due to a presence of a wire inductance. When a transistor drives this type of load having an inductance, a counter-electromotive force occurs at the time of turn-off. In a load drive circuit, a switching power supply, an inverter circuit, etc., a freewheeling diode is connected in parallel with a transistor or a load to prevent occurrence of a counter-electromotive force. However, even in this case, since a surge voltage occurs with switching, a means of protecting a transistor from a surge voltage is needed.

The patent literature 1 has proposed a protection circuit where a Zener diode group is connected between the gate and drain of a MOSFET. When a surge voltage is applied to the drain, the Zener diode group breaks down. To reduce an increase in a gate voltage due to a breakdown, a Zener diode group is also connected between the gate and source of the MOSFET.

Patent Literature

Patent Literature 1: JP2000-77537A

SUMMARY

When a Zener diode is connected between the gate and drain and between the gate and source like in the above-described protection circuit, a parasitic capacitance is added to the gate, so that a switching speed is reduced. Since a semiconductor device with an AlGaN/GaN junction (hereinafter referred to as the GaN-HEMT) has a very small ON resistance and superior current interrupting characteristics compared to a conventional Si device, it is expected to serve as a next-generation power device applied to the above-described various circuits.

However, since the GaN-HEMT, which has a high DC conductance gm, has a small gate capacitance (e.g., about one quarter of that of a conventional device), it is likely to be influenced by a parasitic capacitance compared to a conventional semiconductor device. Since the GaN-HEMT has a low gate threshold voltage (e.g., about 2V) and a low gate breakdown voltage (e.g., about 5V), it is difficult to improve a switching speed by increasing a gate voltage.

It is noted that a conventional Si device such as a MOS transistor has avalanche resistance. Therefore, even when a voltage above a breakdown voltage is applied between a drain and gate, a breakdown does not occur until it reaches a certain energy level. In contrast, since the GaN-HEMT has no avalanche resistance, a voltage even slightly above a breakdown voltage cannot be applied.

In view of the above, it is an object of the present disclosure is to provide a semiconductor device in which a resistance to a surge voltage is increased while a gate parasitic capacitance is kept low so that a fast switching performance can be kept.

According to a first aspect of the present disclosure, a semiconductor apparatus includes a switching device, a voltage detection circuit, a switch circuit, and a control circuit. The switching device changes a conduction state between a first terminal and a second terminal according to a gate voltage applied between a gate terminal and the first terminal. The first terminal corresponds to a source or an emitter, the second terminal corresponds to a drain or a collector, and the switching device is a GaN-HEMT, a MOSFET, an IGBT, etc.

The voltage detection circuit outputs a detection voltage according to a voltage applied between the first terminal and the second terminal of the switching device. The switch circuit is provided in series with a gate drive wire connected to the gate terminal of the switching device and switches between a high impedance state and a low impedance state according to a control signal. When the detection voltage is not greater than a threshold voltage, the control circuit outputs the control signal to put the switch circuit into the low impedance state. Thus, a drive signal is supplied to the gate terminal through the switch circuit, so that the switching device is turned ON and OFF in accordance with the drive signal.

In contrast, when the detection voltage exceeds the threshold voltage due to occurrence of a surge voltage, the control circuit outputs the control signal to put the switch circuit into the high impedance state. Thus, the gate terminal of the switching terminal is disconnected and put into a high impedance state. After that, the gate voltage depends on a voltage applied between the first terminal and the second terminal and a gate capacitance (for example, a gate-to-drain capacitance and a gate-to-source capacitance). When the voltage between the first terminal and the second terminal increases sharply due to a turn-off or the like, the gate voltage increases accordingly, so that the switching device is self-turned ON. Energy of the surge voltage is released through the switch device which remains self-turned ON, and the voltage between the first terminal and the second terminal of the switching device is limited to or below a device breakdown voltage.

The threshold voltage is set less than the detection voltage which the voltage detection circuit outputs when a voltage within a range where a voltage protection operation for the switching device is necessary is applied between the first terminal and the second terminal of the switching device. The voltage within the range where the voltage protection operation is necessary includes at least a voltage greater than a breakdown voltage of the switching device. Further, the threshold voltage is set greater than the detection voltage which the voltage detection circuit outputs when a voltage within a range where the voltage protection operation for the switching device is unnecessary is applied between the first terminal and the second terminal of the switching device. The voltage within the range where the voltage protection operation is unnecessary is a voltage which is less than the breakdown voltage of the switching device and from which it is not necessary to protect the switching device.

According to the first aspect, since a parasitic capacitance added to the gate of the switching device is zero (or small), a resistance to a surge voltage applied between the first terminal and the second terminal is increased while a fast switching performance is kept.

According to a second aspect of the present disclosure, a semiconductor apparatus includes a switching device, a first voltage detection circuit, a second voltage detection circuit, a switch circuit, an unidirectional device, and a control circuit. The switching device changes a conduction state between a first terminal and a second terminal according to a gate voltage applied between a gate terminal and the first terminal. The first terminal corresponds to a source or an emitter, the second terminal corresponds to a drain or a collector, and the switching device is a GaN-HEMT, a MOSFET, an IGBT, etc.

Each of the first and second voltage detection circuits outputs a detection voltage according to a voltage applied between the first terminal and the second terminal of the switching device. The switch circuit is provided in series with a gate drive wire connected to the gate terminal of the switching device and switches between a high impedance state and a low impedance state according to a control signal. The unidirectional device is connected between an output terminal of the second voltage detection circuit and the gate terminal of the switching device and passes an electric current in a direction from the output terminal to the gate terminal.

The control circuit has a threshold voltage. The threshold voltage is set less than the first detection voltage which the first voltage detection circuit outputs when a voltage within a range where a voltage protection operation for the switching device is necessary is applied between the first terminal and the second terminal of the switching device. The voltage within the range where the voltage protection operation is necessary includes at least a voltage greater than a breakdown voltage of the switching device. Further, the threshold voltage is set greater than the first detection voltage which the first voltage detection circuit outputs when a voltage within a range where the voltage protection operation for the switching device is unnecessary is applied between the first terminal and the second terminal of the switching device. The voltage within the range where the voltage protection operation is unnecessary is a voltage which is less than the breakdown voltage of the switching device and from which it is not necessary to protect the switching device.

When the first detection voltage is not greater than the threshold voltage, the control circuit outputs the control signal to put the switch circuit into the low impedance state. Thus, a drive signal is supplied to the gate terminal through the switch circuit, so that the switching device is turned ON and OFF in accordance with the drive signal. In contrast, when the detection voltage exceeds the threshold voltage due to occurrence of a surge voltage, the control circuit outputs the control signal to put the switch circuit into the high impedance state. Thus, the gate terminal of the switching terminal is disconnected and put into a high impedance state.

After that, the gate voltage starts to increase toward a potential depending on a voltage applied between the first terminal and the second terminal and a gate capacitance (for example, a gate-to-drain capacitance and a gate-to-source capacitance). The second detection voltage the second voltage detection circuit outputs leads the switching device to be surely self-turned ON while the gate voltage increases.

A voltage division ratio of the second voltage detection circuit is set so that when the voltage within the range where the voltage protection operation is necessary is applied between the first terminal and the second terminal of the switching device, the second detection voltage is greater than a sum of a gate threshold voltage of the switching device and a conduction voltage of the unidirectional device. Further, a voltage division ratio of the second voltage detection circuit is set so that when the first detection voltage is not greater than the threshold voltage of the control circuit, the second detection voltage is less than the sum of the gate threshold voltage of the switching device and the conduction voltage of the unidirectional device.

According to this setting, when the voltage between the first terminal and the second terminal increases sharply, the first detection voltage exceeds the threshold voltage firstly, so that the switch circuit is put into the high impedance state. Then, the second detection voltage increases the gate voltage of the switching device to or above the gate threshold voltage, so that the switching device is self-turned ON. According to this sequence, it is ensured that the second detection voltage does not turn ON the switching device when the switch circuit is in the low impedance state.

When the switching device is self-turned ON, energy of a surge voltage is released through the switching device, so that the voltage between the first terminal and the second terminal of the switching device is limited to a voltage which depends on the second detection voltage and equal to or less than a device breakdown voltage. The voltage between the first terminal and the second terminal remains balanced without increasing during a period of time where the surge voltage is being released.

When the energy is fully released, the voltage between the first terminal and the second terminal starts to decrease, and both the first detection voltage and the second detection voltage start to decrease accordingly. At this time, the second detection voltage decreases below the sum of the gate threshold voltage of the switching device and the conduction voltage of the unidirectional device, and the second detection voltage becomes incapable of turning ON the gate. However, as long as the switch circuit remains in the high impedance state, the switching device remains ON. After that, when the first detection voltage decreases to or below the threshold voltage, the switch circuit is put into the low impedance state, and the switching device performs a switching action in accordance with the drive signal again.

According to the second aspect, since a parasitic capacitance added to the gate of the switching device is zero (or small), a resistance to a surge voltage applied between the first terminal and the second terminal is increased while a fast switching performance is kept. Further, when the voltage within the range where the voltage protection operation is necessary is applied to the switching device, the switching device is surely self-turned ON.

A semiconductor device according to a third aspect of the present disclosure is similar in structure to the semiconductor device according to the second aspect, but differs in that it has only one detection circuit and its output voltage contributes to not only an impedance state switching of the switch circuit but also a self-turn-on of the switching device. The unidirectional device is connected between an output terminal of a voltage detection circuit which outputs a first detection voltage and the gate terminal of the switching device and passes an electric current in a direction from the output terminal to the gate terminal. The threshold voltage of the control circuit is set to satisfy the same conditions as the semiconductor device according to the second aspect. In addition, the threshold voltage is set less than the sum of the gate threshold voltage of the switching device and the conduction voltage of the unidirectional device.

According to this structure, when the first detection voltage exceeds the threshold voltage due to occurrence of a surge voltage or the like, the control circuit puts the switch circuit into the high impedance state. Thus, the gate terminal of the switching terminal is disconnected and put into a high impedance state. After that, the gate voltage starts to increase toward a potential depending on a voltage applied between the first terminal and the second terminal and a gate capacitance (for example, a gate-to-drain capacitance and a gate-to-source capacitance). The first detection voltage the voltage detection circuit outputs leads the switching device to be surely self-turned ON while the gate voltage increases.

When the voltage between the first terminal and the second terminal increases sharply, the switch circuit is put into the high impedance state firstly. Then, the first detection voltage causes the unidirectional device to conduct, the gate voltage is increased to or above the gate threshold voltage, and the switching device is surely self-turned ON. According to this sequence, it is ensured that the first detection voltage does not turn ON the switching device when the switch circuit is in the low impedance state. The same effect as the semiconductor apparatus according to the second aspect is obtained after it is self-turned ON. The same advantage as the second aspect can be obtained in the third aspect. Further, since the number of voltage detection circuits is one, a structure can be further simplified.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

First Embodiment

Figure 1:
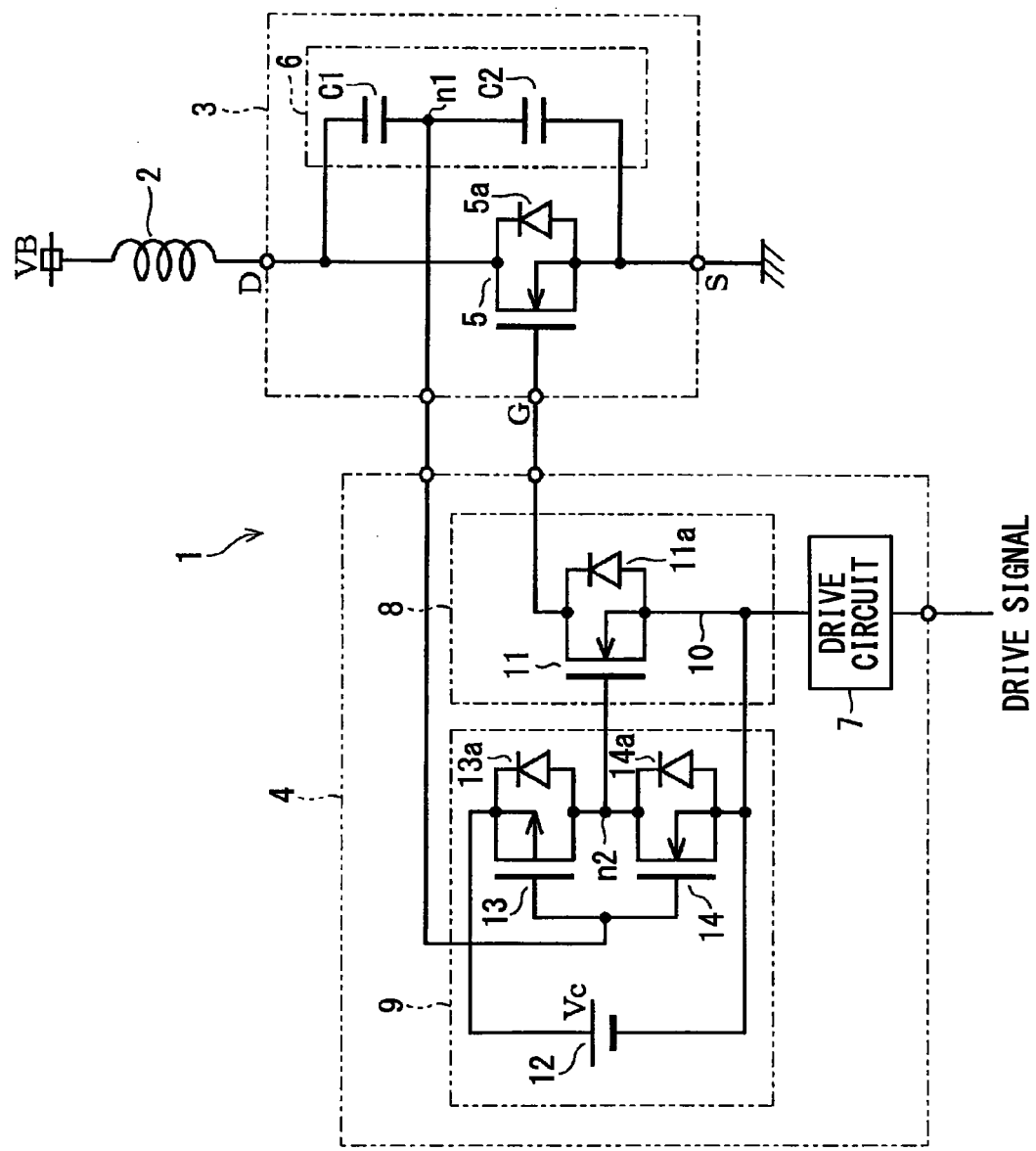
FIG. 1 is a schematic diagram of a load drive apparatus according to a first embodiment.

A first embodiment is described below with reference to FIG. 1 and FIG. 2. A load drive apparatus 1 (corresponding to a semiconductor apparatus) is used for, for example, an electronic control unit mounted on a vehicle and performs an ON/OFF action in accordance with a drive signal inputted from an external circuit (not shown), thereby passing an electric current through a coil 2, which is an inductive load, supplied with a battery voltage VB. The load drive apparatus 1 includes a device module 3 and a drive IC 4.

The device module 3 includes an N-channel FET 5 and a voltage detection circuit 6 which are integrated in a single package. The FET 5 is a switching device such as a MOSFET or a GaN-HEMT and changes a conduction state between a source terminal S (corresponding to a first terminal) and a drain terminal D (corresponding to a second terminal) in accordance with a gate voltage VGS applied between the gate terminal G and the source terminal S. Alternatively, an IGBT can be used instead of a FET. A diode 5*a* is parasitic to or connected in parallel with the FET 5.

The voltage detection circuit 6 includes capacitors C1 and C2 (corresponding to first and second circuits) which are connected in series between the drain and source of the FET 5 across an output terminal n1. These capacitors C1 and C2 output a detection voltage by dividing a voltage applied between the drain and source of the FET 5 and also serve as a capacitor snubber. A capacitance of the capacitor C1 is smaller than a capacitance of the capacitor C2. For example, a capacitance ratio of the capacitor C1 to the capacitance C2 is set to about 1:5 to 500.

The drive IC 4 includes a drive circuit 7, a switch circuit 8, and a control circuit 9. The drive circuit 7 outputs a gate drive signal (hereinafter simply referred to as the drive signal) for the FET 5 in accordance with a drive signal inputted from an external circuit such as a microcomputer. The switch circuit 8 includes an N-channel MOSFET 11 connected in series to a gate drive wire 10 connected to the gate of the FET 5. The MOSFET 11 includes a parasitic diode 11a having a forward direction toward the gate of the FET 5 through the gate drive wire 10.

The control circuit 9 includes a P-channel MOSFET 13 and an N-channel MOSFET 14 which are connected to form an inverter between terminals of a power supply 12 across an output terminal n2. The MOSFETs 13 and 14 have parasitic diodes 13a and 14a, respectively. Device sizes of the MOSFETs 13 and 14 can be small, as long as the device sizes are enough to drive the MOSFET 11.

The gates of the MOSFETs 13 and 14 are connected to the output terminal n1 of the voltage detection circuit 6. The output terminal n2 is connected to the gate of the MOSFET 11 to apply a control signal. A DC voltage Vc supplied from the power source 12 only needs to have a value necessary to output the control signal capable of turning ON and OFF the MOSFET 11.

Figure 2:
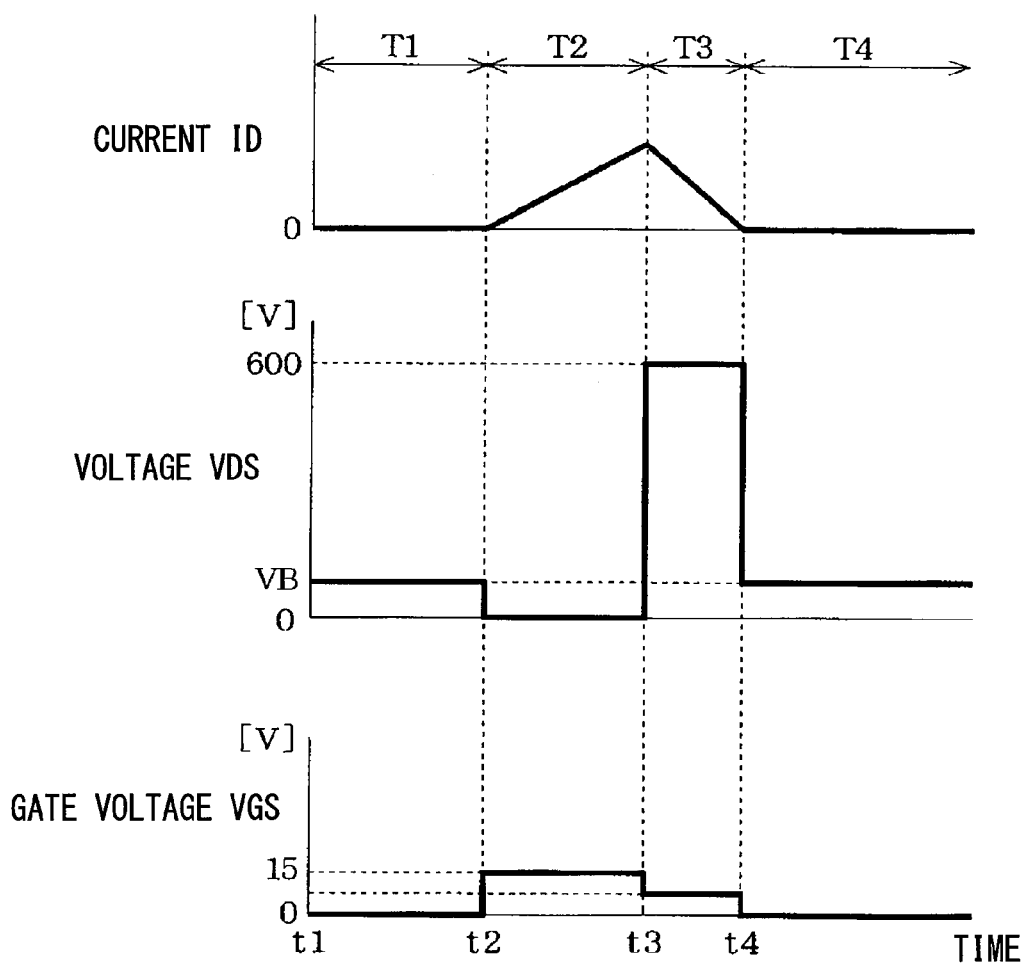
FIG. 2 is a waveform diagram according to the first embodiment.

Next, an effect of the present embodiment is described with further reference to FIG. 2. The voltage detection circuit 6 outputs a detection voltage given by a formula (1), where VDS is a drain-to-source voltage of the FET 5.

$$\text{Detection voltage}=(C1/(C1+C2))\cdot VDS \quad (1)$$

The control circuit 9 has a threshold voltage Vth used for a voltage protection operation for the FET 5. To surely protect the FET 5 from a voltage above a breakdown voltage VDSS, a range not less than a voltage Vm1 which is less than the breakdown voltage VDSS of the FET 5 by a predetermined margin is set as a voltage range where the voltage protection operation for the FET 5 is necessary. The threshold voltage Vth is set less than a detection voltage which the voltage detection circuit 6 outputs when a voltage within the range where the voltage protection operation is necessary is applied between the drain and source of the FET 5. This can be given by a formula (2).

$$Vth<(C1/(C1+C2))\cdot Vm1<(C1/(C1+C2))\cdot VDSS \quad (2)$$

In contrast, a range not larger than a voltage Vm2 which is greater than the battery voltage VB, which is supplied to the load drive apparatus 1, by a predetermined margin (a range less than the voltage range where the voltage protection operation is necessary) is set as a range where the voltage protection operation for the FET 5 is unnecessary.

The threshold voltage Vth is set greater than a detection voltage which the voltage detection circuit 6 outputs when a voltage within the range where the voltage protection operation is unnecessary is applied between the drain and source of the FET 5. This can be given by a formula (3).

$$Vth>(C1/(C1+C2)\cdot Vm2>(C1/(C1+C2))\cdot VB \quad (3)$$

A threshold voltage of each of the MOSFETs 13 and 14 of the control circuit 9 is set equal to the threshold voltage Vth, and accordingly the DC voltage Vc is set to a suitable value.

FIG. 2 is a waveform diagram showing a drain current ID, the drain-to-source voltage VDS, and the gate voltage VGS of the FET 5. During a period T1 from a time t1 to a time t2, an OFF drive signal remains inputted so that the FET 5 can remain OFF. During a period T2 from the time t2 to a time t3, an ON drive signal remains inputted so that the FET 5 can remain ON. The drain-to-source voltage VDS of the FET 5 is the battery voltage VB during the period T1 and almost 0V (technically, a voltage depending on a relationship between an ON resistance and the drain current ID of the FET 5).

During the periods T1 and T2, the detection voltages the voltage detection circuit 6 outputs are less than the threshold voltage Vth described above. Accordingly, the MOSFET 13 is ON, and the MOSFET 14 is OFF, so that the voltage Vc is applied to the gate of the MOSFET 11 through the MOSFET 13. As a result, the MOSFET 11 is turned ON, so that the switch circuit 8 connects the drive circuit 7 to the gate of the FET 5 by a low impedance. Thus, the FET 5 performs a switching action in accordance with a drive signal.

When the FET 5 is turned OFF at the time t3 in response to an inputted OFF drive signal, a surge voltage (including back electromotive force itself) occurs due to back electromotive force, so that the drain-to-source voltage VDS of the FET 5 becomes equal to or greater than the voltage Vm1. The detection voltage the voltage detection circuit 6 outputs at this time is greater than the threshold voltage Vth and equal to or less than the gate breakdown voltage of the MOSFETs 13 and 14. Therefore, the MOSFET 13 is turned OFF, and the MOSFET 14 is turned ON, so that the gate voltage VGS of the MOSFET 11 becomes 0V. As a result, the MOSFET 11 is turned OFF, so that the switch circuit 8 disconnects the drive circuit 7 from the gate of the FET 5 by a high impedance. Accordingly, the gate of the FET 5 becomes open-circuited.

The gate voltage VGS of the FET 5 after that is finally determined based on the drain-to-source voltage VDS, a gate-to-drain capacitance CGD, and a gate-to-source capacitance CGS as represented by a formula (4).

$$VGS=(CGD/(CGD+CGS))\cdot VDS \quad (4)$$

The FET 5 is self-turned ON when this gate voltage VGS exceeds its threshold voltage. When the FET 5 is turned ON, energy of a surge voltage applied between the drain and source escapes to the source side through the FET 5, so that the drain-to-source voltage VDS is balanced at a voltage (e.g., 600V) equal to or less than a device breakdown voltage (during a period T3). Then, when the energy is fully released under this balanced state (at a time 4), the drain-to-source voltage VDS decreases, so that the detection voltage the voltage detection circuit 6 outputs becomes equal to or less than the threshold voltage Vth. Accordingly, the switch circuit 8 connects the drive circuit 7 to the gate of the FET 5 by a low impedance, and the FET 5 performs a switching action in accordance with a drive signal again.

In the above actions, a maximum value of a gate current of the FET 5 reaches about a few amperes. However, since a turn-on/turn-off time during which the gate current flows is very small, a rated current of the MOSFET 11 can be small Further, since the MOSFETs 13 and 14 are used to drive the MOSFET 11, the device sizes of the MOSFETs 13 and 14 can be small. Therefore, the switch circuit 8 and the control circuit 9 can be sufficiently smaller in device size than the FET 5.

The capacitors C1 and C2 have a function to charge/discharge the gate capacitances of the MOSFETs 13 and 14 according to the detection voltage. Therefore, the capacitors C1 and C2 need to have capacitances to sufficiently drive the gate capacitances of the MOSFETs 13 and 14. For example, it is preferable that the capacitances of the capacitors C1 and C2 should be one to one hundred times greater than the gate capacitances of the MOSFETs 13 and 14.

The MOSFET 11 of the switch circuit 8 includes the parasitic diode 11a having an anode on the drive circuit 7 side and a cathode on the gate side of the FET 5. Therefore, even when the switch circuit 8 is in a disconnecting state, an ON drive signal having a positive voltage the drive circuit 7 outputs can be applied to the gate of the FET 5 through the parasitic diode 11a. Thus, the FET 5 can be turned ON by the ON drive signal outputted by the drive circuit 7 regardless of the state of the switch circuit 8. When an IGBT or a bipolar transistor is used instead of the MOSFET 11, the same effect can be obtained by adding a parallel diode.

According to the present embodiment, when the drain-to-source voltage VDS of the FET 5 becomes equal to or greater than the voltage Vm1 which is less than its device breakdown voltage VDSS, the switch circuit 8 provided in the gate drive wire 10 goes into the disconnecting state, the gate of the FET 5 becomes open-circuited, and an aggressive self-turn-on is induced in the FET 5. Since a diode to allow a surge to escape is not connected to the gate of the FET 5, a parasitic capacitance added to the gate is small compared to a conventional structure. Accordingly, a breakdown voltage can be ensured while a fast switching performance (in particular, turn-on characteristic) of the FET 5 is ensured.

The load drive apparatus 1 is suitable for, in particular, a GaN device, for example, the FET 5 such as a GaN-HEMT. A GaN-HEMT has no avalanche resistance (L load resistance), a low gate breakdown voltage, and a small gate capacitance. According to the present embodiment, a resistance to a surge voltage can be increased with little decrease in a switching speed. Obviously, the present disclosure can be applied to a MOSFET and IGBT.

The voltage detection circuit 6 is configured as a capacitor snubber. Therefore, dV/dt and ringing at the time of turn-off is reduced while the number of parts and a mounting space are reduced. Further, conditions for the voltage protection operation can be set easily based on a relationship between the capacitance ratio of the capacitors C1 and C2 and the device breakdown voltage of the FET 5.

The device module 3 may be provided by forming the capacitors C1 and C2 on the same semiconductor substrate as the FET 5. Alternatively, the FET 5 and the capacitors C1 and C2 as discrete devices may be molded after being mounted on a substrate. Alternatively, the FET 5, the capacitors C1 and C2, the switch circuit 8, and the control circuit 9 may be formed on the same semiconductor substrate. In this case, the drive circuit 7 may be formed together. Only the capacitors C1 and C2 may be external devices. In this way, since the flexibility in circuit structure is high, miniaturization can be achieved.

Second Embodiment

Figure 3:
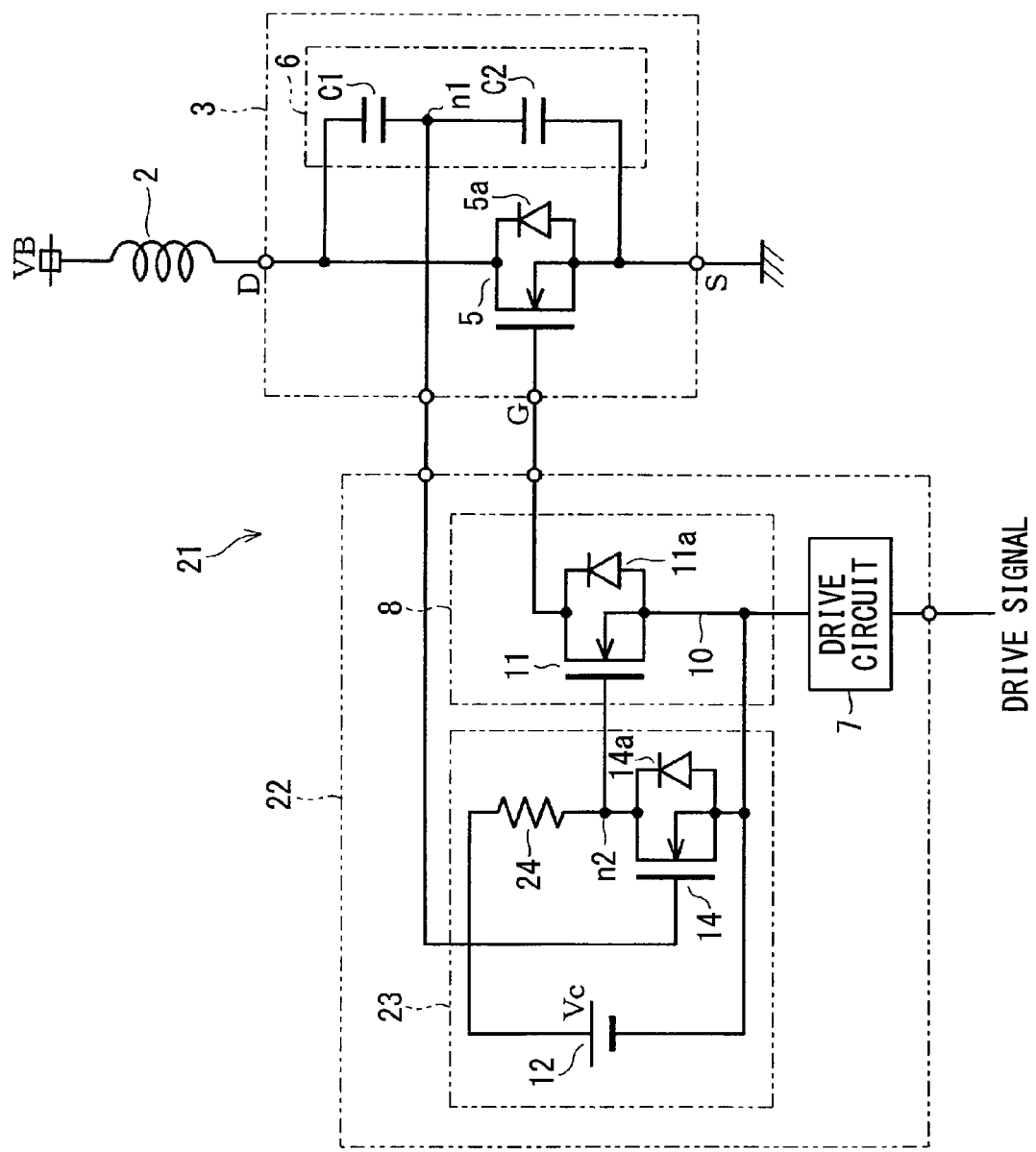
FIG. 3 is a schematic diagram of a load drive apparatus according to a second embodiment.

A second embodiment is described below with reference to FIG. 3. A drive IC 22 of a load drive apparatus 21 includes a control circuit 23. The control circuit 23 includes a resistor 24 and the MOSFET 14 which are connected in series across the output terminal n2 between the terminals of the power supply 12. A threshold voltage of the MOSFET 14 is equal to the threshold voltage Vth described above.

When no surge voltage is applied, the detection voltage is less than the threshold voltage Vth. Accordingly, the MOSFET 14 is OFF, and the voltage Vc is applied to the gate of the MOSFET 11 through the resistor 24. In contrast, when a surge voltage occurs, and the drain-to-source voltage VDS of the FET 5 becomes equal to or greater than the voltage Vm1, the detection voltage becomes greater than the threshold voltage Vth and equal to or less than the gate breakdown voltage of the MOSFET 14. Accordingly, the MOSFET 14 is turned ON, the switch circuit 8 goes into the disconnecting state, and the FET 5 is self-turned ON.

According to the present embodiment, since the control circuit 23 includes one MOSFET 14, a circuit area can be further reduced. It is noted that when the MOSFET 14 is turned ON, an electric current from the power supply 12 passes through the resistor 24 and the MOSFET 14. However, since the MOSFET 14 is rarely turned ON, and its ON duration is short, an increase in consumption power is almost zero.

Third Embodiment

Figure 4:
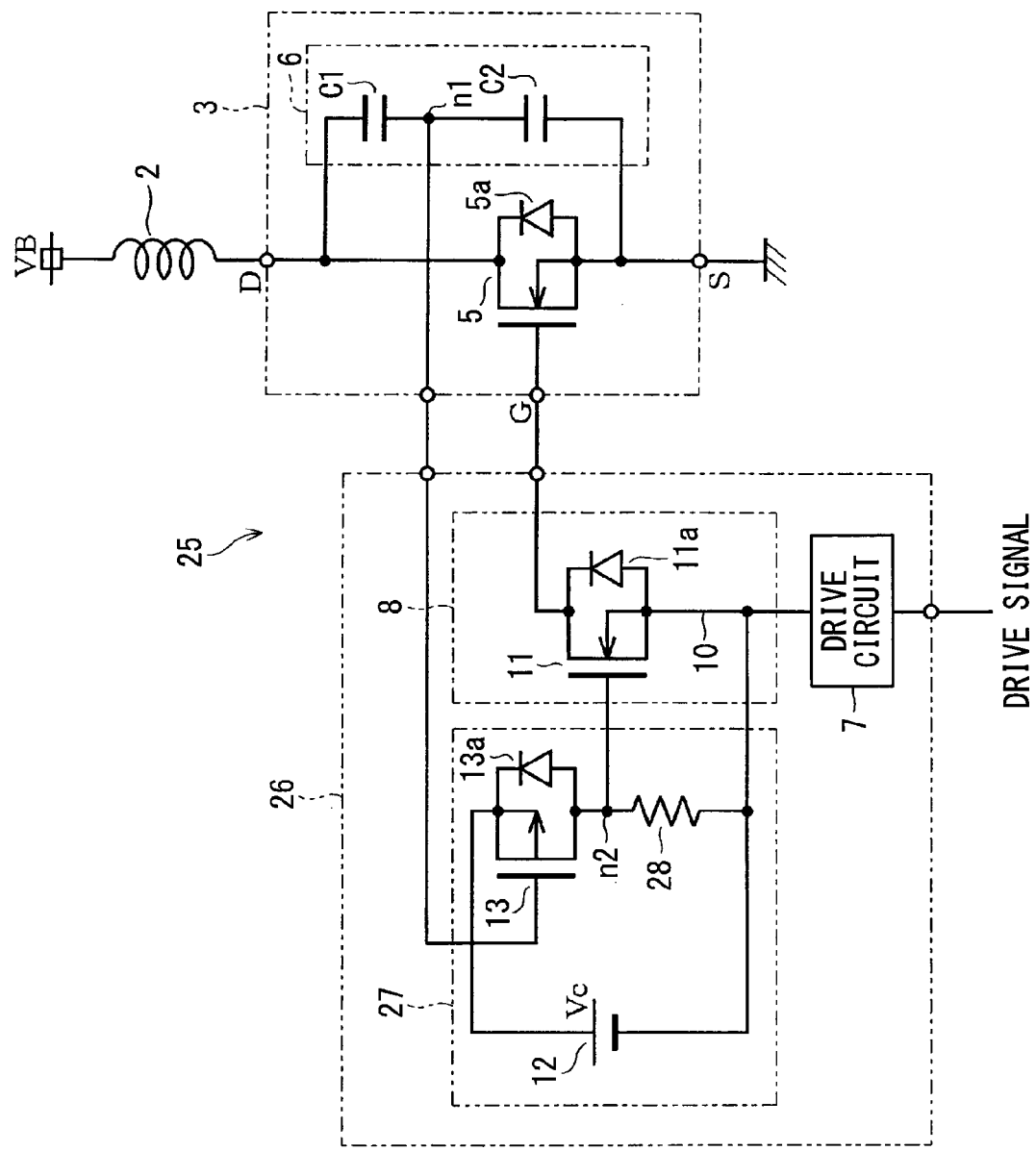
FIG. 4 is a schematic diagram of a load drive apparatus according to a third embodiment.

A third embodiment is described below with reference to FIG. 4. A drive IC 26 of a load drive apparatus 25 includes a control circuit 27. The control circuit 27 includes the MOSFET 13 and a resistor 28 which are connected in series across the output terminal n2 between the terminals of the power supply 12. It is configured in such a manner that when the detection voltage exceeds the threshold voltage Vth, the MOSFET 13 is turned OFF.

When no surge voltage is applied, the detection voltage is less than the threshold voltage Vth. Accordingly, the MOSFET 13 is ON, and the voltage Vc is applied to the gate of the MOSFET 11 through the MOSFET 13. In contrast, when a surge voltage occurs, and the drain-to-source voltage VDS of the FET 5 becomes equal to or greater than the voltage Vm1, the detection voltage becomes greater than the threshold voltage Vth and equal to or less than the gate breakdown voltage of the MOSFET 13. Accordingly, the MOSFET 13 is turned OFF, the switch circuit 8 goes into the disconnecting state, and the FET 5 is self-turned ON. According to the present embodiment, since the control circuit 23 includes one MOSFET 13, a circuit area can be further reduced.

Fourth Embodiment

Figure 5:
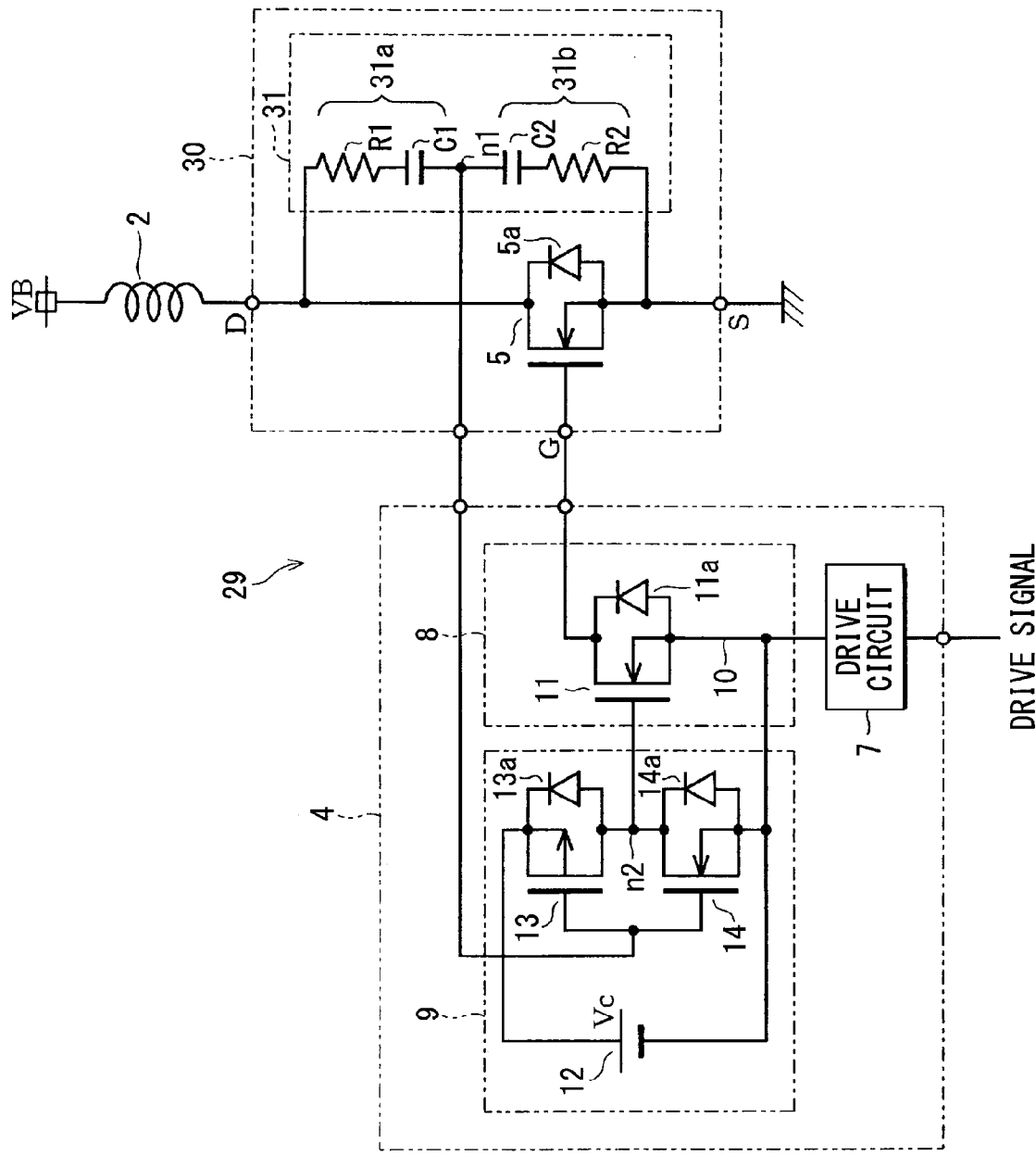
FIG. 5 is a schematic diagram of a load drive apparatus according to a fourth embodiment.

A fourth embodiment is described below with reference to FIG. 5. A load drive apparatus 29 includes a device module 30 and the drive IC 4. The device module 30 includes the FET 5 and a voltage detection circuit 31. The voltage detection circuit 31 includes a first circuit 31a and a second circuit 31b which are connected in series across the output terminal n1. The first circuit 31a is a series circuit of a resistor R1 and the capacitor C1. The second circuit 31b is a series circuit of a resistor R2 and the capacitor C2.

A capacitance of the capacitor C1 is smaller than a capacitance of the capacitor C2. For example, a capacitance ratio of the capacitor C1 to the capacitor C2 is set to about 1:5 to 500. A resistance of the resistor R1 is larger than a resistance of the resistor R2. For example, a resistance ratio of the resistor R1 to the resistor R2 is set to about 5 to 500:1.

Since the voltage detection circuit 31 according to the present embodiment is configured as a RC snubber, surge energy stored in the capacitors C1 and C2 are consumed by the resistors R1 and R2, so that a voltage surge is further reduced. Further, since the resistors R1 and R2 are connected in series, ripple current flowing through the capacitors C1 and C2 can be reduced. When a constant is set so that T=C1·R1≈C2·R2, a charging/discharging state of the first circuit 31a becomes equal to a charging/discharging state of the second circuit 31b so that a voltage division ratio of the voltage detection circuit 31 can be stabilized to a desired value.

Fifth Embodiment

Figure 6:
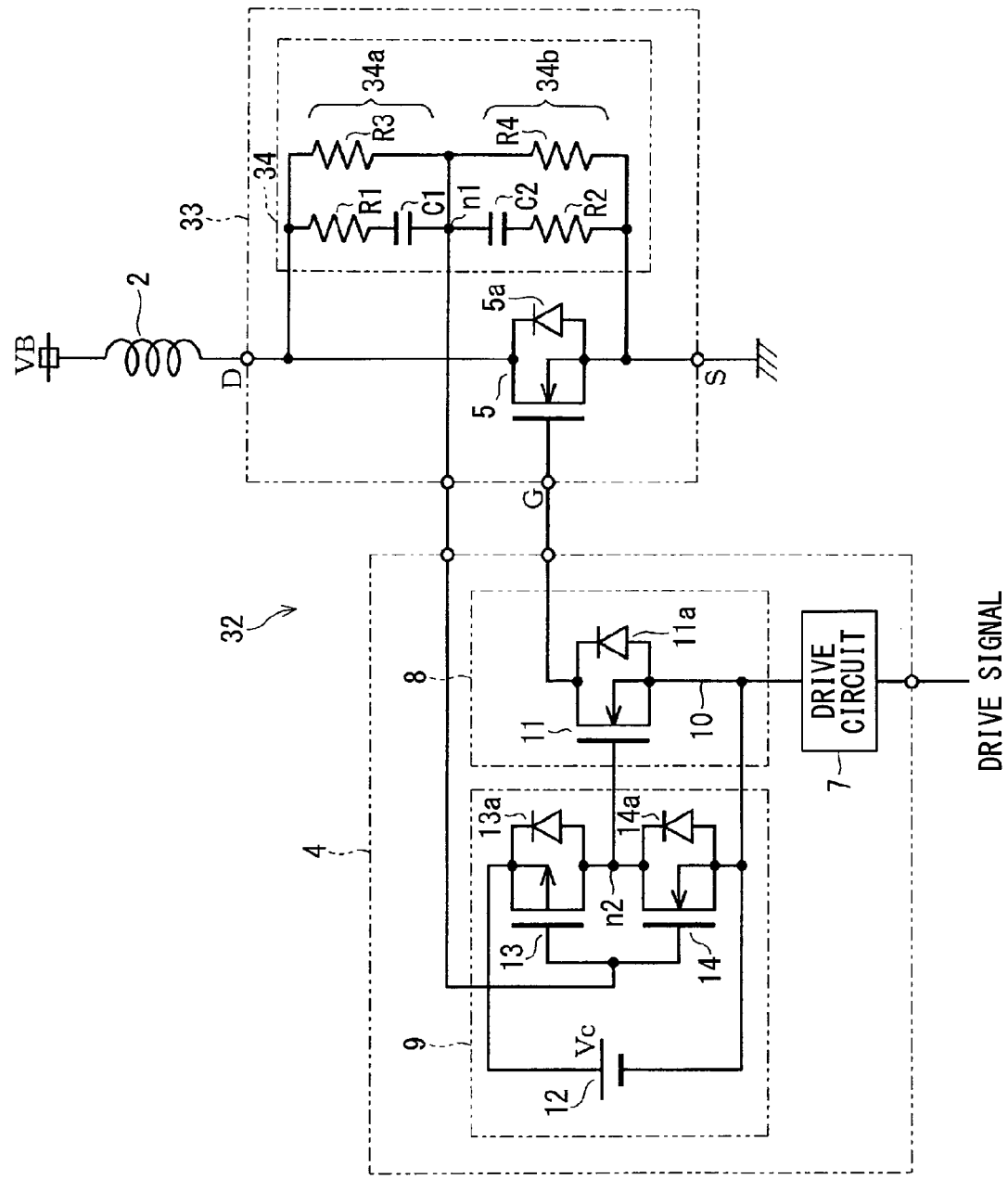
FIG. 6 is a schematic diagram of a load drive apparatus according to a fifth embodiment.

A fifth embodiment is described below with reference to FIG. 6. A load drive apparatus 32 includes a device module 33 and the drive IC 4. The device module 33 includes the FET 5 and a voltage detection circuit 34. The voltage detection circuit 34 includes a first circuit 34a and a second circuit 34b which are connected in series across the output terminal n1.

The first circuit 34a includes the first circuit 31a (refer to FIG. 5) described above and a resistor R3 connected in parallel with the first circuit 31a. The second circuit 34b includes the second circuit 31b (refer to FIG. 5) described above and a resistor R4 connected in parallel with the second circuit 31b.

The capacitance ratio of the capacitor C1 to the capacitor C2 and the resistance ratio of the resistor R1 to the resistor R2 are the same as those in the fourth embodiment. A resistance of the resistor R3 is larger than a resistance of the resistor R4. For example, a resistance ratio of the resistor R3 to the resistor R4 is set to about 5 to 500:1.

Since the voltage detection circuit 34 according to the present embodiment is configured as a RC snubber, a voltage surge is further reduced like in the fourth embodiment. Further, when a constant is set so that T=C1·R1≈C2·R2, C2:C1≈R1:R2≈R3:R4, a charging/discharging state of the first circuit 34a becomes equal to a charging/discharging state of the second circuit 34b so that a voltage division ratio of the voltage detection circuit 34 can be stabilized to a desired value. In particular, the addition of the balance resistors R3 and R4 increases responsiveness to a voltage change, so that the voltage division ratio is further stabilized during a transient. It is noted that the resistances of the resistors R3 and R4 can be determined based on a balance between voltage division ratio stabilization and resistive loss.

Sixth Embodiment

Figure 7:
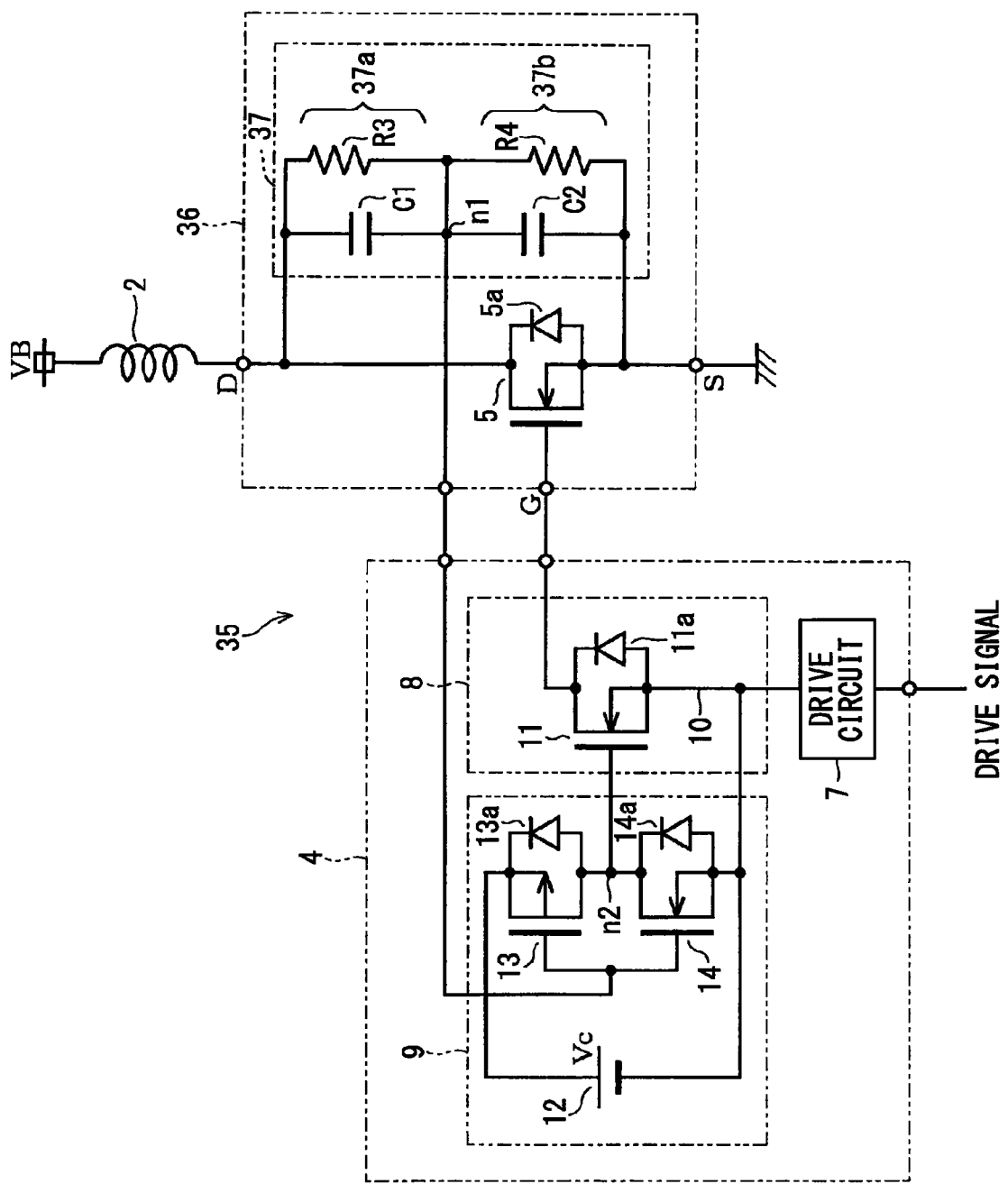
FIG. 7 is a schematic diagram of a load drive apparatus according to a sixth embodiment.

A sixth embodiment is described below with reference to FIG. 7. A load drive apparatus 35 includes a device module 36 and the drive IC 4. The device module 36 includes the FET 5 and a voltage detection circuit 37. The voltage detection circuit 37 includes a first circuit 37a and a second circuit 37b which are connected in series across the output terminal n1. The first circuit 37a is a parallel circuit of the capacitor C1 and the resistor R3. The second circuit 37b is a parallel circuit of the capacitor C2 and the resistor R4. The capacitance ratio of the capacitor C1 to the capacitor C2 and the resistance ratio of the resistor R3 to the resistor R4 are the same as those in the fifth embodiment.

When a constant is set so that C2:C1≈R3:R4, a charging/discharging state of the first circuit 37a becomes equal to a charging/discharging state of the second circuit 37b so that a voltage division ratio of the voltage detection circuit 37 can be stabilized to a desired value. In particular, the addition of the balance resistors R3 and R4 increases responsiveness to a voltage change, so that the voltage division ratio is further stabilized during a transient. It is noted that the resistances of the resistors R3 and R4 can be determined based on a balance between voltage division ratio stabilization and resistive loss.

Seventh Embodiment

Figure 8:
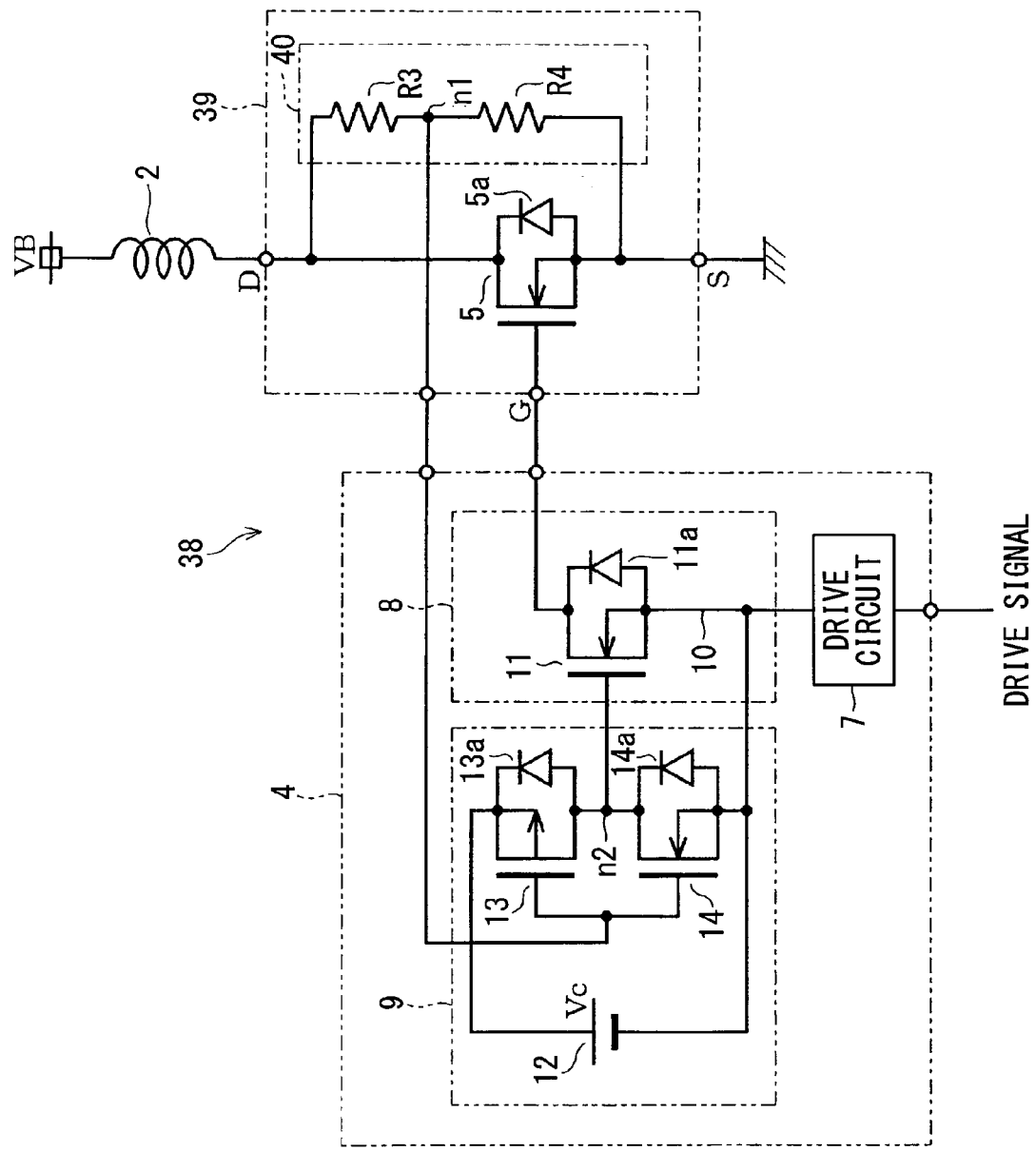
FIG. 8 is a schematic diagram of a load drive apparatus according to a seventh embodiment.

A seventh embodiment is described below with reference to FIG. 8. A load drive apparatus 38 includes a device module 39 and the drive IC 4. The device module 39 includes the FET 5 and a voltage detection circuit 40. The voltage detection circuit 40 includes the resistors R3 and R4 (corresponding to first and second circuits) which are connected in series across the output terminal n1 between the drain and source of the FET 5. A resistance ratio of the resistor R3 to the resistor R4 is set to about 5 to 500:1, and the resistors R3 and R4 have relatively high resistances so as to reduce resistive loss. Since the voltage detection circuit 40 outputs the detection voltage with resistor voltage division, responsiveness to a voltage change is good, so that the voltage division ratio can be accurate and stable.

Eighth Embodiment

Figure 9:
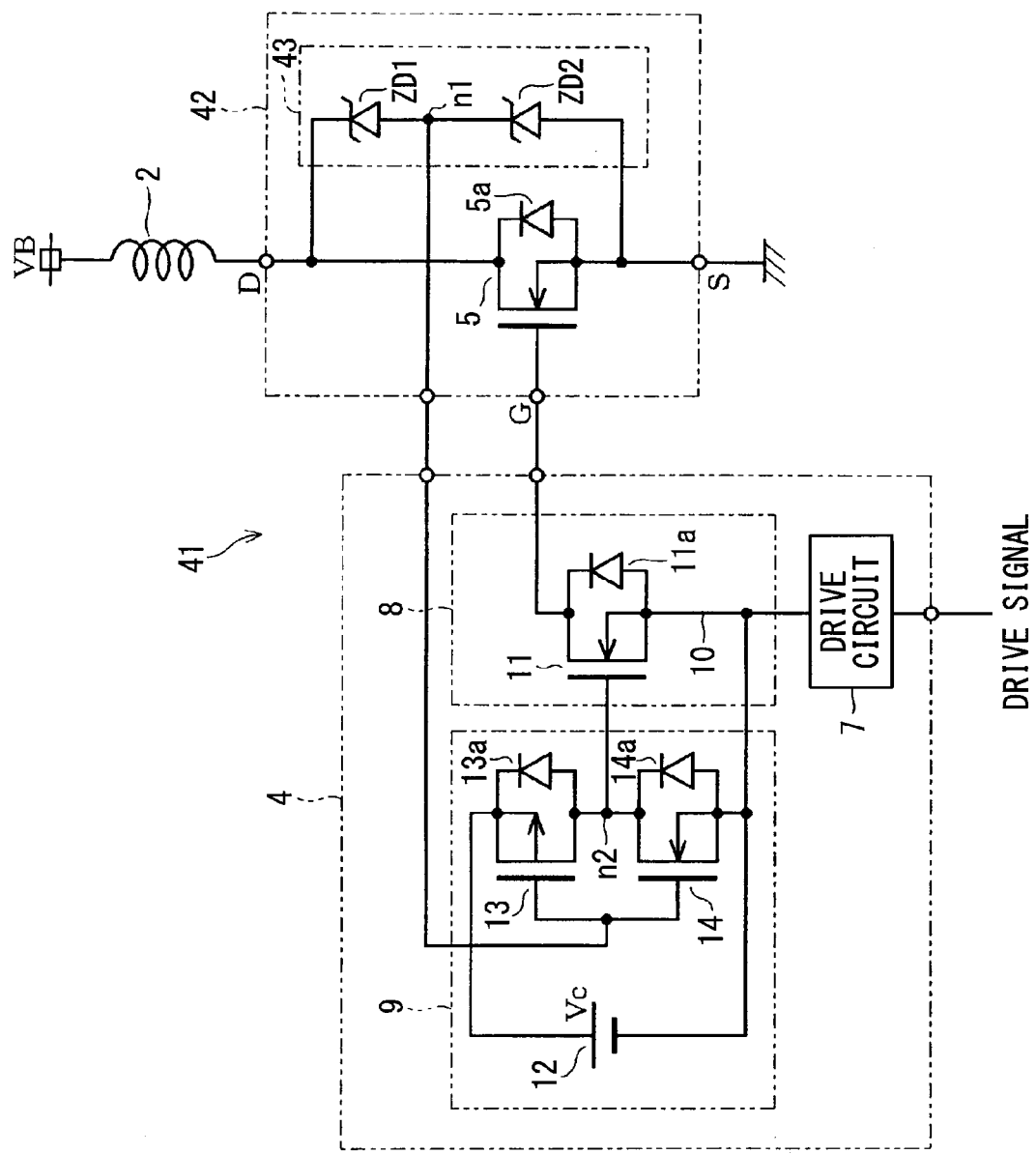
FIG. 9 is a schematic diagram of a load drive apparatus according to an eighth embodiment.

An eighth embodiment is described below with reference to FIG. 9. A load drive apparatus 41 includes a device module 42 and the drive IC 4. The device module 42 includes the FET 5 and a voltage detection circuit 43. The voltage detection circuit 43 includes Zener diodes ZD1 and ZD2 (corresponding to first and second circuits) which are connected in series with polarity shown in the drawing across the output terminal n1 between the drain and source of the FET 5. The Zener diodes ZD1 and ZD2 serve as an energization circuit which conducts when an applied voltage exceeds a Zener voltage (corresponding to a predetermined voltage).

According to the present embodiment, when the drain-to-source voltage VDS of the FET 5 becomes equal to or greater than the voltage Vm1, the Zener diodes ZD1 and ZD2 conduct so that a voltage of the output terminal n1 can be kept almost constant. Thus, the switch circuit 8 is stable in the disconnecting state so that the FET 5 can be self-turned ON. It is noted that the Zener diodes ZD1 and ZD2 are used to detect a voltage rather than serve as a bypass for energy of a surge voltage. Therefore, the Zener diodes ZD1 and ZD2 only need to have device sizes enough to drive the gate capacitances of the MOSFETs 13 and 14.

Ninth Embodiment

Figure 10:
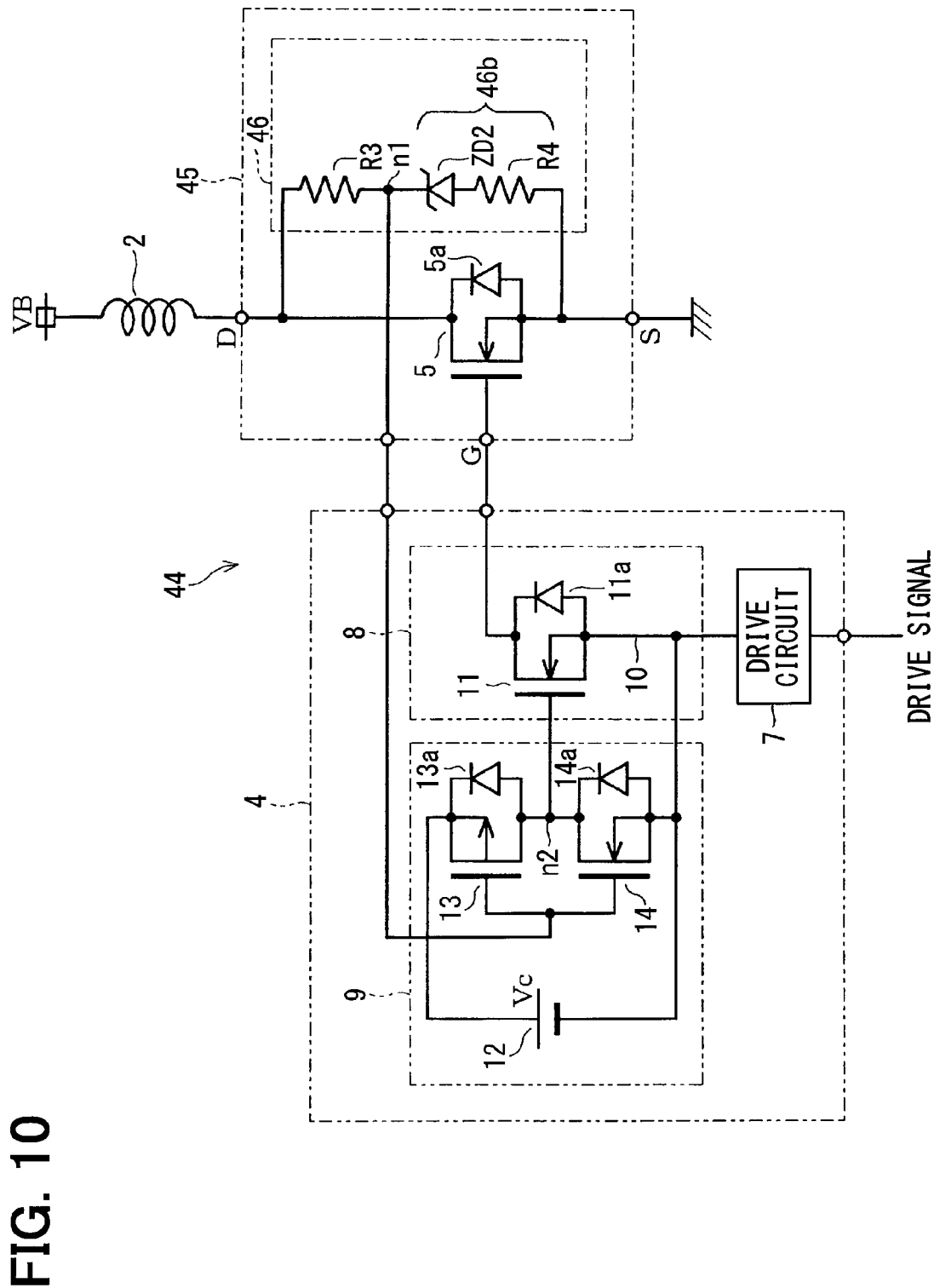
FIG. 10 is a schematic diagram of a load drive apparatus according to a ninth embodiment.

A ninth embodiment is described below with reference to FIG. 10. A load drive apparatus 44 includes a device module 45 and the drive IC 4. The device module 45 includes the FET 5 and a voltage detection circuit 46. The voltage detection circuit 46 includes the resistor R3 corresponding to a first circuit and a second circuit 46b which are connected in series across the output terminal n1. The second circuit 46b is a series circuit of the Zener diode ZD2 and the resistor R4. The resistance ratio of the resistor R3 to the resistor R4 is the same as those in the fifth embodiment.

When the drain-to-source voltage VDS of the FET 5 becomes equal to or greater than the voltage Vm1, the Zener diode ZD2 conducts so that a voltage of the output terminal n1 can be kept at a voltage which depends on a Zener voltage and a voltage drop across the resistor R4. Thus, the switch circuit 8 is stable in the disconnecting state so that the FET 5 can be self-turned ON. As described in the eighth embodiment, the device size of the Zener diode ZD2 can be small. It is noted that the resistances of the resistors R3 and R4 can be determined based on a balance between voltage division ratio stabilization and resistive loss.

Tenth Embodiment

Figure 11:
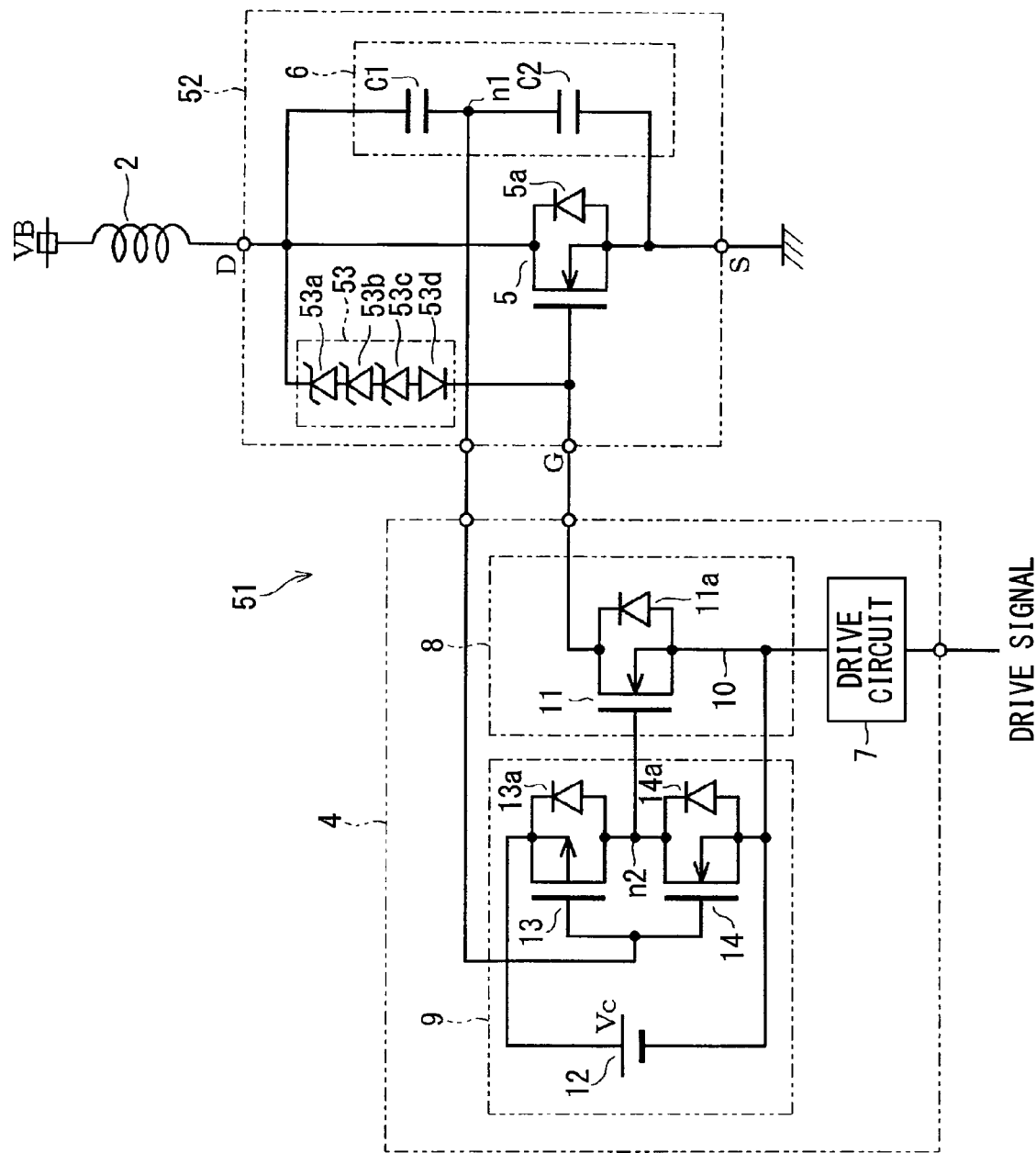
FIG. 11 is a schematic diagram of a load drive apparatus according to a tenth embodiment.
Figure 12:
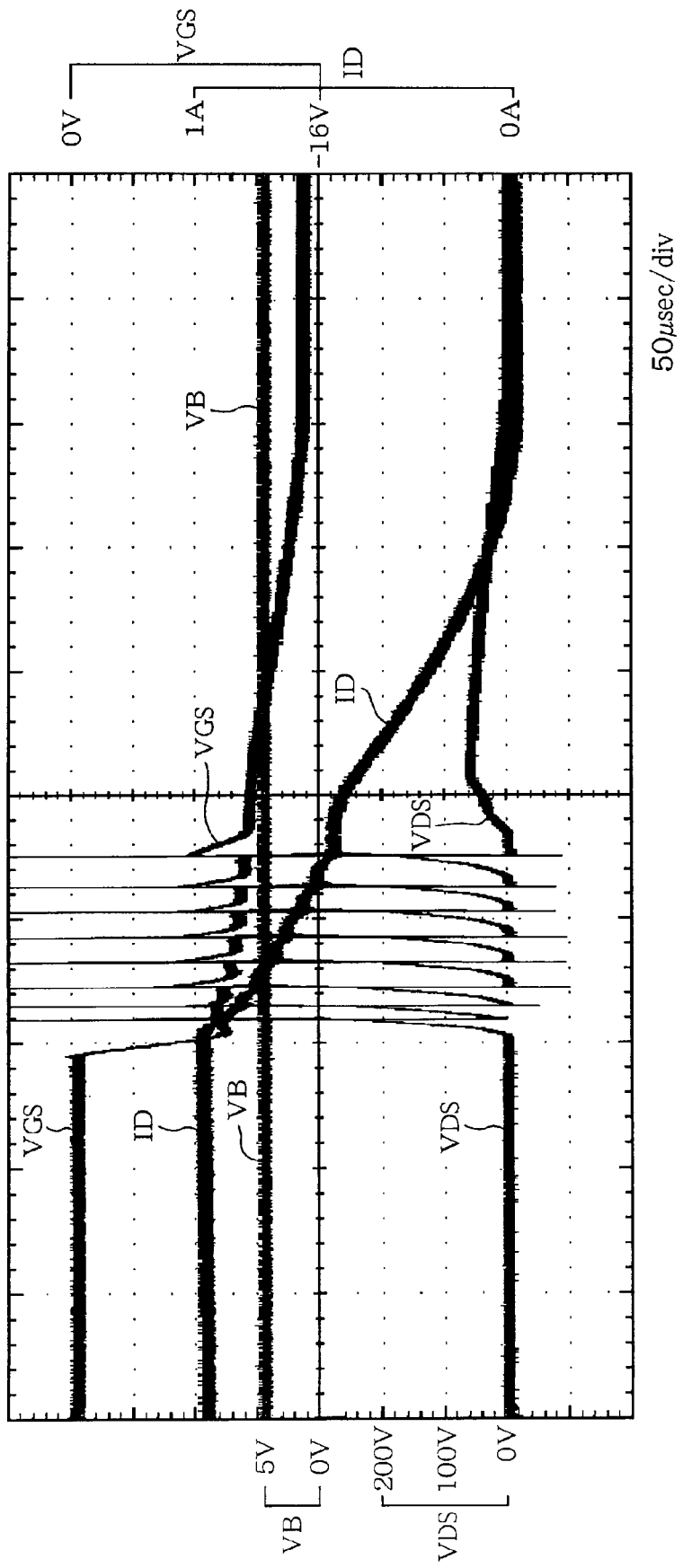
FIG. 12 is a measured waveform diagram according to the tenth embodiment.

A tenth embodiment is described below with reference to FIGS. 11 and 12. As shown in FIG. 11, the load drive apparatus 51 includes a device module 52 and the drive IC 4. The device module 52 includes the FET 5, the voltage detection circuit 6, and a first voltage control circuit 53.

The voltage control circuit 53 is connected between the drain and gate of the FET 5 and conducts when the drain-to-gate voltage exceeds a predetermined voltage which is less than the drain-to-source breakdown voltage VDSS of the FET 5. Specifically, the voltage control circuit 53 is a series circuit of three Zener diodes 53a-53c in a reverse direction and one diode 53d in a forward direction. The diode 53d prevents a gate current from being drawn to the drain side when the gate voltage VGS is greater than the drain-to-source voltage VDS.

When a surge voltage occurs, and the drain-to-source voltage VDS of the FET 5 becomes equal to or greater than the voltage Vm1, the control circuit 9 turns OFF the MOSFET 11. Accordingly, the gate of the FET 5 becomes open-circuited, the gate voltage VGS increases to a value given by the formula (4), and consequently the FET 5 is self-turned ON. However, if a gate capacitance ratio (CGS/CGD) is too large, there is a possibility that the gate voltage VGS does not exceed the threshold voltage of the FET 5 so that the self-turn on cannot occur even when the drain-to-source voltage VDS reaches the breakdown voltage VDSS.

For the above reason, according to the present embodiment, when the drain-to-source voltage VDS exceeds a predetermined voltage which is less than the breakdown voltage VDSS, the voltage control circuit 53 conducts, divides the predetermined voltage, and clamps the gate to a drain voltage. Thus, the gate voltage VGS increases with an increase in the drain-to-source voltage VDS, and the FET 5 is turned ON. As a result, energy of a surge voltage escapes to the source side through the FET 5.

Since the voltage control circuit 53 does not serve as a bypass for energy of a surge voltage, the Zener diodes 53a-53c and the diode 53d only need to have small device sizes enough to drive the gate of the FET 5. However, there is a possibility that the gate cannot remain clamped. FIG. 12 shows measured waveforms of the gate voltage VGS, the drain-to-source voltage VDS, the drain current ID, and the battery voltage VB at the time of turn-off. It can be understood that the FET 5 is repeatedly turned ON and OFF as the gate voltage VGS increase and decreases. Even in this case, a peak value of the drain-to-source voltage VDS is limited to or below the predetermined voltage so that the drain current ID decreases.

According to the present embodiment, even when the gate capacitance ratio prevents the FET 5 from being self-turned ON when the gate is open-circuited, the voltage control circuit 53 conducts so that the FET 5 can be surely turned ON. Thus, the FET 5 can be protected from overvoltage. Further, since the device size of the voltage control circuit 53, which is connected to the gate of the FET 5, is small, a resistance to a surge voltage can be increased with little decrease in a switching speed.

Eleventh Embodiment

Figure 13:
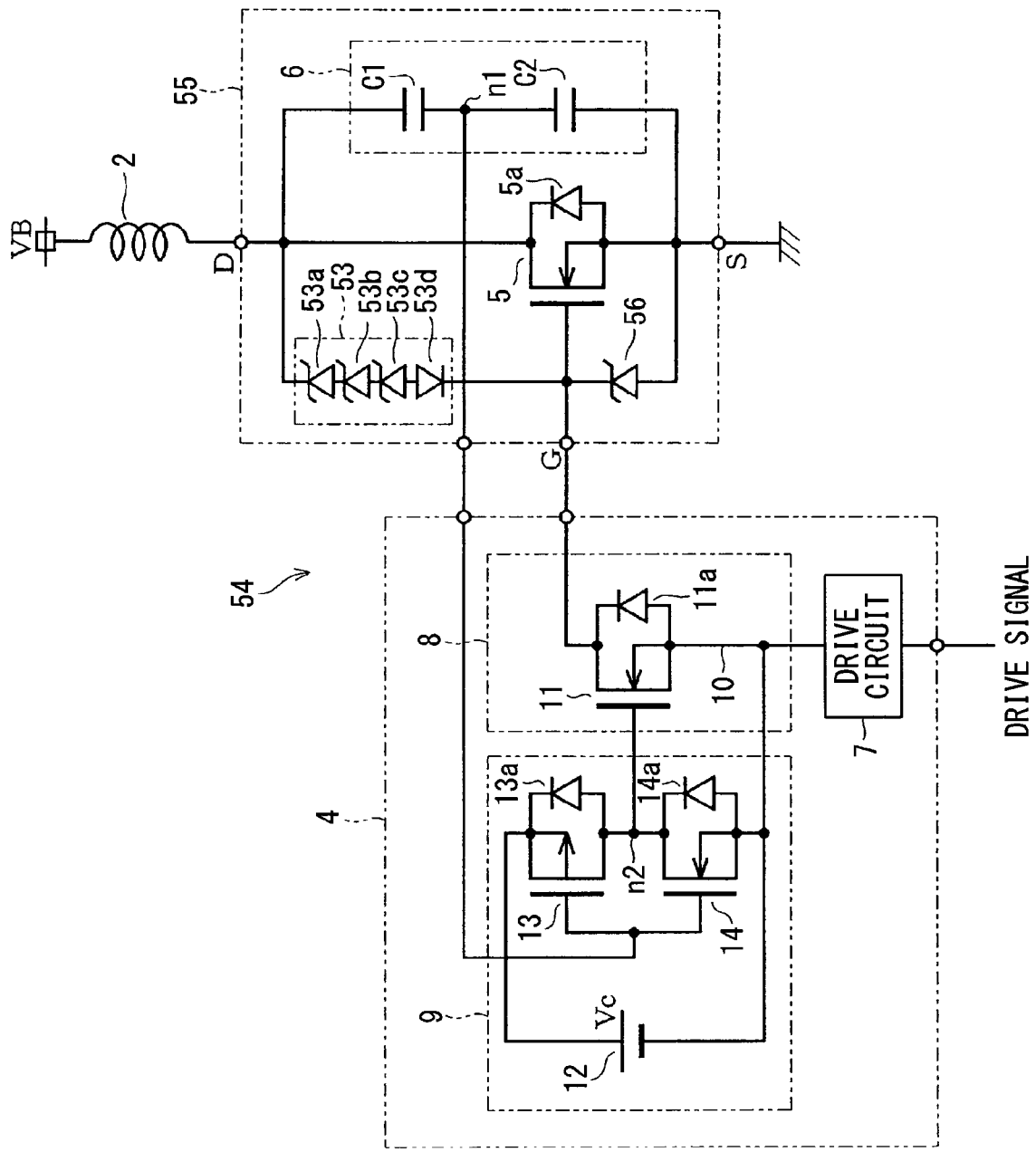
FIG. 13 is a schematic diagram of a load drive apparatus according to an eleventh embodiment.

An eleventh embodiment is described below with reference to FIG. 13. A load drive apparatus 54 includes a device module 55 and the drive IC 4. The device module 55 includes a Zener diode 56 (corresponding to a second voltage control circuit) in addition to the voltage control circuit 53. The Zener diode 56 is connected between the gate and source of the FET 5 and has a cathode on the gate side. The Zener diode 56 conducts when the gate-to-source voltage of the FET 5 exceeds a predetermined voltage which is less than a breakdown voltage VGSS in a positive direction.

If the FET 5 is a normally-off device, the gate voltage VGS is clamped to a value less than the gate breakdown voltage VGSS when the voltage control circuit 53 conducts so that the gate can be increased. Thus, the gate of the FET 5 can be protected. Further, the Zener diode 56 only needs to have a small device size enough to clamp the gate voltage VGS. Therefore, the same effect as in the tenth embodiment can be obtained in the present embodiment.

Twelfth Embodiment

Figure 14:
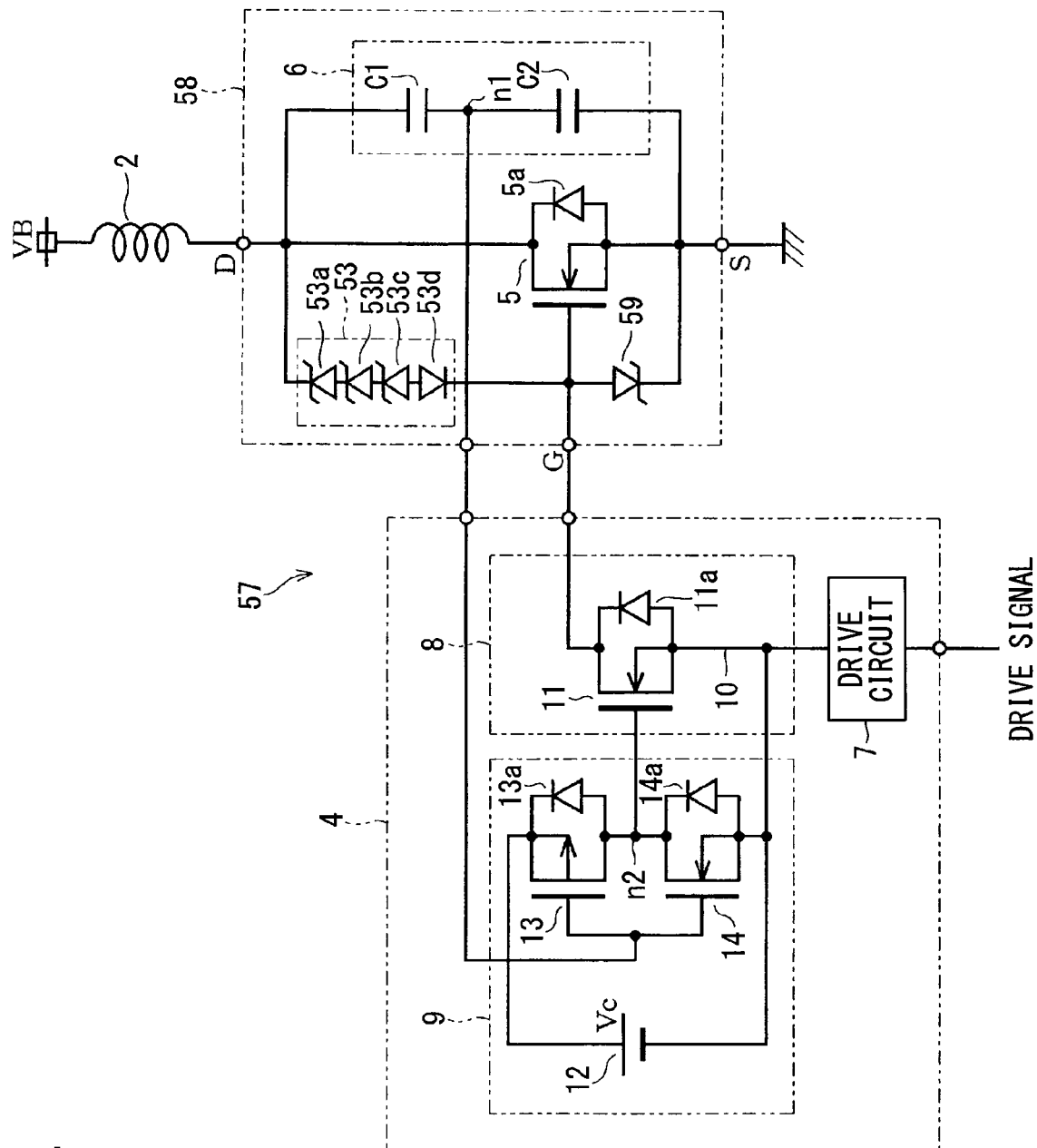
FIG. 14 is a schematic diagram of a load drive apparatus according to a twelfth embodiment.

A twelfth embodiment is described below with reference to FIG. 14. A load drive apparatus 57 includes a device module 58 and the drive IC 4. The device module 58 includes a Zener diode 59 (corresponding to a second voltage control circuit) in addition to the voltage control circuit 53. The Zener diode 59 is connected between the gate and source of the FET 5 and has an anode on the gate side. The Zener diode 59 conducts when the gate-to-source voltage of the FET 5 exceeds a predetermined voltage which is less than a breakdown voltage VGSS in a negative direction.

If the FET 5 is a normally-on device, an OFF drive signal has a negative voltage. Further, regardless of whether the FET 5 is a normally-on device or a normally-off device, in order to reduce a turn-off time, an OFF drive signal having a voltage close to a gate breakdown voltage of the FET 5 in a negative direction may be applied. In such a case, the clamping is performed when the gate voltage VGS (absolute value) is less than the gate breakdown voltage VGSS (absolute value). Thus, the gate of the FET 5 can be protected. Further, the Zener diode 59 only needs to have a small device size enough to clamp the gate voltage VGS. Therefore, the same effect as in the tenth embodiment can be obtained in the present embodiment.

Thirteenth Embodiment

Figure 15:
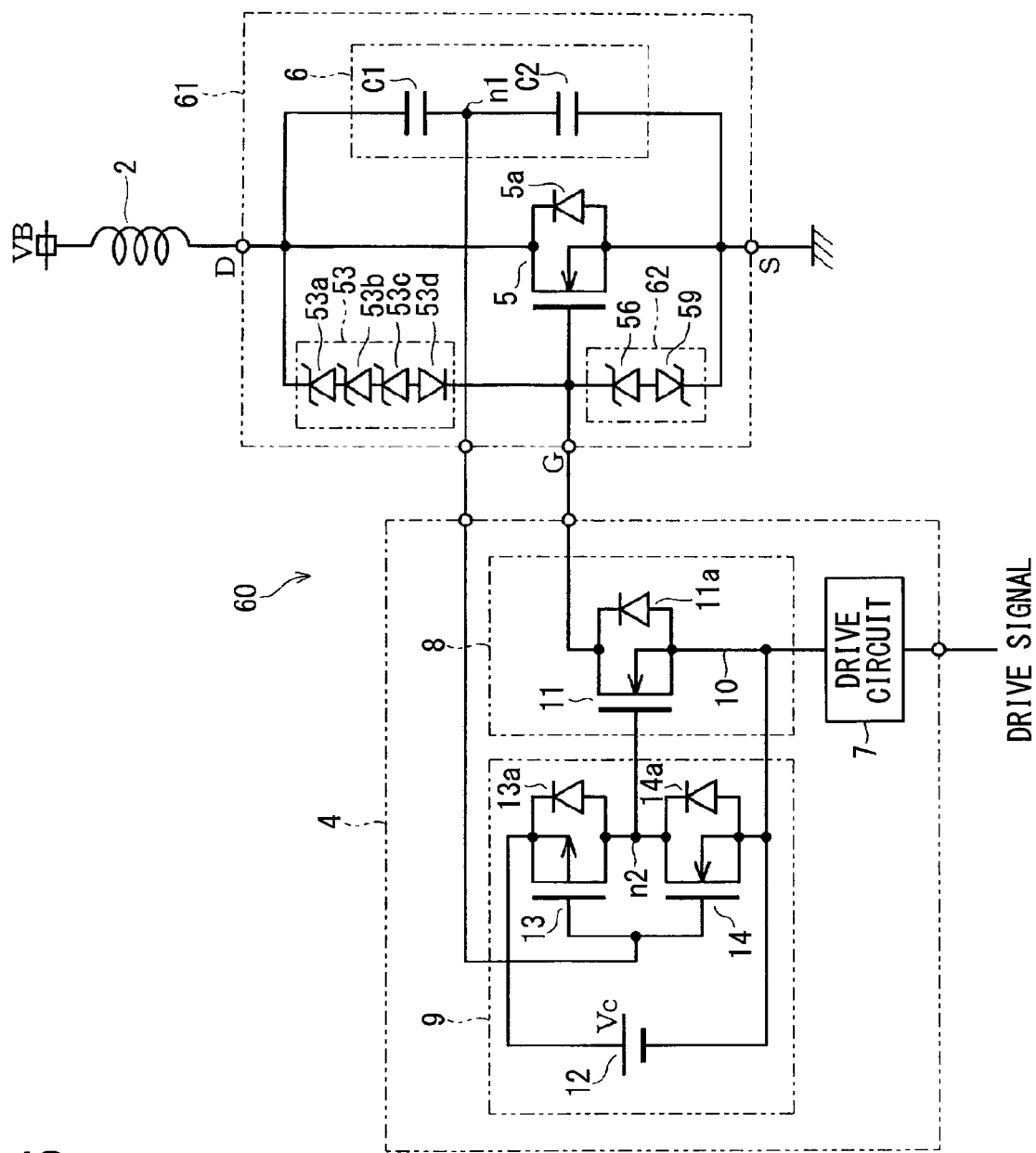
FIG. 15 is a schematic diagram of a load drive apparatus according to a thirteenth embodiment.

A thirteenth embodiment is described below with reference to FIG. 15. A load drive apparatus 60 includes a device module 61 and the drive IC 4. The device module 61 includes a second voltage control circuit 62 in addition to the voltage control circuit 53. The second voltage control circuit 62 is a series circuit of the Zener diodes 56 and 59 described in the eleventh and twelfth embodiments. The same effect as in the eleventh and twelfth embodiments can be obtained in the present embodiment.

Fourteenth Embodiment

Figure 16:
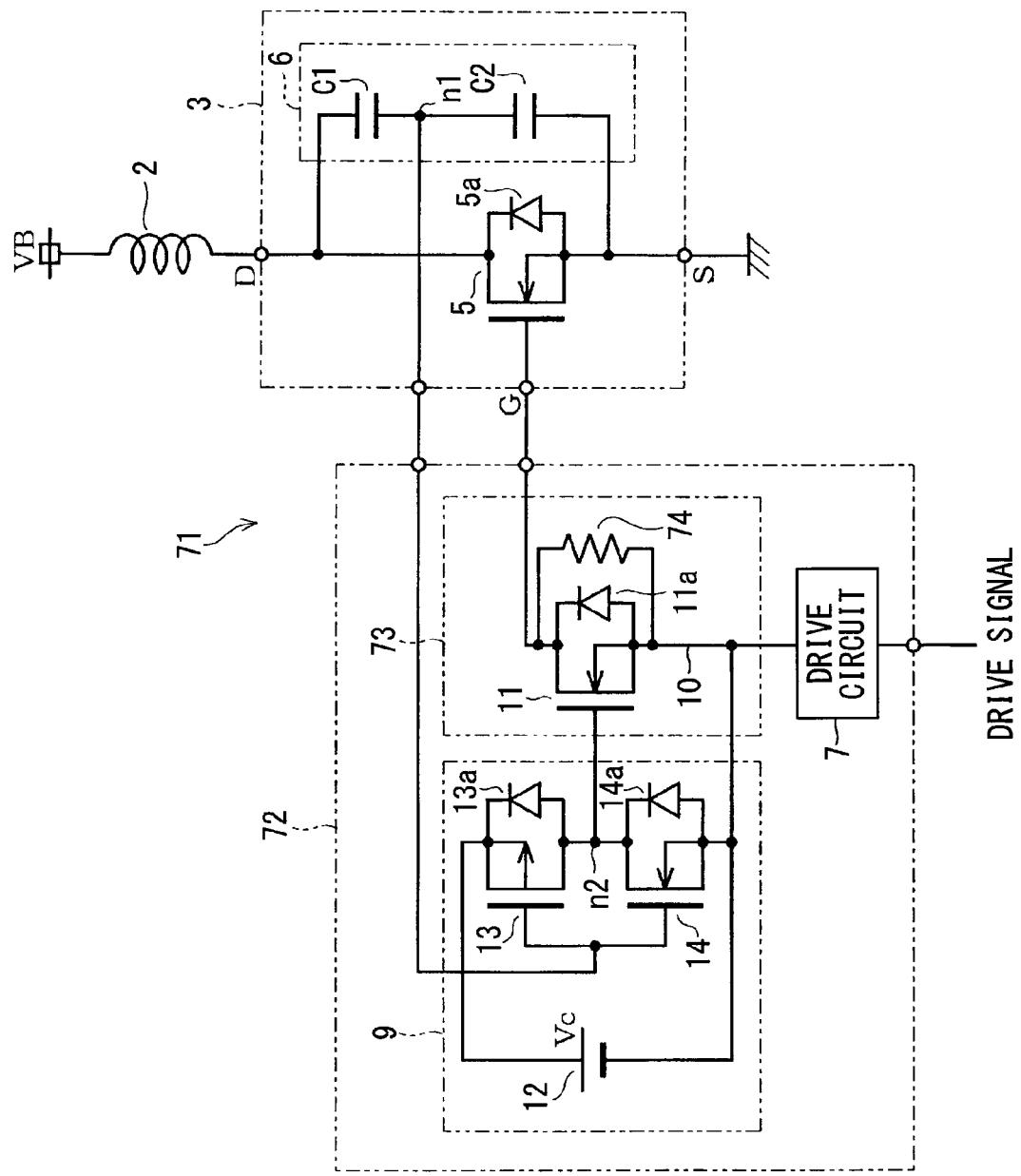
FIG. 16 is a schematic diagram of a load drive apparatus according to a fourteenth embodiment.

A fourteenth embodiment is described below with reference to FIG. 16. A load drive apparatus 71 includes the device module 3 and a drive IC 72. The drive IC 72 has a switch circuit 73 in which a resistor 74 is connected in parallel with the MOSFET 11. A resistance Rp of the resistor 74 is much greater than those of normal resistors Rgon and Rgoff.

When a surge voltage occurs, and the drain-to-source voltage VDS of the FET 5 becomes equal to or greater than the voltage Vm1, the control circuit 9 turns OFF the MOSFET 11. At this time, impedance between an output terminal of the drive circuit 7 and the gate of the FET 5 becomes Rp, and the gate of the FET 5 becomes almost open-circuited. The addition of the resistor 74 can allow adjustment of a voltage value at which the FET 5 is self-turned ON.

Fifteenth Embodiment

Figure 17:
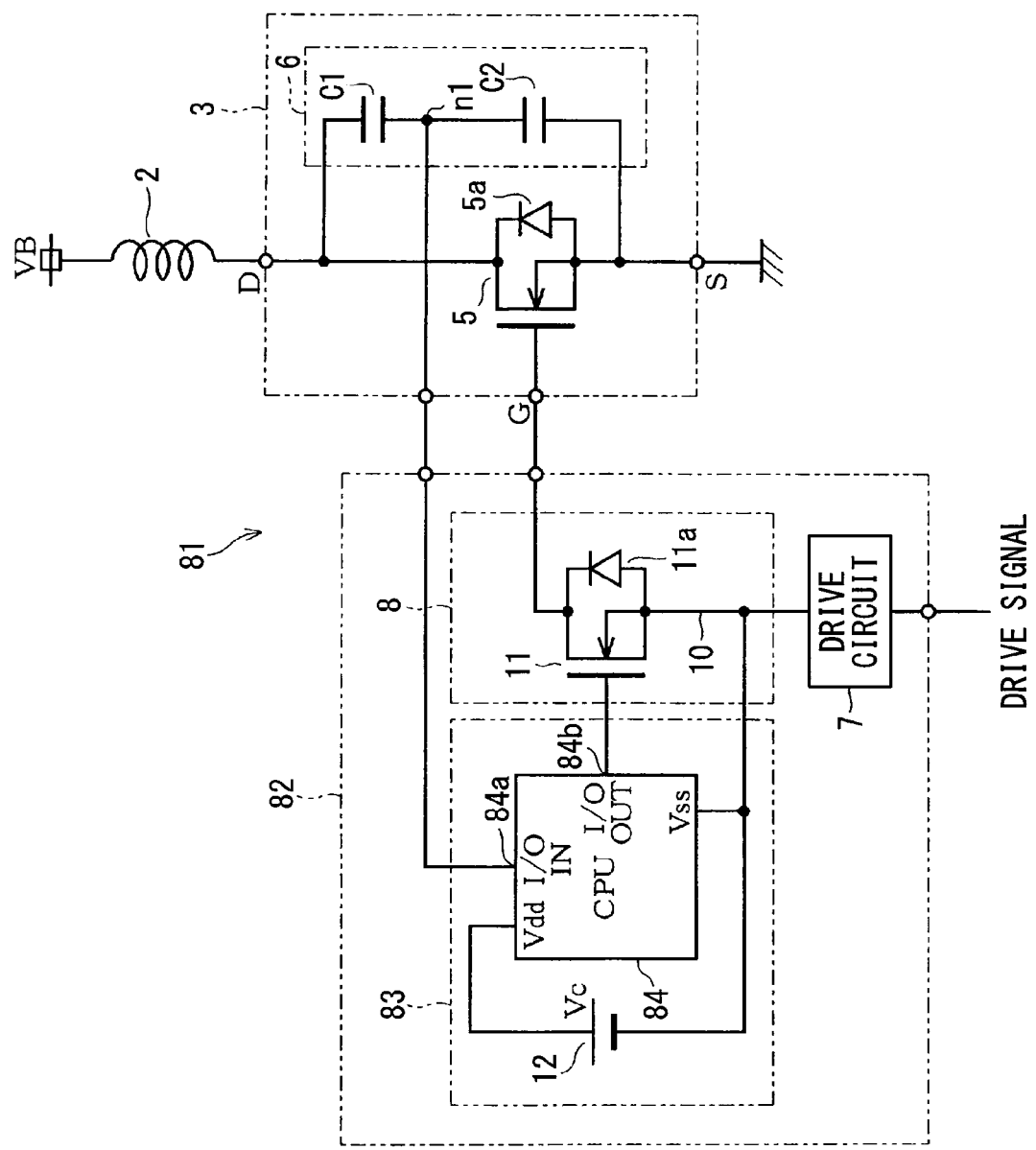
FIG. 17 is a schematic diagram of a load drive apparatus according to a fifteenth embodiment.

A fifteenth embodiment is described below with reference to FIG. 17. A load drive apparatus 81 includes the device module 3 and a drive IC 82. The drive IC 82 has a control circuit 83 including a microcomputer 84 which operates on the output voltage Vc of the power supply 12 as a power supply voltage. The microcomputer 84 is an arithmetic device (CPU) to control temperature correction, overvoltage protection, overcurrent protection, etc.

A terminal 84a of the microcomputer 84 is a digital input terminal with a threshold voltage Vth, and an interrupt occurs at its rising edge. A terminal 84b is a digital output terminal to output 0V (L level)/Vc (H level). When a surge voltage occurs, and the drain-to-source voltage VDS of the FET 5 becomes equal to or greater than the voltage Vm1, the detection voltage the voltage detection circuit 6 outputs exceeds the threshold voltage Vth. At this time, the microcomputer 84 transitions to overvoltage protection interrupt processing and outputs a L-level voltage (0V) through the terminal 84*b*. Thus, the MOSFET 11 is turned OFF so that the FET 5 can be prompted to be self-turned ON.

According to the present embodiment, since the control circuit 83 is constructed using the microcomputer 84 which already exists in the drive IC 82 for the purpose of temperature correction, the number of circuits added to form a surge voltage protection circuit can be further reduced.

Sixteenth Embodiment

Figure 18:
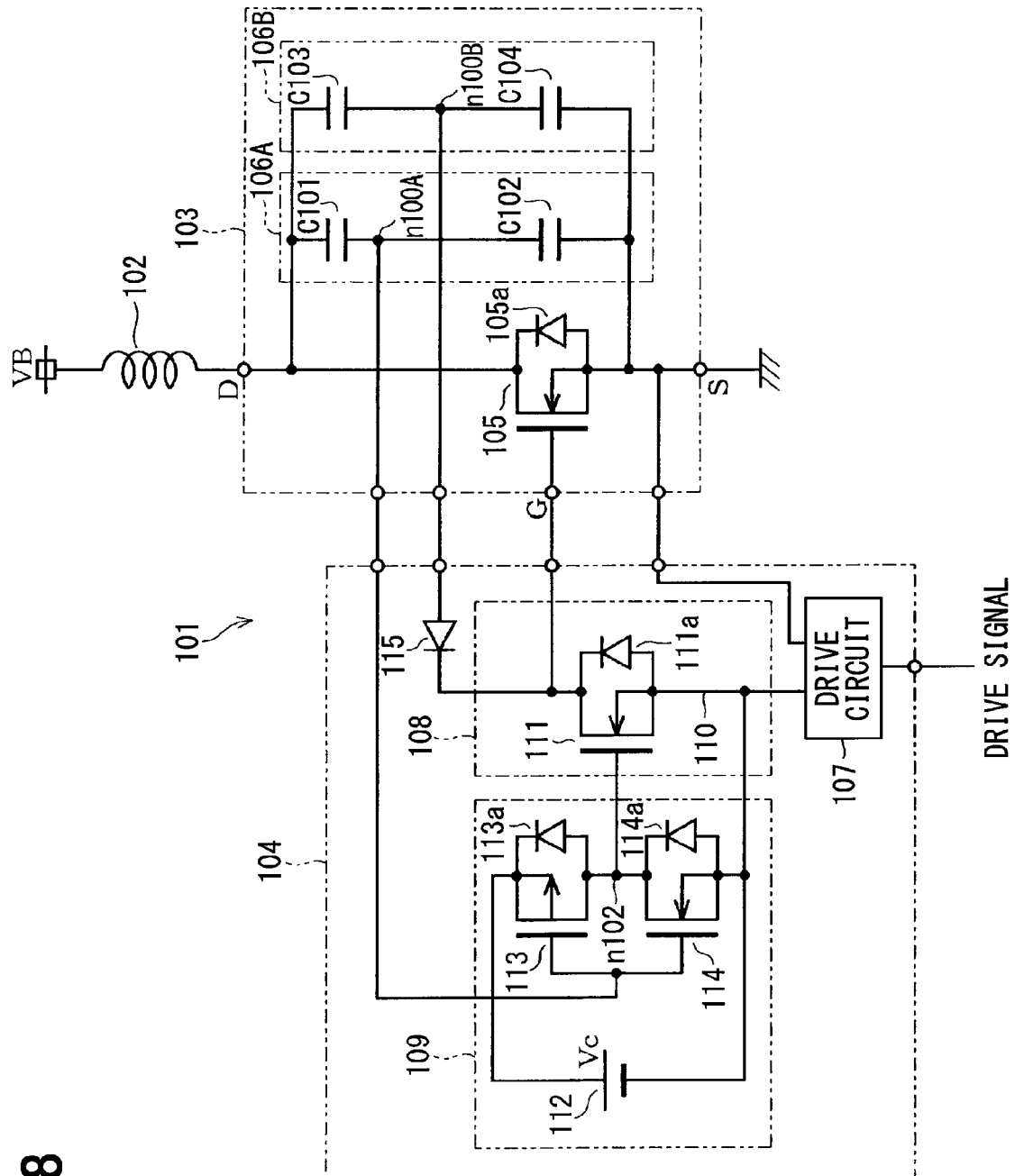
FIG. 18 is a schematic diagram of a load drive apparatus according to a sixteenth embodiment.

A sixteenth embodiment is described below with reference to FIGS. 18-20. A load drive apparatus 101 (corresponding to a semiconductor apparatus) is used for, for example, an electronic control unit mounted on a vehicle and performs an ON/OFF action in accordance with a drive signal inputted from an external circuit (not shown), thereby passing an electric current through a coil 102, which is an inductive load, supplied with a battery voltage VB. The load drive apparatus 101 includes a device module 103 and a drive IC 104.

The device module 103 includes an N-channel FET 105 and first and second voltage detection circuits 106A and 106B which are integrated in a single package. The FET 105 is a switching device such as a MOSFET or a GaN-HEMT and changes a conduction state between a source terminal S (corresponding to a first terminal) and a drain terminal D (corresponding to a second terminal) in accordance with a gate voltage VGS applied between the gate terminal G and the source terminal S. Alternatively, an IGBT can be used instead of a FET. A diode 105*a* is parasitic to or connected in parallel with the FET 105.

The first voltage detection circuit 106A includes capacitors C101 and C102 (corresponding to first and second circuits) which are connected in series between the drain and source of the FET 105 across an output terminal n100A. These capacitors C101 and C102 output a first detection voltage by dividing a voltage applied between the drain and source of the FET 105 and also serve as a capacitor snubber. A capacitance of the capacitor C101 is smaller than a capacitance of the capacitor C102. For example, a capacitance ratio of the capacitor C101 to the capacitance C102 is set to about 1:5 to 500.

The second voltage detection circuit 106B includes capacitors C103 and C104 (corresponding to third and fourth circuits) which are connected in series between the drain and source of the FET 105 across an output terminal n100B. These capacitors C103 and C104 output a second detection voltage by dividing the voltage applied between the drain and source of the FET 105 and also serve as a capacitor snubber. A capacitance of the capacitor C103 is smaller than a capacitance of the capacitor C104. For example, a capacitance ratio of the capacitor C103 to the capacitance C104 is set to about 1:5 to 500.

The drive IC 104 includes a drive circuit 107, a switch circuit 108, a control circuit 109, and a diode 115. The drive circuit 107 has a ground potential common to a source potential of the FET 105 and outputs a gate drive signal (hereinafter simply referred to as the drive signal) for the FET 105 in accordance with a drive signal inputted from an external circuit such as a microcomputer. The switch circuit 108 includes an N-channel MOSFET 111 connected in series to a gate drive wire 110 connected to the gate of the FET 105. The MOSFET 111 includes a parasitic diode 111*a* having a forward direction toward the gate of the FET 105 through the gate drive wire 140.

The control circuit 109 includes an inverter circuit having a P-channel MOSFET 113 and an N-channel MOSFET 114 which are connected between terminals of a power supply 112 across the output terminal n102. The MOSFETs 113 and 114 have parasitic diodes 113*a* and 114*a*, respectively. Device sizes of the MOSFETs 113 and 114 can be small, as long as the device sizes are enough to drive the MOSFET 111.

The gates of the MOSFETs 113 and 114 are connected to the output terminal n100A of the first voltage detection circuit 106A. The output terminal n102 is connected to the gate of the MOSFET 111 to apply a control signal. ADC voltage Vc supplied from the power source 112 only needs to have a value necessary to output the control signal capable of turning ON and OFF the MOSFET 111. The diode 115 (corresponding to an unidirectional device) is connected to the output terminal n100B of the second voltage detection circuit 106B and the gate of the FET 105 to pass an electric current in a direction from the output terminal n100B to the gate.

Figure 19:
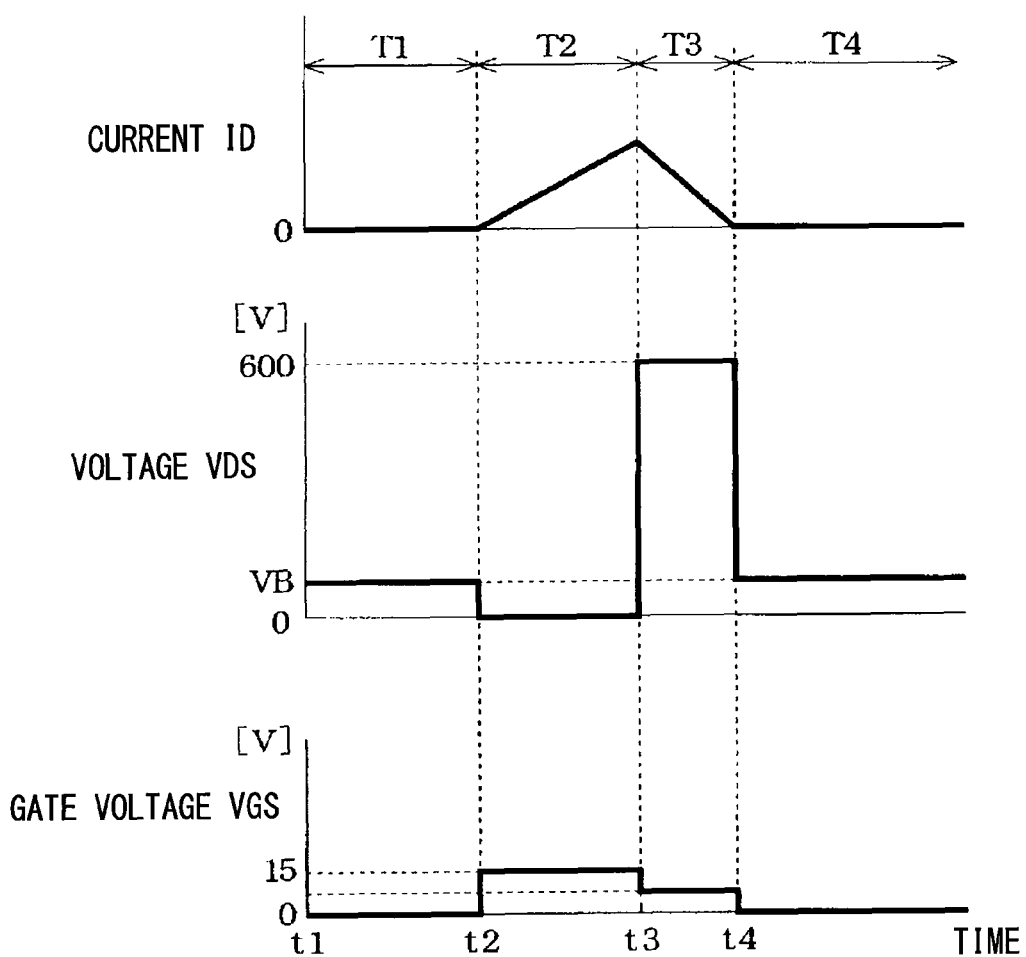
FIG. 19 is a waveform diagram according to the sixteenth embodiment.
Figure 20:
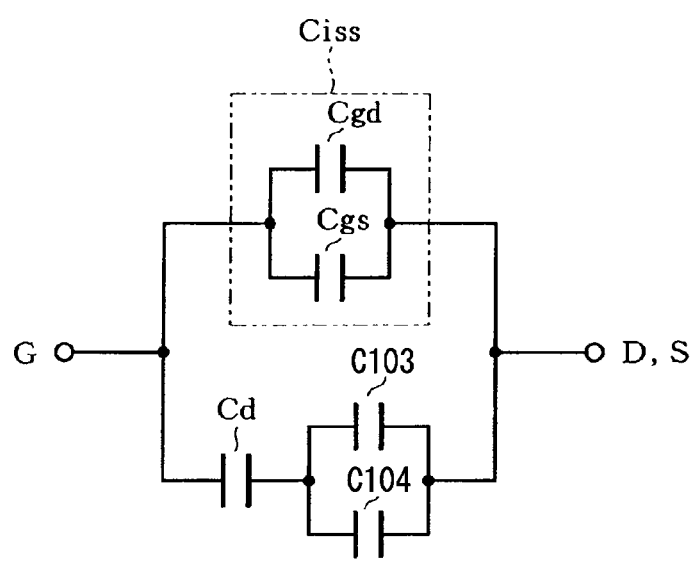
FIG. 20 is a diagram of an equivalent circuit of an input capacitance added to a gate of a switching device according to the sixteenth embodiment.

Next, an effect of the present embodiment is described with further reference to FIGS. 19 and 20. The first voltage detection circuit 106A outputs a first detection voltage given by a formula (5), where VDS represents a drain-to-source voltage of the FET 105.

First detection voltage=$(C101/(C101+C102))\cdot VDS$ (5)

The control circuit 109 has a threshold voltage Vth used for a voltage protection operation for the FET 105. To surely protect the FET 105 from a voltage above a breakdown voltage VDSS, a range not less than a voltage Vm1 which is less than the breakdown voltage VDSS of the FET 105 by a predetermined margin is set as a voltage range where the voltage protection operation for the FET 105 is necessary. The threshold voltage Vth is set less than a detection voltage which the first voltage detection circuit 106A outputs when a voltage within the range where the voltage protection operation is necessary is applied between the drain and source of the FET 105. This can be given by a formula (6).

$Vth<(C101/(C101+C102))\cdot Vm1<(C101/(C101+C102))\cdot VDSS$ (6)

In contrast, a range not larger than a voltage Vm2 which is greater than the battery voltage VB, which is supplied to the load drive apparatus 101, by a predetermined margin (a range less than the voltage range where the voltage protection operation is necessary) is set as a range where the voltage protection operation for the FET 105 is unnecessary. The threshold voltage Vth is set greater than a detection voltage which the first voltage detection circuit 106A outputs when a voltage within the range where the voltage protection operation is unnecessary is applied between the drain and source of the FET 105. This can be given by a formula (7).

$Vth>(C101/(C101+C102))\cdot Vm2>(C101/(C101+C102))\cdot VB$ (7)

A threshold voltage of each of the MOSFETs 113 and 114 of the control circuit 109 is set equal to the threshold voltage Vth, and accordingly the DC voltage Vc is set to a suitable value.

The second voltage detection circuit 106B outputs a second detection voltage given by a formula (8), where VDS represents the drain-to-source voltage of the FET 105.

Second detection voltage=$(C103/(C103+C104))\cdot VDS$ (8)

A voltage divisional ratio of the second voltage detection circuit 106B is set so that the second detection voltage can be less than the sum (=Vth(FET)+Vf) of a gate threshold voltage Vth(FET) of the FET 105 and a forward voltage Vf (a conduction voltage) of the diode 115 when the first detection voltage is equal to or less than the threshold voltage Vth of the control circuit 109. Further, the voltage divisional ratio of the second voltage detection circuit 106B is set so that the second detection voltage can be greater than Vth(FET)+Vf when a voltage equal to or greater than the voltage Vm1 is applied to the FET 105.

FIG. 19 is a waveform diagram showing a drain current ID, the drain-to-source voltage VDS, and the gate voltage VGS of the FET 105. During a period T1 from a time t1 to a time t2, an OFF drive signal remains inputted so that the FET 105 can remain OFF. During a period T2 from the time t2 to a time t3, an ON drive signal remains inputted so that the FET 105 can remain ON. The drain-to-source voltage VDS of the FET 105 is the battery voltage VB during the period T1 and almost 0V (technically, a voltage depending on a relationship between an ON resistance and the drain current ID of the FET 105).

During the periods T1 and T2, since the voltages applied to the device module 103 are not greater than the voltage Vm2, the detection voltage the first voltage detection circuit 106A is less than the threshold voltage Vth described above. Accordingly, the MOSFET 113 is ON, and the MOSFET 114 is OFF, so that the voltage Vc is applied to the gate of the MOSFET 111 through the MOSFET 113. As a result, the MOSFET 111 is turned ON, so that the switch circuit 108 connects the drive circuit 107 to the gate of the FET 105 by a low impedance. On the other hand, as described above, the detection voltage the second voltage detection circuit 106B becomes less than Vth (FET)+Vf. Thus, the FET 5 performs a normal switching action in accordance with a drive signal.

When the FET 105 is turned OFF at the time t3 in response to an inputted OFF drive signal, a surge voltage (including back electromotive force itself) occurs due to back electromotive force, so that the drain-to-source voltage VDS of the FET 105 becomes equal to or greater than the voltage Vm1. The detection voltage the first voltage detection circuit 106A outputs at this time is greater than the threshold voltage Vth and equal to or less than the gate breakdown voltage of the MOSFETs 113 and 114. Therefore, the MOSFET 113 is turned OFF, and the MOSFET 114 is turned ON, so that the gate voltage VGS of the MOSFET 111 becomes 0V. As a result, the MOSFET 111 is turned OFF, so that the switch circuit 108 disconnects the drive circuit 107 from the gate of the FET 105 by a high impedance. Accordingly, the gate of the FET 105 becomes open-circuited.

After that, the gate voltage VGS of the FET 105 starts to increase toward a voltage given by a formula (9) based on the drain-to-source voltage VDS, a gate-to-drain capacitance CGD, and a gate-to-source capacitance CGS.

$$VGS=(CGD/(CGD+CGS))\cdot VDS \quad (9)$$

The second detection voltage the second voltage detection circuit 106B outputs leads the FET 105 to be self-turned ON while the gate voltage VGS increases. That is, according to the voltage divisional ratio of the second voltage detection circuit 106B, when the drain-to-source voltage VDS of the FET 105 increases to or above the voltage Vm1, the first detection voltage exceeds the threshold voltage Vth firstly. Thus, the switch circuit 108 goes into a high impedance state.

Then, the second detection voltage exceeds Vth(FET)+Vf. The gate voltage VGS applied to the FET 105 at this time is equal to or less than the gate breakdown voltage. Thus, the gate voltage VGS of the FET 105 is increased to or above the gate threshold voltage Vth(FET) through the diode 115, so that the FET 105 is self-turned ON. According to this sequence, it is ensured that the second detection voltage does not turn ON the FET 105 when the switch circuit 108 is in a low impedance state.

When the FET 105 is turned ON, energy of a surge voltage applied between the drain and source escapes to the source side through the FET 105, so that the drain-to-source voltage VDS is limited to a voltage (e.g., 600V) which depends on the second detection voltage and equal to or less than the device breakdown voltage. The drain-to-source voltage VDS remains balanced without increasing during a period of time where the surge voltage is being released. Likewise, the gate voltage is balanced at a voltage less than the second detection voltage by Vf.

When the energy is fully released at a time t4, the drain-to-source voltage VDS starts to decrease, and both the first detection voltage and the second detection voltage start to decrease accordingly. At this time, the second detection voltage decreases below Vth(FET)+Vf firstly, and the second detection voltage becomes incapable of turning ON the gate. Even in this case, as long as the switch circuit 108 remains in a high impedance state, the FET 105 remains ON. After that, when the first detection voltage decreases to or below the threshold voltage Vth, the switch circuit 108 goes into a low impedance state, and the FET 105 performs a switching action in accordance with a drive signal again.

In the above actions, a maximum value of a gate current of the FET 105 reaches about a few amperes. However, since a turn-on/turn-off time during which the gate current flows is very small, rated currents of the MOSFETs 111 and the diode 115 can be small. Further, since the MOSFETs 113 and 114 are used to drive the MOSFET 111, the device sizes of the MOSFETs 113 and 114 can be small. Therefore, the switch circuit 108 and the control circuit 109 can be sufficiently smaller in device size than the FET 105.

The capacitors C101 and C102 have a function to charge/discharge the gate capacitances of the MOSFETs 113 and 114 according to the detection voltage. Therefore, the capacitors C101 and C102 need to have capacitances to sufficiently drive the gate capacitances of the MOSFETs 113 and 114. For example, it is preferable that the capacitances of the capacitors C101 and C102 should be one to one hundred times greater than the gate capacitances of the MOSFETs 113 and 114.

The capacitors C103 and C104 have a function to charge the gate capacitance of the FET 105, thereby self-turning ON the FET 105. Therefore, the capacitors C103 and C104 need to have capacitances enough to lead the FET 105 to be self-turned ON while the gate voltage VGS increases according to the formula (9). For example, it is preferable that the capacitances of the capacitors C103 and C104 should be one to one hundred times greater than the gate capacitance of the FET 105.

The MOSFET 111 of the switch circuit 108 includes the parasitic diode 111a having an anode on the drive circuit 107 side and a cathode on the gate side of the FET 105. Therefore, even when the switch circuit 108 is in a disconnecting state, an ON drive signal having a positive voltage the drive circuit 107 outputs can be applied to the gate of the FET 105 through the parasitic diode 111a. Thus, the FET 105 can be turned ON by the ON drive signal outputted by the drive circuit 107 regardless of the state of the switch circuit 108. When an IGBT or a bipolar transistor is used instead of the MOSFET 111, the same effect can be obtained by adding a parallel diode.

According to the present embodiment, when the drain-to-source voltage VDS of the FET 105 becomes equal to or greater than the voltage Vm1 which is less than its device breakdown voltage VDSS, the switch circuit 108 provided in the gate drive wire 110 goes into the disconnecting state so that the gate of the FET 105 can be open-circuited. Thus, according to the present embodiment, the FET 105 can be surely self-turned ON using the second detection voltage despite the fact that a conventional Si device such as a MOS transistor may be less likely to be self-turned ON when its gate is open-circuited.

The capacitors C103 and C104 are connected to the gate of the FET 105 through the diode 115. FIG. 20 shows an equivalent circuit of a capacitance added to the gate of the FET 105, where Ciss=Cgd+Cgs represents an input capacitance of the FET 105, and Cd represents a junction capacitance of the diode 115 when a reverse voltage is applied to the diode 115.

As described above, since the rated current of the diode 115 is very small, Cd<C103, C104. Therefore, an equivalent capacitance when the capacitors C103 and C104 are viewed from the gate of the FET 105 through the diode 115 becomes a very small value almost equal to the junction capacitance of the diode 115. Further, a diode having a large rated current to serve as a bypass for a surge is not connected to the gate of the FET 105. Therefore, a parasitic capacitance added to the gate is small compared to a conventional structure. Accordingly, a breakdown voltage can be ensured while a fast switching performance (in particular, turn-on characteristic) of the FET 105 is ensured.

The load drive apparatus 101 is suitable for, in particular, a GaN device, for example, the FET 105 such as a GaN-HEMT. A GaN-HEMT has no avalanche resistance (L load resistance), a low gate breakdown voltage, and a small gate capacitance. According to the present embodiment, a resistance to a surge voltage can be increased with little decrease in a switching speed. Obviously, the present disclosure can be applied to a MOSFET and IGBT.

The voltage detection circuits 106A and 106B are configured as a capacitor snubber. Therefore, dV/dt and ringing at the time of turn-off is reduced while the number of parts and a mounting space are reduced. Further, conditions for the voltage protection operation can be set easily based on a relationship between the capacitance ratio of the capacitors C101 and C102, the capacitance ratio of the capacitors C103 and C104, and the device breakdown voltage of the FET 105.

The device module 103 may be provided by forming the capacitors C101-C104 on the same semiconductor substrate as the FET 105. Alternatively, the FET 105 and the capacitors C101-C104 as discrete devices may be molded after being mounted on a substrate. Alternatively, the FET 105, the capacitors C101-C104, the switch circuit 108, the control circuit 109, and the diode 115 may be formed on the same semiconductor substrate. In this case, the drive circuit 107 may be formed together. Only the capacitors C101-C104 may be external devices. In this way, since the flexibility in circuit structure is high, miniaturization can be achieved.

Seventeenth Embodiment

Figure 21:
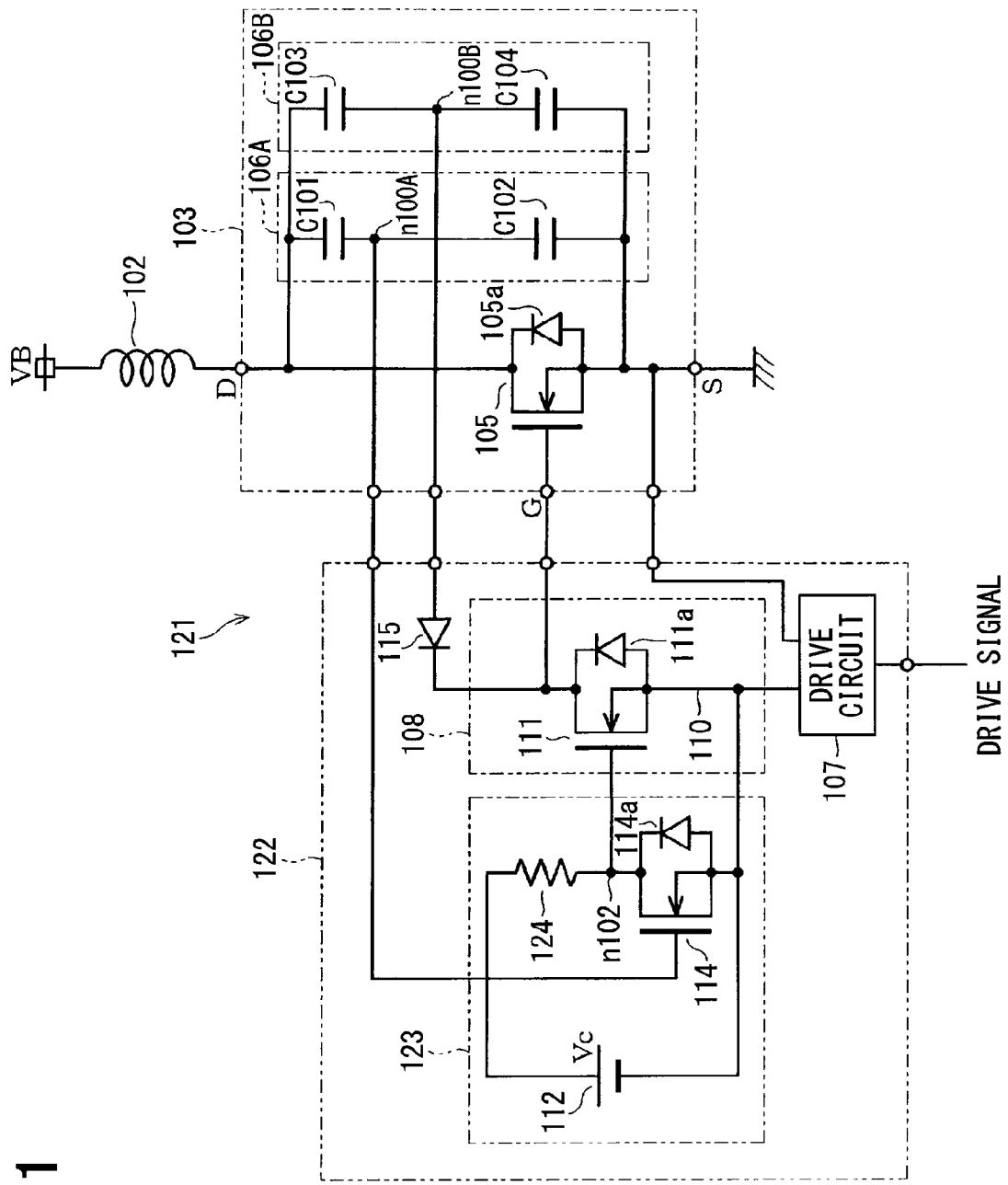
FIG. 21 is a schematic diagram of a load drive apparatus according to a seventeenth embodiment.

A seventeenth embodiment is described below with reference to FIG. 21. A drive IC 122 of a load drive apparatus 121 includes a control circuit 123. The control circuit 123 has an inverter circuit including a resistor 124 and the MOSFET 114 which are connected in series across the output terminal n102 between the terminals of the power supply 112. A threshold voltage of the MOSFET 114 is equal to the threshold voltage Vth described above.

When no surge voltage is applied, the first detection voltage is less than the threshold voltage Vth. Accordingly, the MOSFET 114 is OFF, and the voltage Vc is applied to the gate of the MOSFET 111 through the resistor 124. In contrast, when a surge voltage occurs, and the drain-to-source voltage VDS of the FET 105 becomes equal to or greater than the voltage Vm1, the first detection voltage becomes greater than the threshold voltage Vth and equal to or less than the gate breakdown voltage of the MOSFET 114. Accordingly, the MOSFET 114 is turned ON, and the switch circuit 108 goes into the disconnecting state. After that, the FET 105 is self-turned ON by the increase in the gate voltage VGS shown in the formula (9) or the second detection voltage.

According to the present embodiment, since the control circuit 123 includes one MOSFET 114, a circuit area can be further reduced. It is noted that when the MOSFET 141 is turned ON, an electric current from the power supply 112 passes through the resistor 124 and the MOSFET 114. However, since the MOSFET 114 is rarely turned ON, and its ON duration is short, an increase in consumption power is almost zero.

Eighteenth Embodiment

Figure 22:
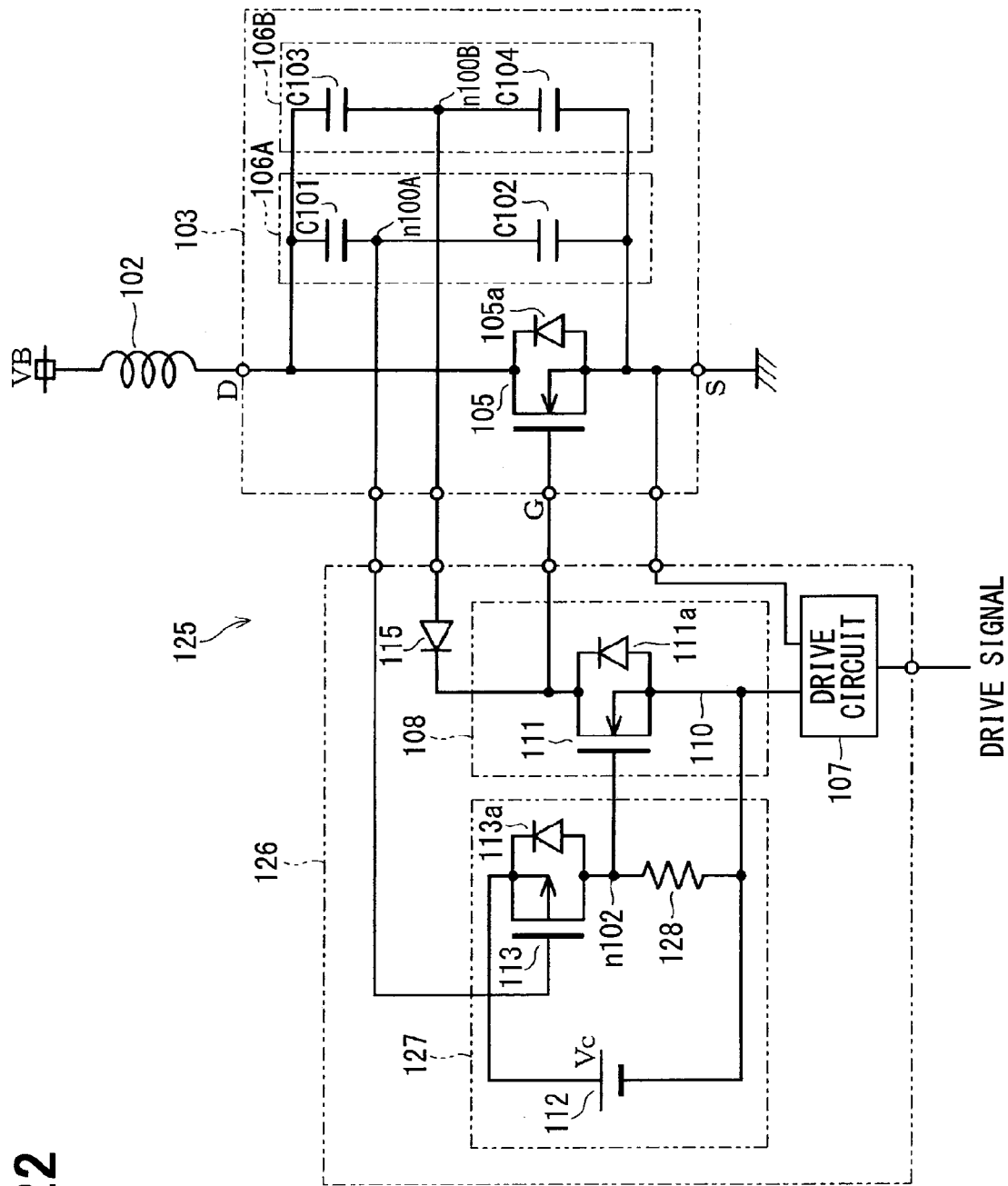
FIG. 22 is a schematic diagram of a load drive apparatus according to an eighteenth embodiment.

An eighteenth embodiment is described below with reference to FIG. 22. A drive IC 126 of a load drive apparatus 125 includes a control circuit 127. The control circuit 127 has the MOSFET 113 and a resistor 128 which are connected in series across the output terminal n102 between the terminals of the power supply 112. It is configured in such a manner that when the first detection voltage exceeds the threshold voltage Vth, the MOSFET 113 is turned OFF.

When no surge voltage is applied, the first detection voltage is less than the threshold voltage Vth. Accordingly, the MOSFET 113 is ON, and the voltage Vc is applied to the gate of the MOSFET 111 through the MOSFET 113. In contrast, when a surge voltage occurs, and the drain-to-source voltage VDS of the FET 105 becomes equal to or greater than the voltage Vm1, the first detection voltage becomes greater than the threshold voltage Vth and equal to or less than the gate breakdown voltage of the MOSFET 113. Accordingly, the MOSFET 113 is turned OFF, and the switch circuit 8 goes into the disconnecting state. After that, the FET 105 is self-turned ON by the increase in the gate voltage VGS shown in the formula (9) or the second detection voltage. According to the present embodiment, since the control circuit 127 includes one MOSFET 113, a circuit area can be further reduced.

Nineteenth Embodiment

Figure 23:
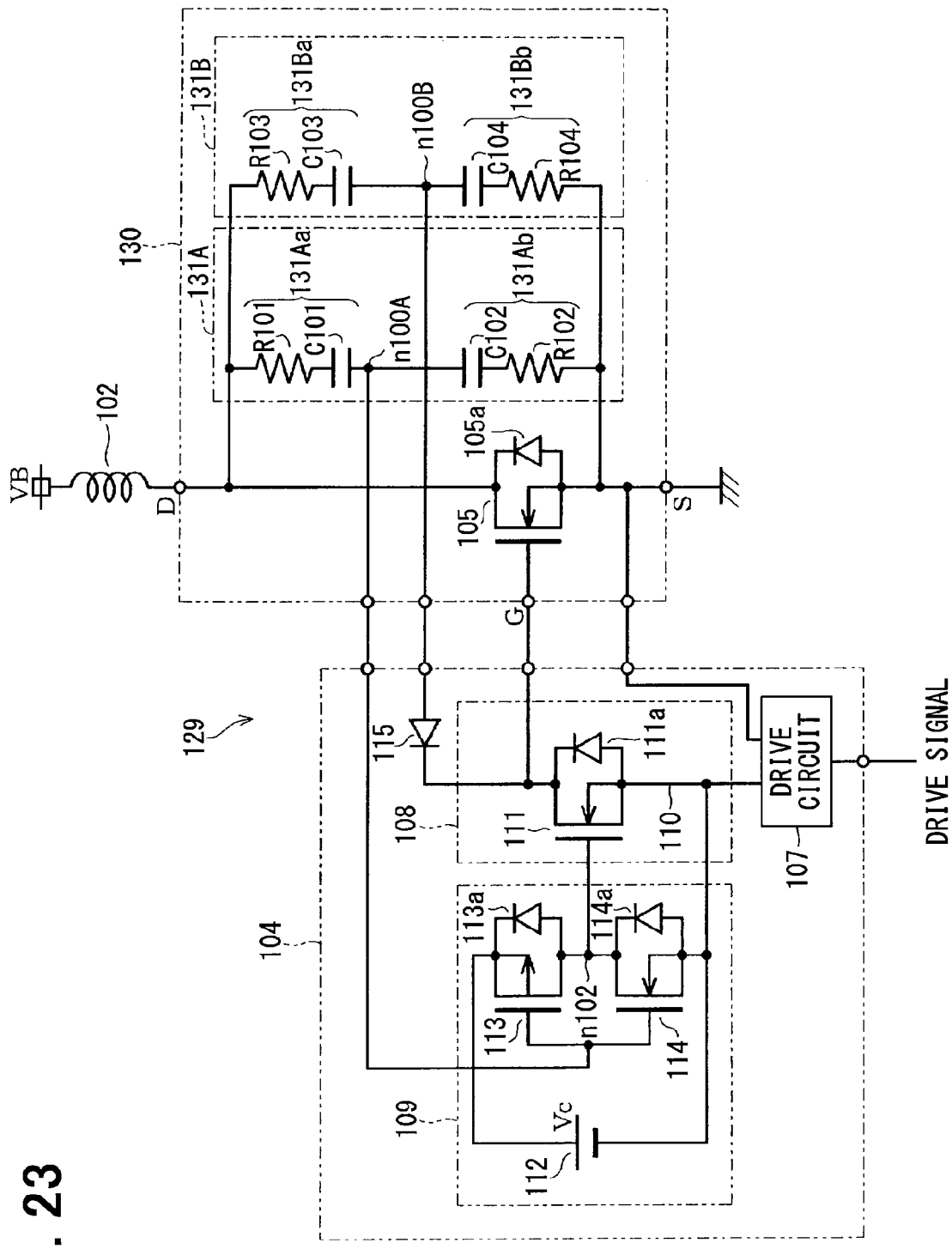
FIG. 23 is a schematic diagram of a load drive apparatus according to a nineteenth embodiment.

A nineteenth embodiment is described below with reference to FIG. 23. A load drive apparatus 129 includes a device module 130 and the drive IC 104. The device module 130 includes a first voltage detection circuit 131A and a second voltage detection circuit 131B in addition to the FET 105.

The first voltage detection circuit 131A includes a first circuit 131Aa and a second circuit 131Ab which are connected in series across an output terminal n100A. The first circuit 131Aa is a series circuit of a resistor R101 and the capacitor C101. The second circuit 131Ab is a series circuit of a resistor R102 and the capacitor C102. Likewise, the second voltage detection circuit 131B includes a third circuit 131Ba and a fourth circuit 131Bb which are connected in series across an output terminal n100B. The third circuit 131Ba is a series circuit of a resistor R103 and the capacitor C103. The fourth circuit 131Bb is a series circuit of a resistor R104 and the capacitor C104.

A capacitance of the capacitor C101 is smaller than a capacitance of the capacitor C102. For example, a capacitance ratio of the capacitor C101 to the capacitor C102 is set to about 1:5 to 500. A resistance of the resistor R101 is larger than a resistance of the resistor R102. For example, a resistance ratio of the resistor R101 to the resistor R102 is set to about 5 to 500:1. Likewise, a capacitance of the capacitor C103 is smaller than a capacitance of the capacitor C104. For example, a capacitance ratio of the capacitor C103 to the capacitor C104 is set to about 1:5 to 500. A resistance of the resistor R103 is larger than a resistance of the resistor R104. For example, a resistance ratio of the resistor R103 to the resistor R104 is set to about 5 to 500:1.

Since the first and second voltage detection circuits 131A and 131B according to the present embodiment are configured as a RC snubber, surge energy stored in the capacitors C101, C102, C103, and C104 are consumed by the resistors R101, R102, R103, and R104, so that a voltage surge is further reduced. Further, since the resistors R101, R102, R103, and R104 are connected in series, ripple current flowing through the capacitors C101, C102, C103, and C104 can be reduced.

In this case, when constants are set so that $\tau 1 = C101 \cdot R101 \approx C102 \cdot R102$, $\tau 2 = C103 \cdot R103 \approx C104 \cdot R104$, a charging/discharging state of the first circuit 131Aa becomes equal to a charging/discharging state of the second circuit 131Ab, a charging/discharging state of the third circuit 131Ba becomes equal to a charging/discharging state of the fourth circuit 131Bb, so that voltage division ratios of the first and second voltage detection circuits 131A and 131B can be stabilized to their respective desired values.

Further, the length of time the first detection voltage takes to become stable can be made equal to the length of time the second detection voltage takes to become stable by setting $\tau 1$ equal to $\tau 2$. Therefore, the state change of the switch circuit 108 and the self-turn on/off of the FET 105 can be surely achieved according to the above sequence when a surge voltage is applied. Further, at least, by setting $\tau 1$ equal to or less than $\tau 2$, the FET 105 can be turned ON after the switch circuit 108 goes into the high impedance state.

Twentieth Embodiment

Figure 24:
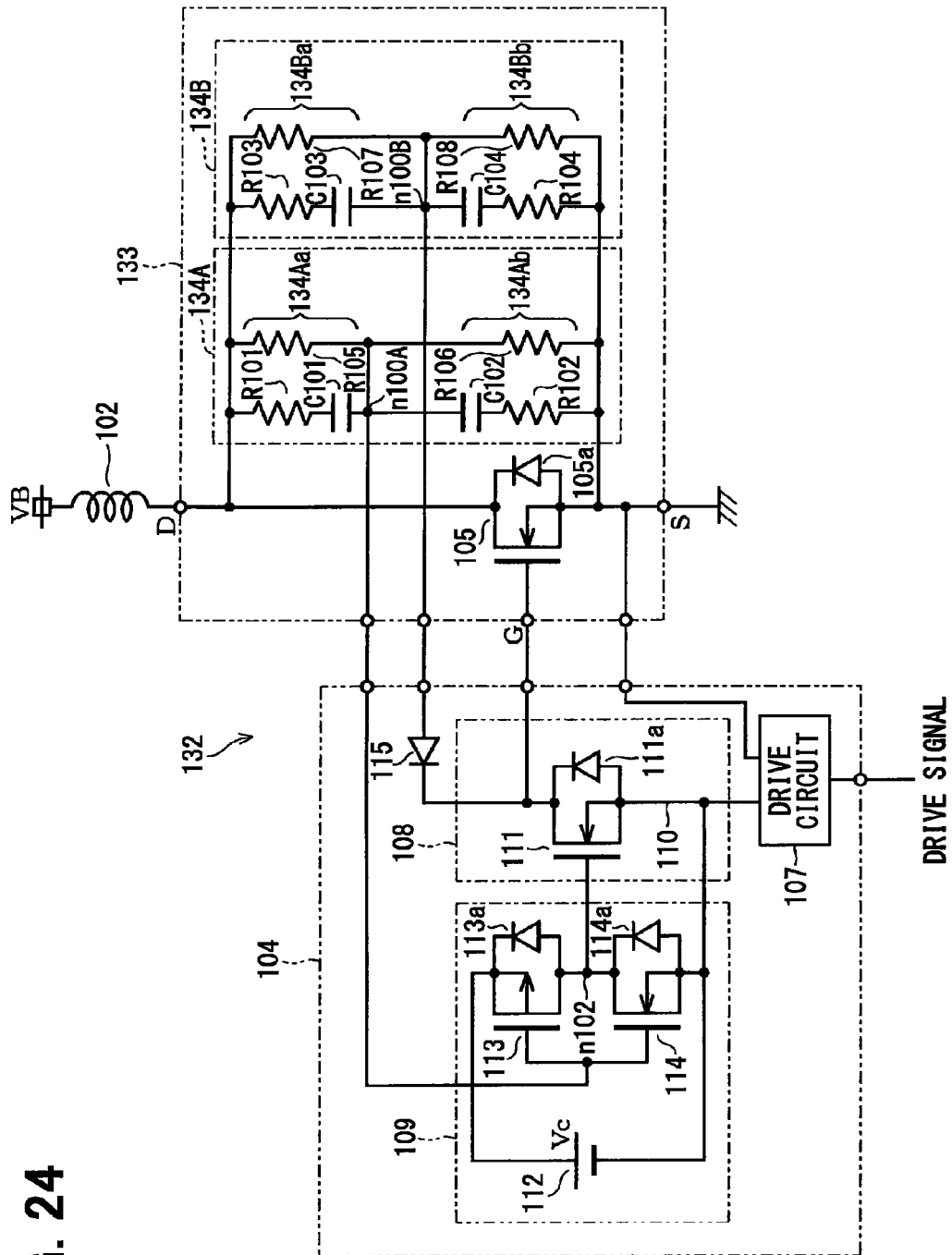
FIG. 24 is a schematic diagram of a load drive apparatus according to a twentieth embodiment.

A twentieth embodiment is described below with reference to FIG. 24. A load drive apparatus 132 includes a device module 133 and the drive IC 104. The device module 133 includes a first voltage detection circuit 134A and a second voltage detection circuit 134B in addition to the FET 105.

The first voltage detection circuit 134A includes a first circuit 134Aa and a second circuit 134Ab which are connected in series across an output terminal n100A. The first circuit 134Aa includes the first circuit 131Aa (refer to FIG. 23) described above and a resistor R105 connected in parallel with the first circuit 131Aa. The second circuit 134Ab includes the second circuit 131Ab (refer to FIG. 23) described above and a resistor R106 connected in parallel with the second circuit 131Ab. Likewise, the second voltage detection circuit 134B includes a third circuit 134Ba and a fourth circuit 134Bb which are connected in series across an output terminal n100B. The third circuit 134Ba includes the third circuit 131Ba (refer to FIG. 23) described above and a resistor R107 connected in parallel with the third circuit 131Ba. The fourth circuit 134Bb includes the fourth circuit 131Bb (refer to FIG. 23) described above and a resistor R108 connected in parallel with the fourth circuit 131Bb.

The capacitance ratio of the capacitor C101 to the capacitor C102, the resistance ratio of the resistor R101 to the resistor R102, the capacitance ratio of the capacitor C103 to the capacitor C104, and the resistance ratio of the resistor R103 to the resistor R104 are the same as those in the nineteenth embodiment. A resistance of the resistor R105 is larger than a resistance of the resistor R106. For example, a resistance ratio of the resistor R105 to the resistor R106 is set to about 5 to 500:1. Likewise, a resistance of the resistor R107 is larger than a resistance of the resistor R108. For example, a resistance ratio of the resistor R107 to the resistor R108 is set to about 5 to 500:1.

Since the first and second voltage detection circuits 134A and 134B according to the present embodiment are configured as a RC snubber, a voltage surge is further reduced like in the nineteenth embodiment. Further, when constants are set so that $\tau 1 = C101 \cdot R101 \approx C102 \cdot R102$, $C102:C101 \approx R101:R102 \approx R105:R106$, $\tau 2 = C103 \cdot R103 \approx C104 \cdot R104$, $C104:C103 \approx R103:R104 \approx R107:R108$, a charging/discharging state of the first circuit 134Aa becomes equal to a charging/discharging state of the second circuit 134Ab, and a charging/discharging state of the third circuit 134Ba becomes equal to a charging/discharging state of the fourth circuit 134Bb, so that voltage division ratios of the first and second voltage detection circuits 134A and 134B can be stabilized to their respective desired values. Furthermore, the effect and advantage obtained by setting $\tau 1$ equal to $\tau 2$ or by setting $\tau 1$ equal to or less than $\tau 2$ are the same as those in the nineteenth embodiment.

In particular, the addition of the balance resistors R105-R108 increases responsiveness to a voltage change, so that the voltage division ratio is further stabilized during a transient. It is noted that the resistances of the resistors R105-R108 can be determined based on a balance between voltage division ratio stabilization and resistive loss.

Twenty-First Embodiment

Figure 25:
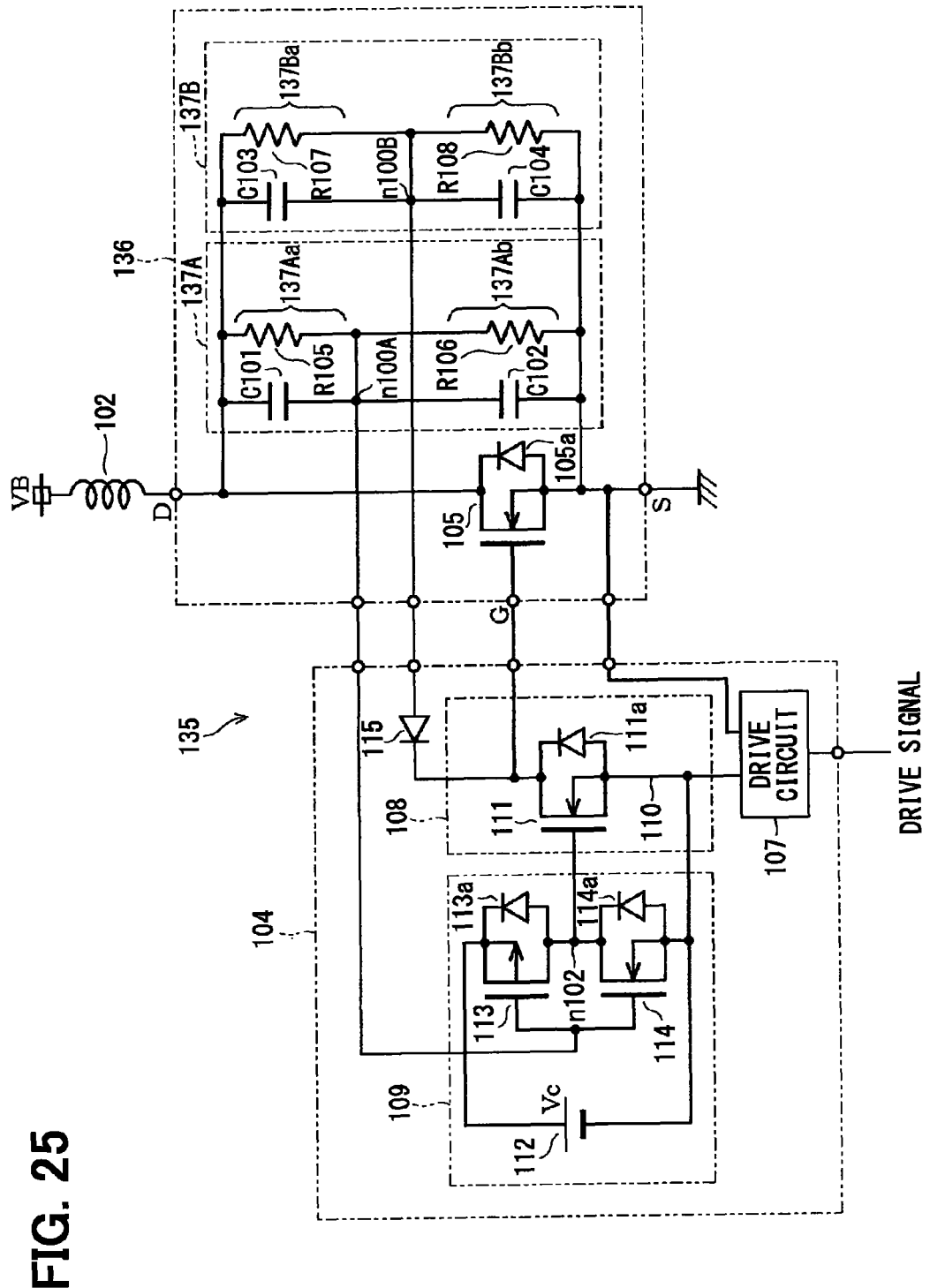
FIG. 25 is a schematic diagram of a load drive apparatus according to a twenty-first embodiment.

A twenty-first embodiment is described below with reference to FIG. 25. A load drive apparatus 135 includes a device module 136 and the drive IC 104. The device module 136 includes a first voltage detection circuit 137A and a second voltage detection circuit 137B in addition to the FET 105.

The first voltage detection circuit 137A includes a first circuit 137Aa and a second circuit 137Ab which are connected in series across the output terminal n100A. The first circuit 137Aa is a parallel circuit of the capacitor C101 and the resistor R105. The second circuit 137Ab is a parallel circuit of the capacitor C102 and the resistor R106. Likewise, the second voltage detection circuit 137B includes a third circuit 137Ba and a fourth circuit 137Bb which are connected in series across the output terminal n100B. The third circuit 137Ba is a parallel circuit of the capacitor C103 and the resistor R107. The fourth circuit 137Bb is a parallel circuit of the capacitor C104 and the resistor R108. The capacitance ratio of the capacitor C101 to the capacitor C102, the resistance ratio of the resistor R105 to the resistor R106, the capacitance ratio of the capacitor C103 to the capacitor C104, and the resistance ratio of the resistor R107 to the resistor R108 are the same as those in the twentieth embodiment.

When constants are set so that $C101:C102 \approx R106:R105$, and $C103:C104 \approx R108:R107$, a charging/discharging state of the first circuit 137Aa becomes equal to a charging/discharging state of the second circuit 137Ab, and a charging/discharging state of the third circuit 137Ba becomes equal to a charging/discharging state of the fourth circuit 137Bb, so that voltage division ratios of the first and second voltage detection circuits 137A and 137B can be stabilized to their respective desired values. Further, the addition of the balance resistors R105-R108 provides the same effect as in the twentieth embodiment.

Twenty-Second Embodiment

Figure 26:
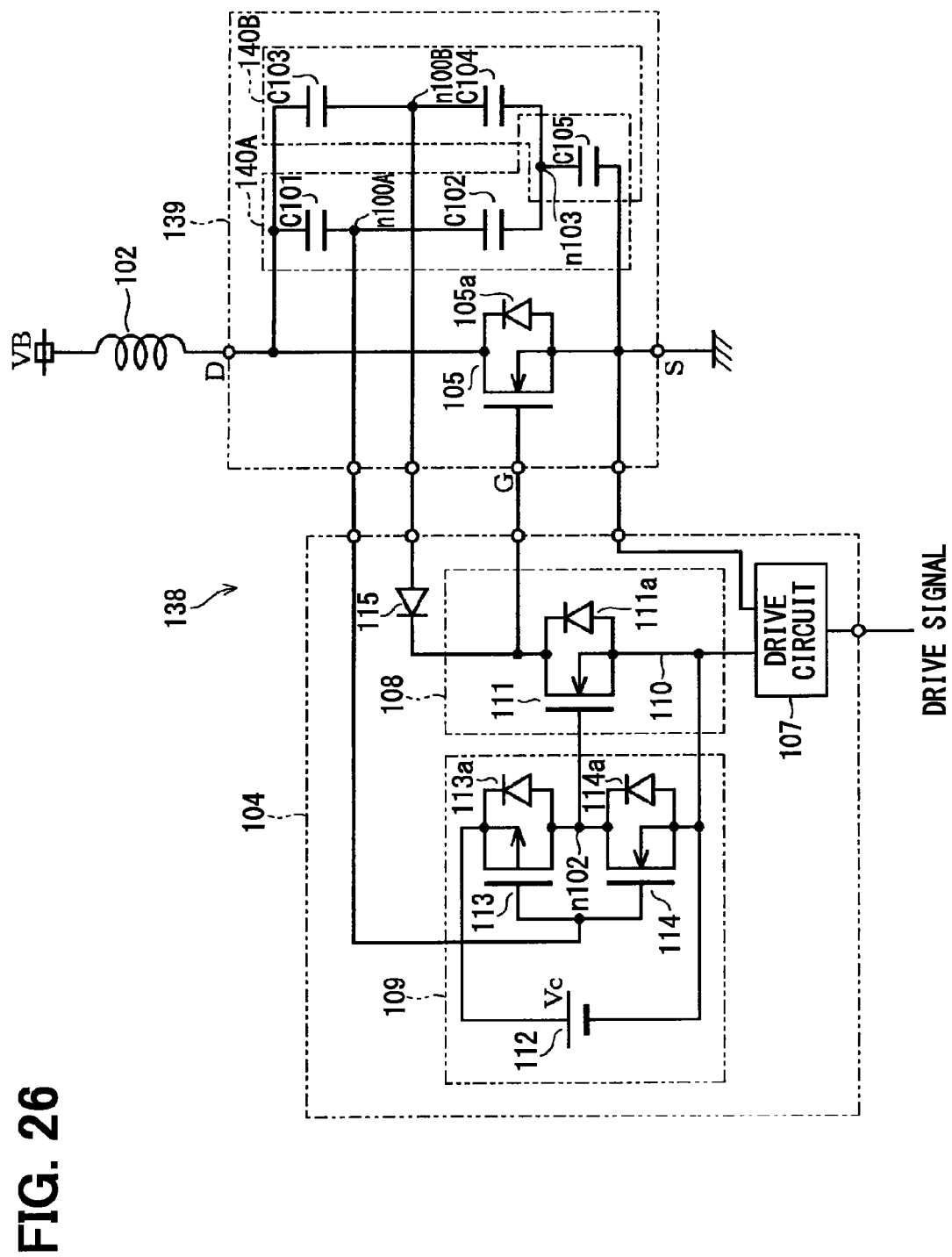
FIG. 26 is a schematic diagram of a load drive apparatus according to a twenty-second embodiment.

A twenty-second embodiment is described below with reference to FIG. 26. A load drive apparatus 138 includes a device module 139 and the drive IC 104. The device module 139 includes a first voltage detection circuit 140A and a second voltage detection circuit 140B in addition to the FET 105. The first voltage detection circuit 140A includes a capacitor C105 in addition to the voltage detection circuit 106A of the sixteenth embodiment. The second voltage detection circuit 140B includes the capacitor C105 in addition to the voltage detection circuit 106B of the sixteenth embodiment. The capacitor C105 is a common circuit and connected between the source of the FET 105 and a common connection node n103 between the capacitors C102 and C104. In place of the capacitors C102 and C104, the capacitor C105 has part of a common capacitance between the capacitors C102 and C104.

A voltage V3 of the node n103, a first detection voltage V1, and a second detection voltage V2 are given by formulas (10), (11), and (12), respectively. Here, CA represents a series combined resistance of the capacitors C101 and C102, and CB represents a series combined resistance of the capacitors C103 and C104.

$$V3=(CA+CB)/(CA+CB+C105)\cdot VDS \quad (10)$$

$$V1=1/(C101+C102)\cdot(C101\cdot VDS+C102\cdot V3) \quad (11)$$

$$V2=1/(C103+C104)\cdot(C103\cdot VDS+C104\cdot V3) \quad (12)$$

The threshold voltage Vth is set less than a detection voltage V1 which the first voltage detection circuit 140A outputs when a voltage (a voltage not less the voltage Vm1) within the range where the voltage protection operation is necessary is applied between the drain and source of the FET 105. Further, the threshold voltage Vth is set greater than a detection voltage which the first voltage detection circuit 140A outputs when a voltage (a voltage not greater than the voltage Vm2) within the range where the voltage protection operation is unnecessary is applied between the drain and source of the FET 105.

A voltage divisional ratio of the second voltage detection circuit 140B is set so that the second detection voltage can be less than Vth(FET)+Vf when the first detection voltage V1 is equal to or less than the threshold voltage Vth. Further, the voltage divisional ratio of the second voltage detection circuit 140B is set so that the second detection voltage can be greater than Vth(FET)+Vf when a voltage equal to or greater than the voltage Vm1 is applied to the FET 105.

According to the present embodiment, the same effect and advantage as in the sixteenth embodiment can be obtained. Further, because of the capacitor C105 as a common circuit, a total capacitance of the capacitors C102, C104, and C105 of the present embodiment can be smaller than a total capacitance of the capacitors C102 and C104 of the sixteenth embodiment. Likewise, a total capacitance of the capacitors C101-C104 (C105) can be made small. Further, since a relative difference in capacitance between the capacitors C102 and C104 is reduced, a relative difference between the first detection voltage V1 and the second detection voltage V2 is reduced accordingly, so that a voltage detection accuracy is improved.

Twenty-Third Embodiment

Figure 27:
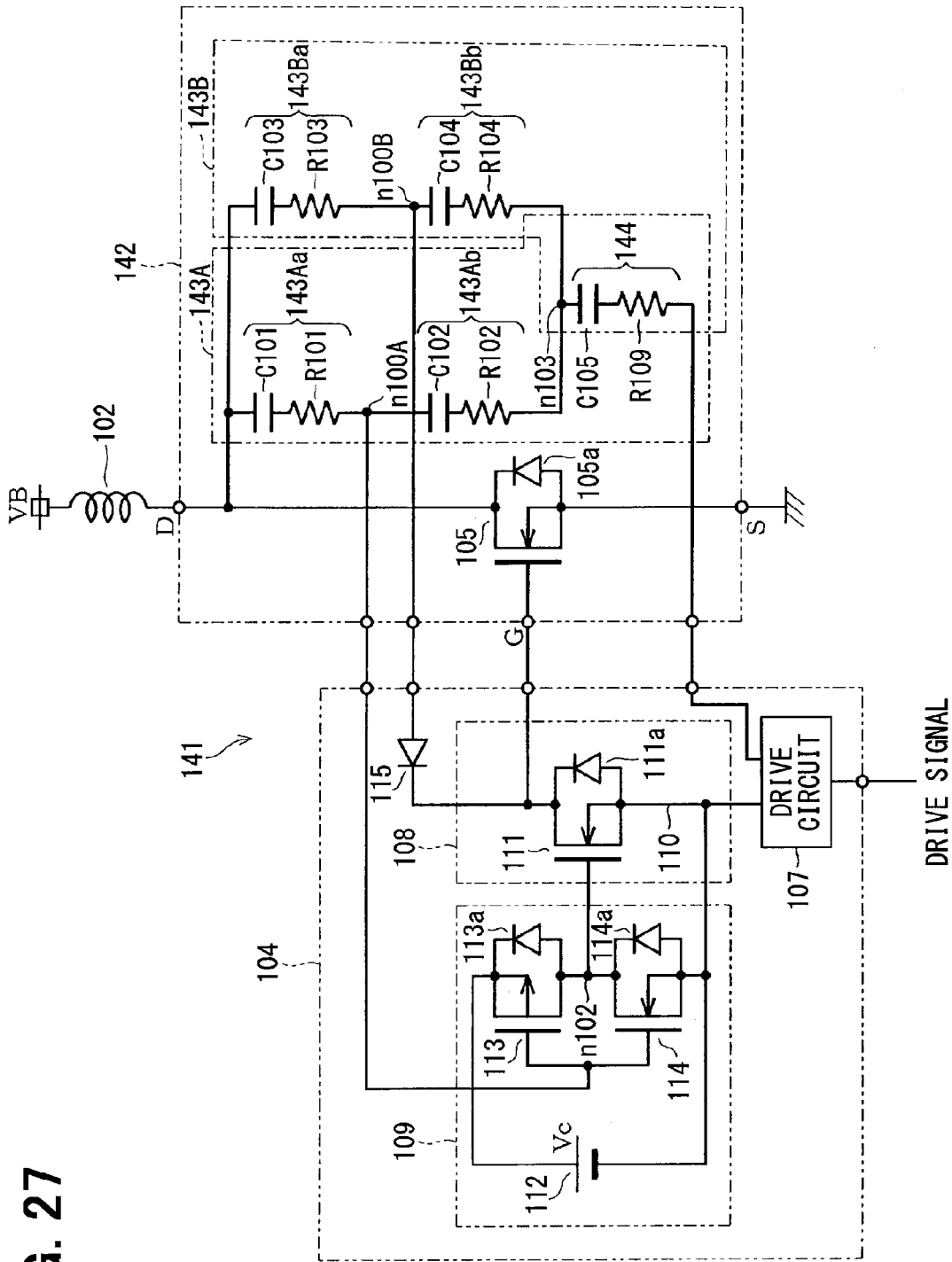
FIG. 27 is a schematic diagram of a load drive apparatus according to a twenty-third embodiment.

A twenty-third embodiment is described below with reference to FIG. 27. A load drive apparatus 141 includes a device module 142 and the drive IC 104. The device module 142 includes a first voltage detection circuit 143A and a second voltage detection circuit 143B in addition to the FET 105. A common circuit 144 is connected between the node n103 and the source of the FET 105 and shared between the voltage detection circuits 143A and 143B. A first circuit 143Aa to a fourth circuit 143Bb are configured in the same manner as the first circuit 131Aa to the fourth circuit 131Bb shown in FIG. 23. Likewise, the common circuit 144 is a series circuit of the capacitor C105 and a resistor R109.

The capacitances of the capacitor C101 to C105 are set in the same manner as those in the nineteenth and twenty-second embodiments. Like in the nineteenth embodiment, it is preferable that the constants should be set so that τ1=C101·R101≈C102·R102, τ2=C103·R103≈C104·R104, and τ1=τ2 (at least τ1≤τ2). Further, the length of time the first detection voltage takes to become stable can be made equal to the length of time the second detection voltage takes to become stable by setting τ1, τ2, and τ3 equal to one another, where τ3=C105·R109.

According to the present embodiment, the same effect and advantage as those obtained in the nineteenth and twenty-second embodiments can be obtained. Further, surge energy stored in the capacitor C105 is consumed by the resistor R109, so that a ripple current flowing through the capacitor C105 can be reduced.

Twenty-Fourth Embodiment

Figure 28:
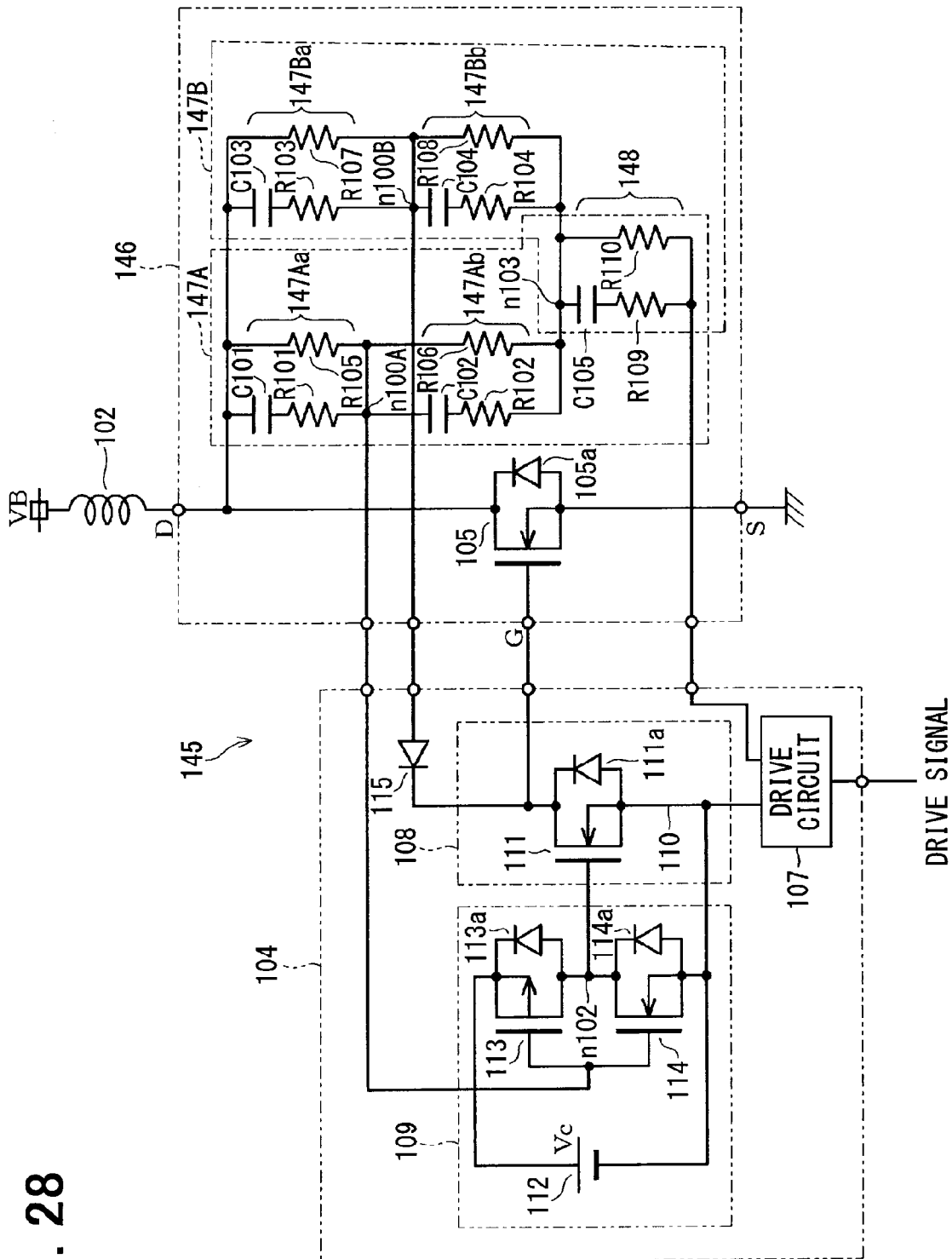
FIG. 28 is a schematic diagram of a load drive apparatus according to a twenty-fourth embodiment.

A twenty-fourth embodiment is described below with reference to FIG. 28. A load drive apparatus 145 includes a device module 146 and the drive IC 104. The device module 146 includes a first voltage detection circuit 147A and a second voltage detection circuit 147B in addition to the FET 105. A common circuit 148 is connected between the node n103 and the source of the FET 105 and shared between the voltage detection circuits 147A and 147B. A first circuit 147Aa to a fourth circuit 147Bb are configured in the same manner as the first circuit 134Aa to the fourth circuit 134Bb shown in FIG. 24. Likewise, the common circuit 148 includes a resistor R110 connected in parallel with the series circuit of the capacitor C105 and the resistor R109.

The capacitances of the capacitor C101 to C105 and the resistances of the resistors R101 to R104 are set in the same manner as those described in the twentieth and twenty-third embodiments. Like in the twentieth embodiment, it is preferable that the constants should be set so that τ1=C101·R101≈C102·R102, C102:C101≈R101:R102≈R105:R106, τ2=C103·R103 C104·R104, C104:C103≈R103:R104≈R107:R108. Further, the length of time the first detection voltage takes to become stable can be made equal to the length of time the second detection voltage takes to become stable by setting τ1, τ2, and τ3 equal to one another, where τ3=C105·R109.

According to the present embodiment, the same effect and advantage as those obtained in the twenty-third embodiment can be obtained. In particular, the addition of the balance resistors R105-R108, and R110 increases responsiveness to a voltage change, so that the voltage division ratio is further stabilized during a transient. It is noted that the resistances of the resistors R105-R108, and R110 can be determined based on a balance between voltage division ratio stabilization and resistive loss.

Twenty-Fifth Embodiment

Figure 29:
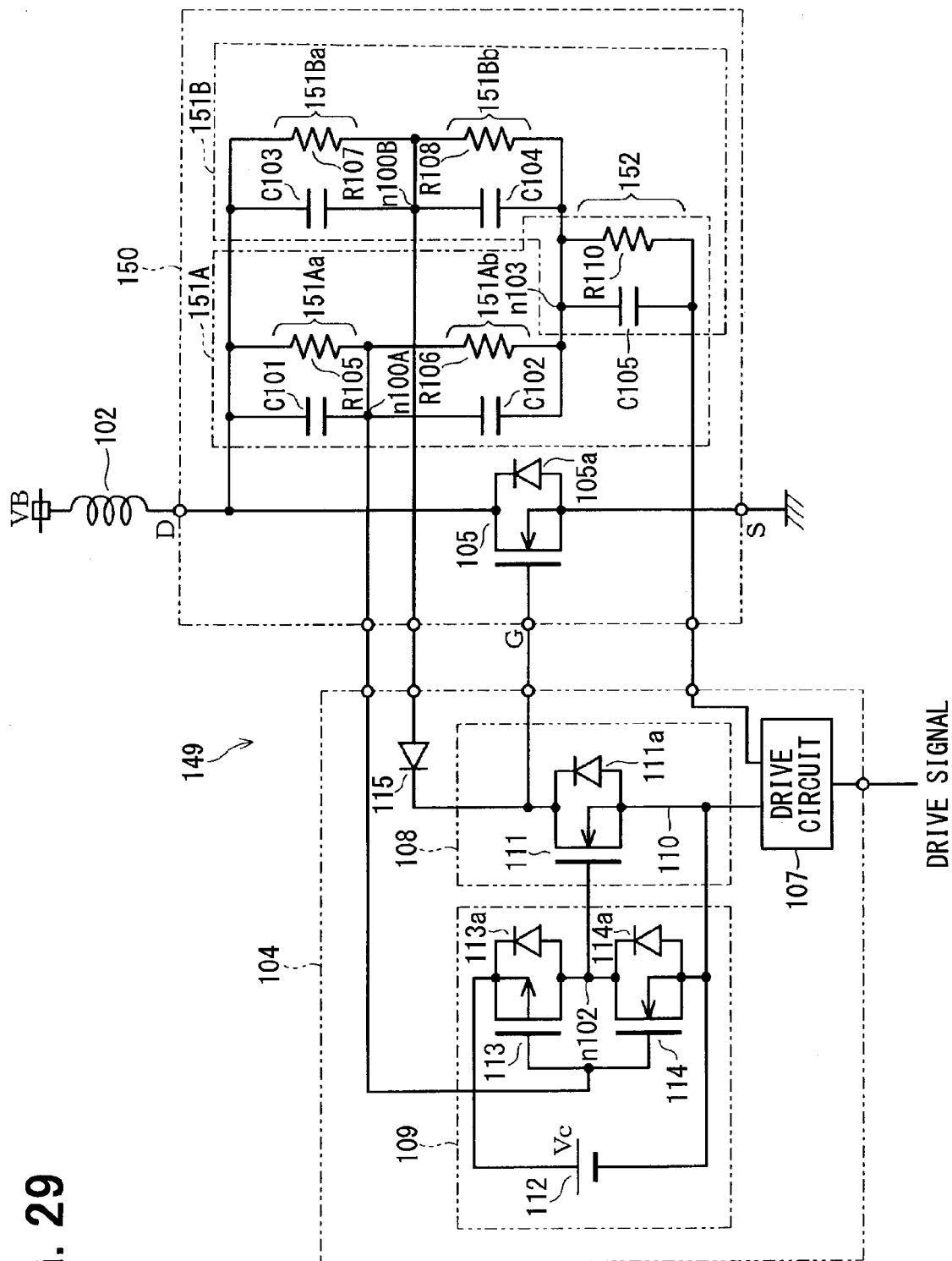
FIG. 29 is a schematic diagram of a load drive apparatus according to a twenty-fifth embodiment.

A twenty-fifth embodiment is described below with reference to FIG. 29. A load drive apparatus 149 includes a device module 150 and the drive IC 104. The device module 150 includes a first voltage detection circuit 151A and a second voltage detection circuit 151B in addition to the FET 105. A common circuit 152 is connected between the node n103 and the source of the FET 105 and shared between the voltage detection circuits 151A and 151B. A first circuit 151Aa to a fourth circuit 151Bb are configured in the same manner as the first circuit 137Aa to the fourth circuit 137Bb shown in FIG. 25. Likewise, the common circuit 152 is a parallel circuit of the capacitor C105 and the resistor R110.

The capacitances of the capacitor C101 to C105 are set in the same manner as those described in the twenty-first and twenty-second embodiments. Like in the twenty-first embodiment, it is preferable that a resistance ratio between the resistors R105 to R108, and R110 should be equal to a voltage divisional ratio between the capacitors C101 to C104, and C105. According to this setting, the resistance ratio between the resistors R105 to R108, and R110 is given by a formula (13).

$$R105:R106:R107:R108:R110 = C102 \cdot C105(C103 + C104):C101 \cdot C105(C103 + C104):C104 \cdot C105(C101 + C102):C103 \cdot C105(C101 + C102): C101 \cdot C102(C103 + C104) + (C101 + C102)C103 \cdot C104 \quad (13)$$

According to the present embodiment, the same effect and advantage as those obtained in the twenty-first and twenty-second embodiments can be obtained. It is noted that the resistances of the resistors R105-R108, and R110 can be determined based on a balance between voltage division ratio stabilization and resistive loss.

Twenty-Sixth Embodiment

Figure 30:
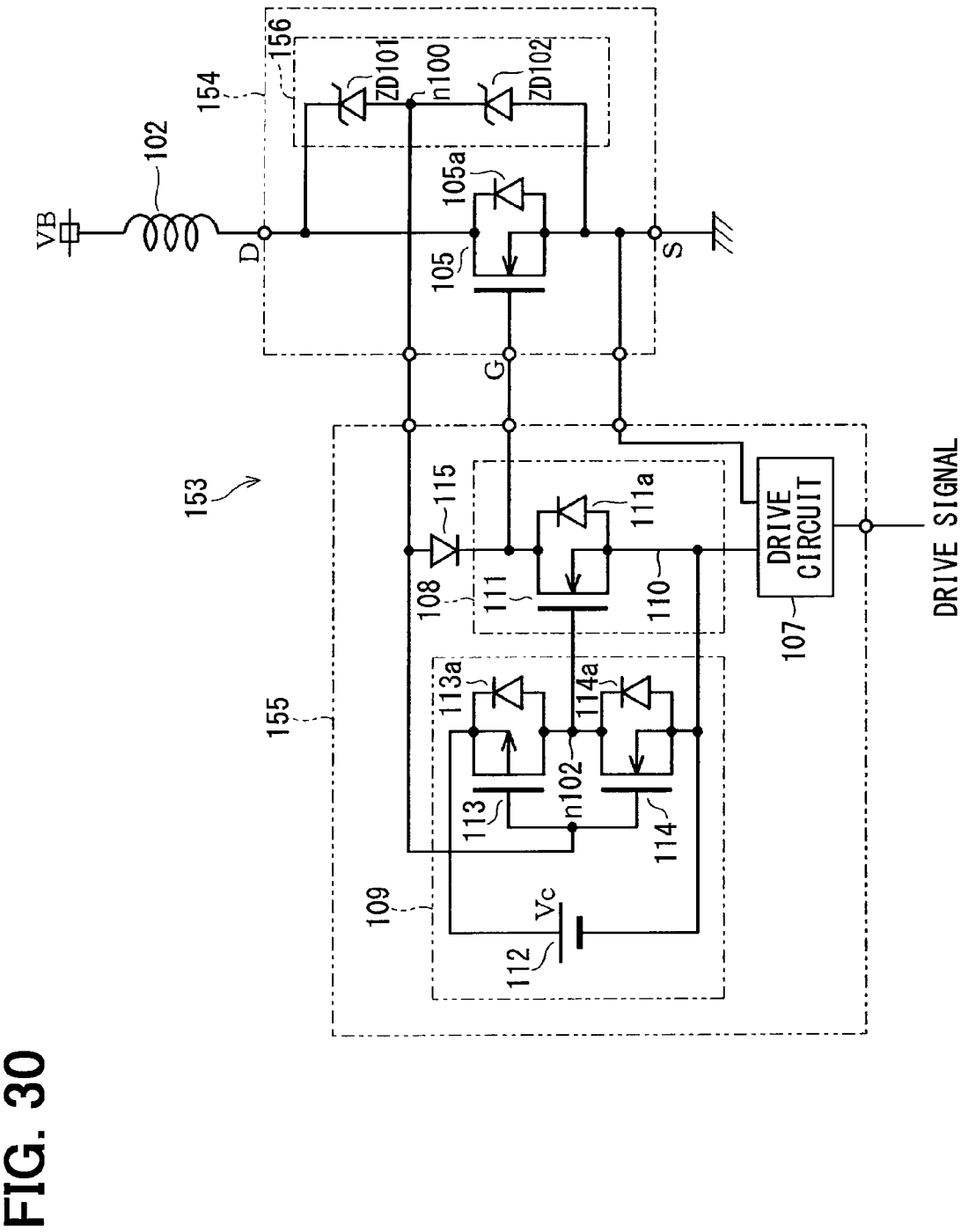
FIG. 30 is a schematic diagram of a load drive apparatus according to a twenty-sixth embodiment.

A twenty-sixth embodiment is described below with reference to FIG. 30. A load drive apparatus 153 includes a device module 154 and a drive IC 155. The device module 154 includes the FET 105 and a voltage detection circuit 156.

The voltage detection circuit 156 outputs a first detection voltage according to the drain and source of the FET 105 and includes Zener diodes ZD101 and ZD102 (corresponding to first and second circuits) which are connected in series with polarity shown in the drawing across the output terminal n101 between the drain and source of the FET 105. The Zener diodes ZD101 and ZD102 serve as an energization circuit which conducts when a voltage exceeding a Zener voltage (corresponding to a predetermined voltage) less than the voltage Vm1 and greater than the voltage Vm2 is applied.

The drive IC 155 includes the drive circuit 107, the switch circuit 108, the control circuit 109, and a diode 115. The gates of the MOSFETs 113 and 114 of the control circuit 109 are connected to the output terminal n100 of the voltage detection circuit 156. The diode 115 (corresponding to an unidirectional device) is connected between the output terminal n100 and the gate of the FET 105 to pass an electric current in a direction from the output terminal n100 to the gate.

The control circuit 109 has a threshold voltage Vth used for a voltage protection operation for the FET 105. The threshold voltage Vth is set less than a detection voltage (a Zener voltage VZD2) which the voltage detection circuit 156 outputs when a voltage not less than the voltage Vm1 is applied between the drain and source of the FET 105 so that the Zener diodes ZD101 and ZD102 can conduct. Further, the threshold voltage Vth is set greater than a detection voltage which the voltage detection circuit 156 outputs when a voltage not greater than the voltage Vm2 is applied between the drain and source of the FET 105 so that the Zener diodes ZD101 and ZD102 cannot conduct.

Further, the threshold voltage Vth is less than the sum (=Vth(FET)+Vf) of the gate threshold voltage Vth (FET) of the FET 105 and the forward voltage Vf (a conduction voltage) of the diode 115. Further, a voltage divisional ratio (i.e., Zener voltages VZD1 and VZD2) of the voltage detection circuit 156 is set so that the first detection voltage can be greater than Vth(FET)+Vf when a voltage not less than the Vm1 is applied to the FET 105.

The effect of the present embodiment is almost the same as that of the sixteenth embodiment. That is, when a surge voltage occurs, and the drain-to-source voltage VDS of the FET 105 becomes equal to or greater than the voltage Vm1, the Zener diodes ZD101 and ZD102 conduct. The first detection voltage the voltage detection circuit 156 outputs at this time is greater than the threshold voltage Vth and equal to or less than the gate breakdown voltage of the MOSFETs 113 and 114. As a result, the switch circuit 108 disconnects the drive circuit 107 from the gate of the FET 105 by a high impedance.

After that, the gate voltage VGS of the FET 105 starts to increase toward a voltage given by the formula (9). The first detection voltage leads the FET 105 to be self-turned ON though the diode 115 while the gate voltage VGS increases. That is, when the drain-to-source voltage VDS of the FET 105 increases to or above the voltage Vm1, the first detection voltage exceeds the threshold voltage Vth firstly, and the switch circuit 108 goes into a high impedance state.

Then, the first detection voltage exceeds Vth(FET)+Vf. The gate voltage VGS applied to the FET 105 at this time is equal to or less than the gate breakdown voltage. Thus, the gate voltage VGS of the FET 105 is increased to or above the gate threshold voltage Vth(FET) through the diode 115, so that the FET 105 is self-turned ON. According to this sequence, it is ensured that the first detection voltage does not turn ON the FET 105 when the switch circuit 108 is in a low impedance state.

When the energy is fully released, the drain-to-source voltage VDS starts to decrease, and the first detection voltage starts to decrease accordingly. At this time, the first detection voltage decreases below Vth(FET)+Vf firstly. Even in this case, as long as the switch circuit 108 remains in a high impedance state, the FET 105 remains ON. After that, when the first detection voltage decreases to or below the threshold voltage Vth, the switch circuit 108 goes into a low impedance state, and the FET 105 performs a switching action in accordance with a drive signal again.

According to the present embodiment, when the drain-to-source voltage VDS of the FET 105 becomes equal to or greater than the voltage Vm1, the Zener diodes ZD101 and Z102 conduct so that a voltage of the output terminal n100 can be kept almost constant. Thus, the switch circuit 108 is stable in the disconnecting state, so that the FET 105 is accurately and surely self-turned ON.

It is noted that the Zener diodes ZD101 and ZD102 are used to detect a voltage rather than serve as a bypass for energy of a surge voltage. Therefore, the Zener diodes ZD101 and ZD102 only need to have device sizes enough to drive the gate capacitances of the MOSFETs 113 and 114. Therefore, a capacitance when the Zener diodes ZD101 and ZD102 are viewed from the gate of the FET 105 through the diode 115 is less than a junction capacitance of the diode 115. For this reason, a parasitic capacitance added to the gate is small. Accordingly, a breakdown voltage can be ensured while a fast switching performance (in particular, turn-on characteristic) of the FET 105 is ensured. In addition, the same advantage as that obtained in the sixteenth embodiment can be obtained.

Twenty-Seventh Embodiment

Figure 31:
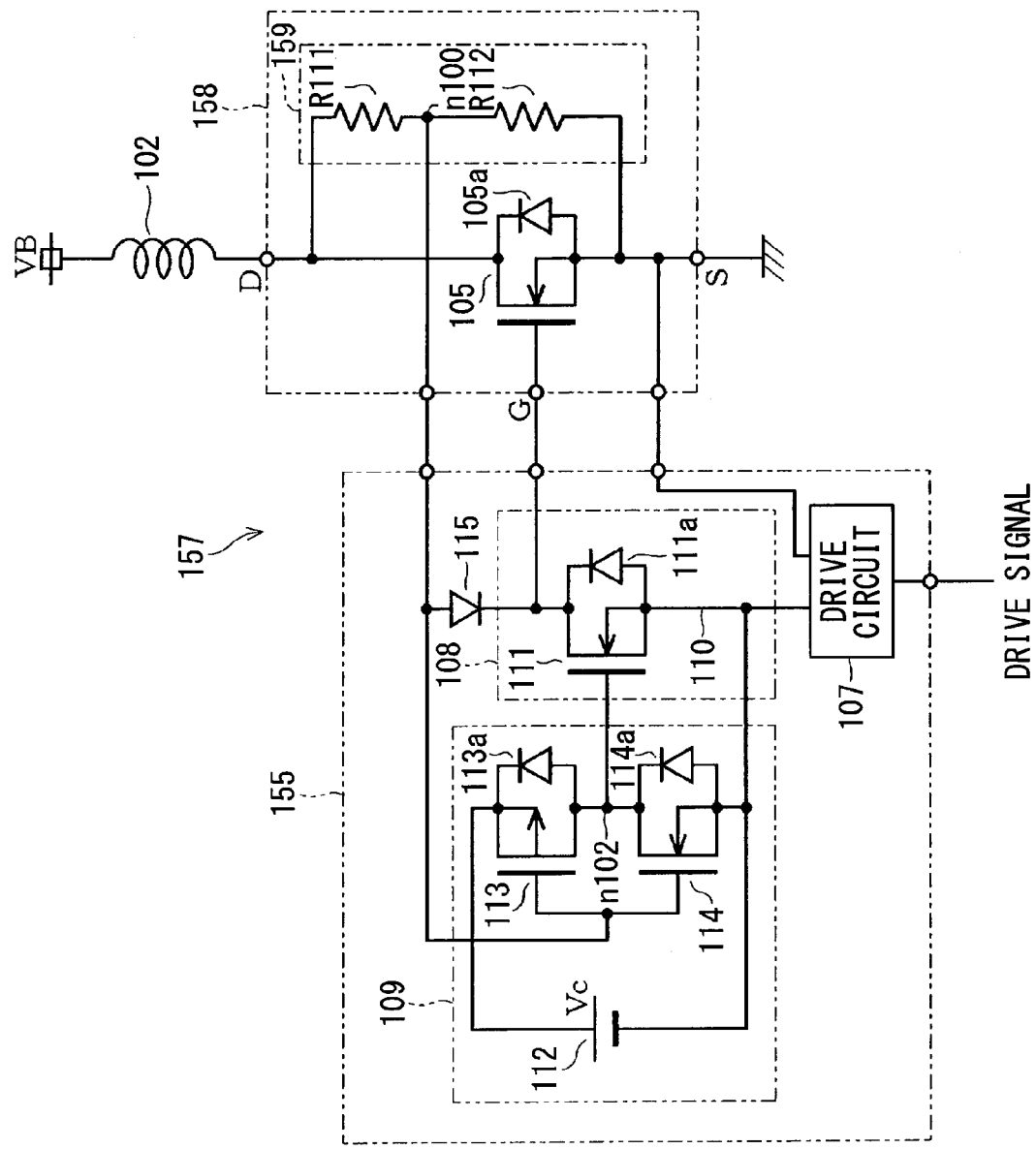
FIG. 31 is a schematic diagram of a load drive apparatus according to a twenty-seventh embodiment.

A twenty-seventh embodiment is described below with reference to FIG. 31. A load drive apparatus 157 includes a device module 158 and the drive IC 155. The device module 158 includes the FET 105 and a voltage detection circuit 159. The voltage detection circuit 159 includes resistors R111 and R112 (corresponding to first and second circuits) which are connected in series across the output terminal n100 between the drain and source of the FET 105. A resistance ratio of the resistor R111 to the resistor R112 is set to about 5 to 500:1, and the resistors R111 and R112 have relatively high resistances so as to reduce resistive loss.

Since the voltage detection circuit 159 outputs the detection voltage with resistor voltage division, responsiveness to a voltage change is good, so that the voltage division ratio can be accurate and stable. Thus, according to the present embodiment, the switch circuit 108 is stable in the disconnecting state, so that the FET 105 is accurately and surely self-turned ON.

Twenty-Eighth Embodiment

Figure 32:
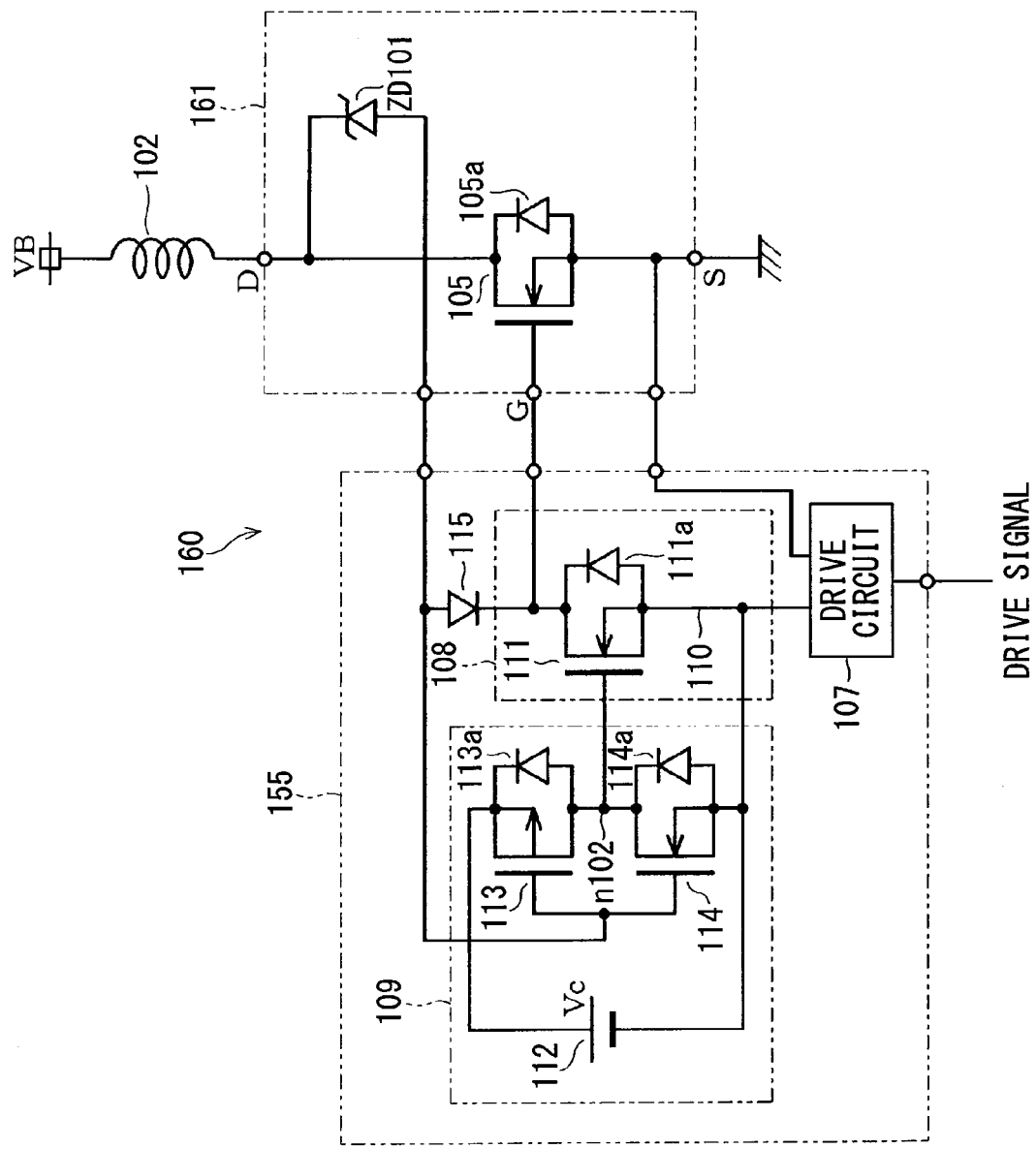
FIG. 32 is a schematic diagram of a load drive apparatus according to a twenty-eighth embodiment.

A twenty-eighth embodiment is described below with reference to FIG. 32. A load drive apparatus 160 includes a device module 161 and the drive IC 155. The device module 161 includes the FET 105 and the Zener diode ZD101 (voltage detection circuit). This structure is equivalent to a structure achieved by deleting the Zener diode ZD102 from the load drive apparatus 153 described in the twenty-eighth embodiment.

The threshold voltage Vth of the control circuit 109 is set less than a detection voltage which the anode of the Zener diode ZD101 outputs when a voltage not less than the voltage Vm1 is applied between the drain and source of the FET 105. Further, the threshold voltage Vth is set greater than a voltage which the anode of the Zener diode ZD101 outputs when a voltage not greater than the voltage Vm2 is applied between the drain and source of the FET 105 so that the Zener diode ZD101 cannot conduct. Further, the threshold voltage Vth is less than Vth(FET)+Vf. The Zener voltage VZD1 is set so that the detection voltage the anode outputs can be greater than Vth(FET)+Vf when a voltage not less than the Vm1 is applied to the FET 105.

According to the present embodiment, the same effect and advantage as those obtained in the twenty-sixth embodiment can be obtained. In addition, since the voltage detection circuit includes one Zener diode ZD101, the size can be further reduced.

Twenty-Ninth Embodiment

Figure 33:
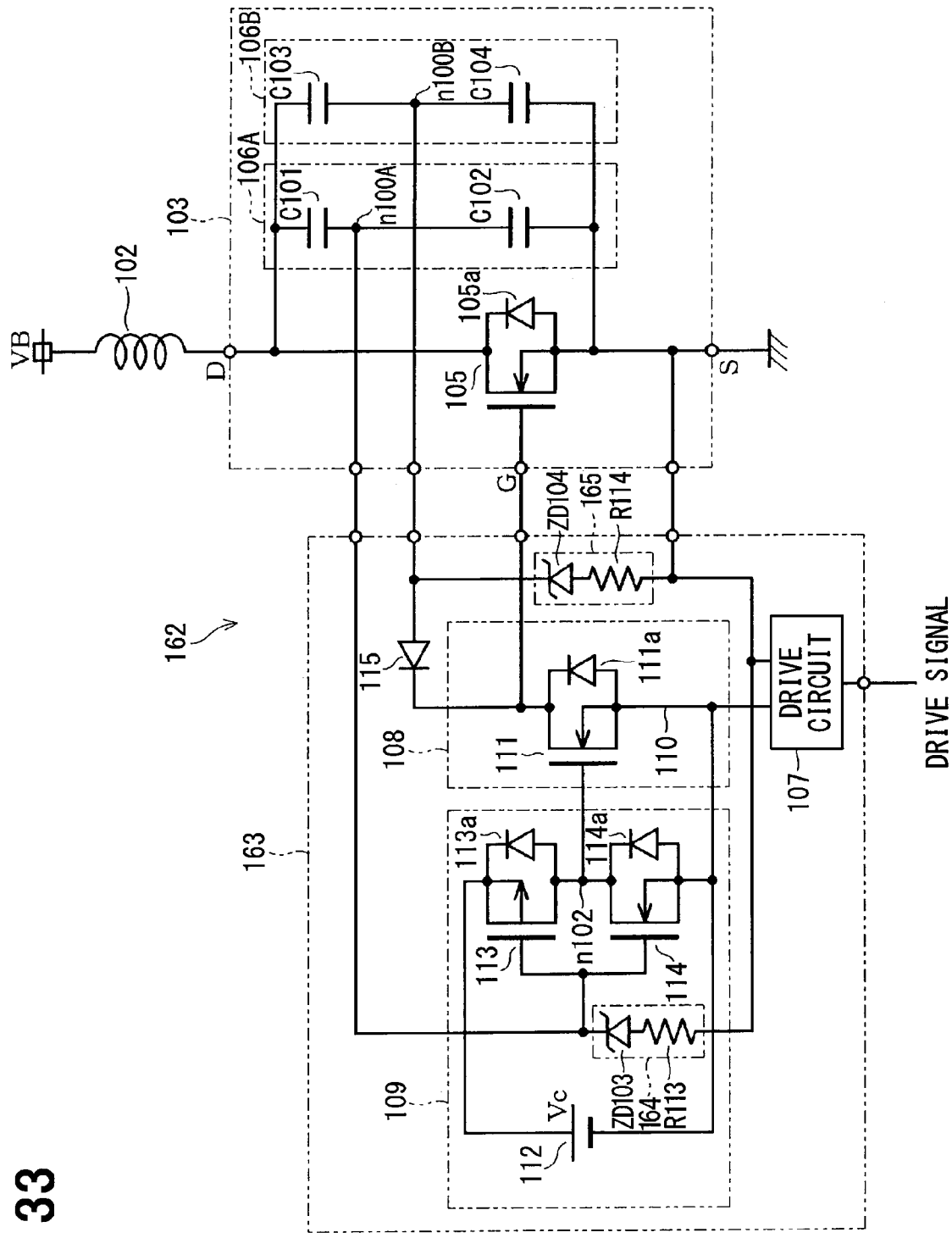
FIG. 33 is a schematic diagram of a load drive apparatus according to a twenty-ninth embodiment.
Figure 34:
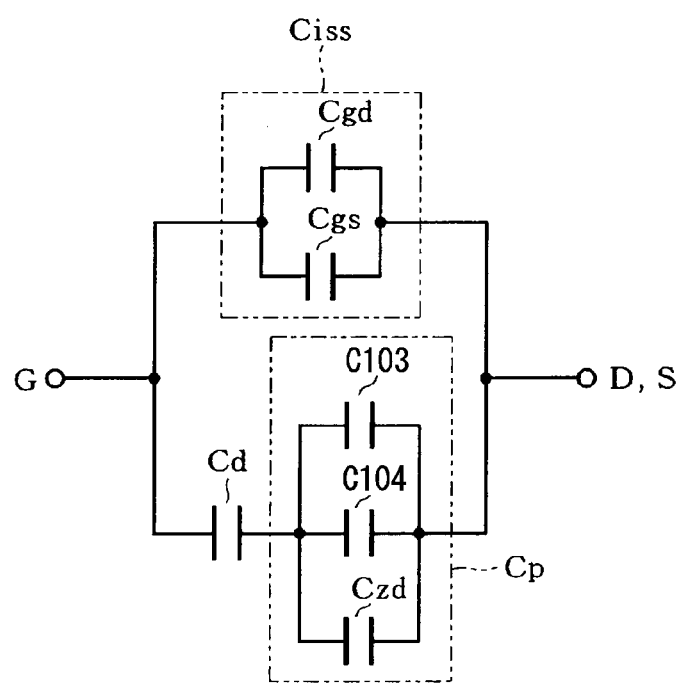
FIG. 34 is a diagram of an equivalent circuit of an input capacitance added to a gate of a switching device according to the twenty-ninth embodiment.

A twenty-ninth embodiment is described below with reference to FIGS. 33 and 34. A load drive apparatus 162 includes the device module 103 and a drive IC 163. In the drive IC 163, a protection circuit 164 is connected between the output terminal n100A of the first voltage detection circuit 106A and the source of the FET 105, and a protection circuit 165 is connected between the output terminal n100B of the second voltage detection circuit 106B and the source of the FET 105.

The protection circuit 164 is a series circuit of a Zener diode ZD103 and a resistor R113, and the protection circuit 165 is a series circuit of a Zener diode ZD104 and a resistor R114. Instead, they can be constructed with only a high-resistance resistor or a Zener diode. Alternatively, the protection circuits 164 and 165 can be provided to the device module side.

The protection circuit 164 limits the first detection voltage to a value not greater than the gate breakdown voltage of the MOSFETs 113 and 114 when an excessive surge voltage is applied between the drain and source of the FET 105. The protection circuit 165 limits the magnitude of the second detection voltage so that the gate voltage of the FET 105 can be equal to or less than the gate breakdown voltage when an excessive surge voltage is applied between the drain and source of the FET 105.

Since the protection circuit 164 is connected to the MOSFETs 113 and 114 which form an inverter circuit of the control circuit 109, there is no influence on the gate capacitance of the FET 105. On the other hand, a parasitic capacitance Czd of the Zener diode ZD104 is connected between the output terminal n100B of the second voltage detection circuit 106B and the source of the FET 105. Accordingly, the gate of the FET 105 is connected through the diode 115 to the capacitors C103, C104, and Czd. FIG. 34 shows an equivalent circuit of a capacitance added to the gate of the FET 105, where Cp=C103+C104+Czd.

Since the rated current of the diode 115 is very small, Cp<C103, C104. Therefore, a relationship between the combined capacitance Cp and Cd becomes as follows: Cd<<Cp. Therefore, an equivalent capacitance when the capacitors C103, C104, and Czd are viewed from the gate of the FET 105 through the diode 115 becomes a very small value almost equal to the junction capacitance of the diode 115. Further, a diode having a large rated current to serve as a bypass for a surge is not connected to the gate of the FET 105. Therefore, a parasitic capacitance added to the gate is small compared to a conventional structure. Accordingly, a breakdown voltage can be ensured while a fast switching performance (in particular, turn-on characteristic) of the FET 105 is ensured. Thus, the first detection voltage inputted to the control circuit 109 and the second detection voltage inputted to the gate of the FET 105 are stabilized, so that malfunctions of the control circuit 109 and the FET 105 due to noise or the like can be prevented.

It is preferable that the protection circuits 164 and 165 should be respectively provided to an output section of the first voltage detection circuit 106A and an output section of the second voltage detection circuit 106B. However, almost the same advantage can be obtained by providing only one of the protection circuits according to operating conditions and characteristics of the control circuit 109 and the FET 105.

Thirtieth Embodiment

Figure 35:
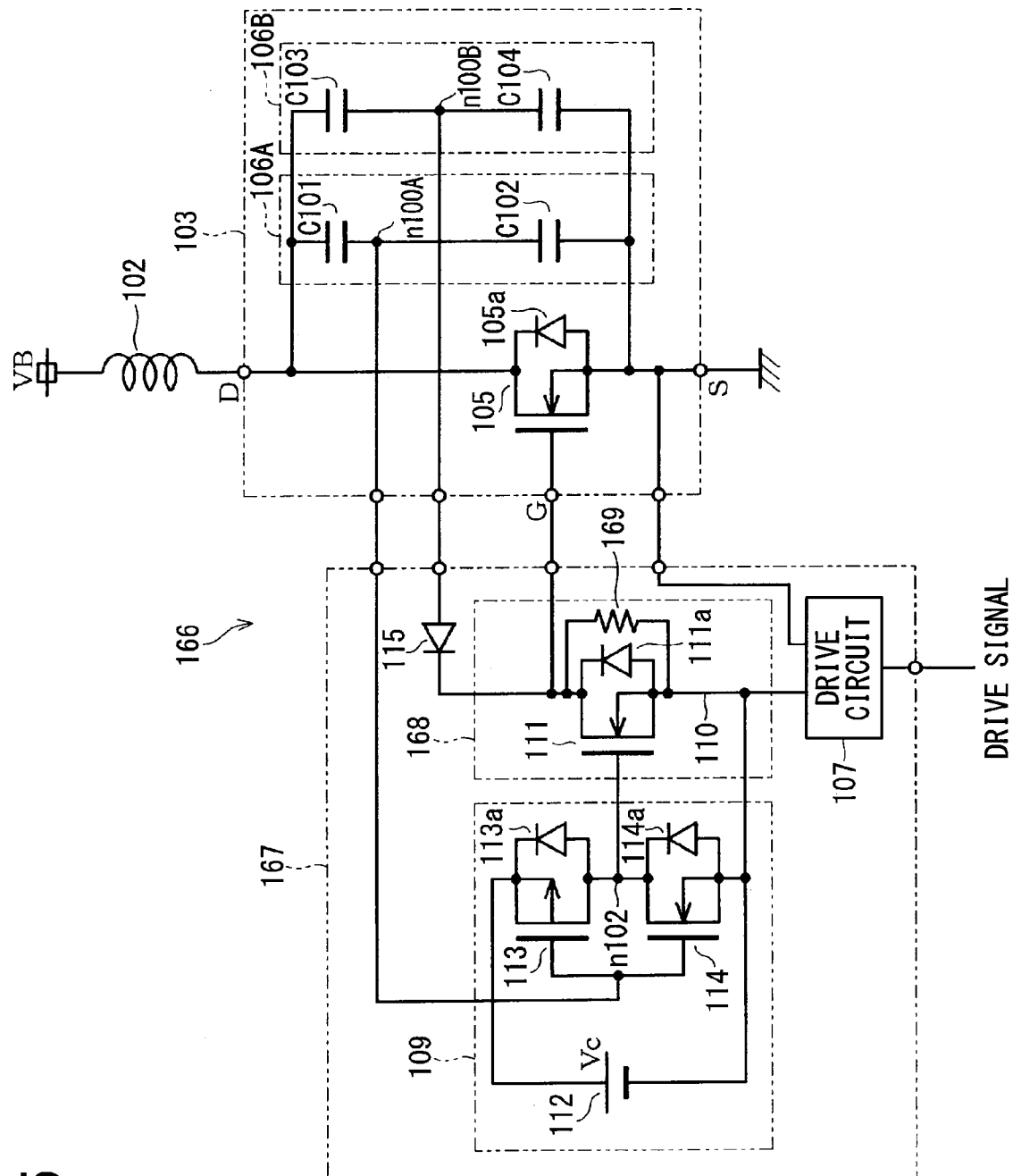
FIG. 35 is a schematic diagram of a load drive apparatus according to a thirtieth embodiment.

A thirtieth embodiment is described below with reference to FIG. 35. A load drive apparatus 166 includes the device module 103 and a drive IC 167. The drive IC 167 has a switch circuit 168 in which a resistor 169 is connected in parallel with the MOSFET 111. A resistance Rp of the resistor 169 is about ten times greater than those of normal gate resistors Rgon and Rgoff.

When a surge voltage occurs, and the drain-to-source voltage VDS of the FET 105 becomes equal to or greater than the voltage Vm1, the control circuit 109 turns OFF the MOSFET 111. At this time, impedance between an output terminal of the drive circuit 107 and the gate of the FET 105 becomes Rp, and the gate of the FET 105 becomes almost open-circuited. The addition of the resistor 169 facilitates adjustment of a voltage value at which the FET 105 is self-turned ON.

(Modifications)

While the present disclosure has been described with reference to the embodiments, it is to be understood that the disclosure is not limited to the embodiments. The present disclosure is intended to cover various modifications and equivalent arrangements within the spirit and scope of the present disclosure.

The first to fifteenth embodiments are based on the case where a surge voltage (including back electromotive force) induced when the coil 2 as an inductive load is de-energized is applied to the FET 5. The same is true for when overvoltage due to induction noise, fluctuations in the battery voltage VB, etc. is applied.

In the eighth embodiment, the Zener diodes ZD1 and ZD2 are used as an energization circuit for first and second circuits. Alternatively, the energization circuit can have other circuit structures as long as it conducts when an applied voltage exceeds a predetermined voltage. In the tenth to thirteenth embodiments, the Zener diodes 53a-53c, 56, and 59 are used as a voltage control circuit. Alternatively, the voltage control circuit can have other circuit structures as long as it conducts when an applied voltage exceeds a predetermined voltage. For example, it can include one or multiple semiconductor devices selected from a diode, a Zener diode, a MOS transistor, and a bipolar transistor, and the predetermined voltage is defined by its forward voltage, its Zener voltage, its threshold voltage, or a combination of these voltages.

The control circuits 23, 27, and 83 can be applied to the fourth to fourteenth embodiments in the same manner as described in the second, third, and fifteenth embodiments.

The first voltage control circuit 53, the Zener diodes 56 and 59 (second voltage control circuit), and the second voltage control circuit 62 can be applied to the second to ninth, fourteenth, and fifteenth embodiments in the same manner as described in the tenth to thirteenth embodiments.

The switch circuit 73 can be applied to the second to thirteenth, and fifteenth embodiments in the same manner as described in the fourteenth embodiment.

The voltage detection circuit is not limited to a series circuit of a first circuit and a second circuit, as long as it can output a detection voltage according to the voltage VDS applied between the drain and source of the FET 5.

Each of the above-described voltage detection circuits 6, 31, 34, 37, 40, 43, and 46 is configured as a series circuit of a first circuit and a second circuit. In this case, multiple voltage detection circuits can be provided. Alternatively, multiple first circuits or multiple second circuits can be provided.

The sixteenth to thirtieth embodiments are based on the case where a surge voltage (including back electromotive force) induced when the coil 102 as an inductive load is de-energized is applied to the FET 105. The same is true for when overvoltage due to induction noise, fluctuations in the battery voltage VB, etc. is applied.

In the twenty-sixth embodiment, the Zener diodes ZD101 and ZD102 are used as an energization circuit for first and second circuits. In the twenty-eighth embodiment, the Zener diode ZD101 is used as an energization circuit. Alternatively, the energization circuit can have other circuit structures as long as it conducts when an applied voltage exceeds a predetermined voltage. For example, it can include one or multiple semiconductor devices selected from a diode, a Zener diode, a MOS transistor, and a bipolar transistor, and the predetermined voltage is defined by its forward voltage, its Zener voltage, its threshold voltage, or a combination of these voltages.

The control circuits 123 and 127 can be applied to the nineteenth to twenty-ninth embodiments in the same manner as described in the seventeenth and eighteenth embodiments.

The protection circuits 164 and 165 can be applied to the nineteenth to twenty-fifth, and thirtieth embodiments in the same manner as described in the twenty-ninth embodiment. In this case, only one of the protection circuits 164 and 165 may be applied. Likewise, the protection circuit 164 or 165 can be applied to the twenty-sixth to twenty-eighth embodiments.

The switch circuit 168 can be applied to the seventeenth to twenty-ninth embodiments in the same manner as described in the thirtieth embodiment.

The first voltage detection circuit and the second voltage detection circuit described in the sixteenth to twenty-fifth, twenty-ninth, and thirtieth embodiments and the voltage detection circuit described in the twenty-sixth to twenty-eighth embodiments are not limited to a series circuit of a first circuit and a second circuit or a series circuit of a third circuit and a fourth circuit, as long as they can output a detection voltage according to the voltage VDS applied between the drain and source of the FET 105.

In the sixteenth to twenty-seventh, twenty-ninth, and thirtieth embodiments, the first circuit and the second circuit can have different structures, and the third circuit and the fourth circuit can have different structures. For example, in the nineteenth embodiment, the resistors R101 and R102 or the resistors R103 and R104 can be eliminated. In the twentieth and twenty-first embodiments, the resistors R105 and R106 or the resistors R107 and R108 can be eliminated. The same is true for the twenty-third to twenty-fifth embodiments. In cases where the first circuit and the second circuit have different structures, and the third circuit and the fourth circuit have different structures, the common circuit needs to have the same structure as either (i.e., the first and second circuits or the third and fourth circuits).

Application can be made to a switching power supply circuit, an inverter circuit, etc., besides a load drive apparatus.

The invention claimed is:

1. A semiconductor apparatus comprising:
a switching device configured to change a conduction state between a first terminal and a second terminal according to a gate voltage applied between a gate terminal and the first terminal;
a voltage detection circuit configured to output a detection voltage according to a voltage applied between the first terminal and the second terminal of the switching device;
a switch circuit provided in series with a gate drive wire connected to the gate terminal of the switching device and configured to switch between a high impedance state and a low impedance state according to a control signal, and
a control circuit having a threshold voltage, the control circuit configured to output the control signal to put the switch circuit into the low impedance state when the detection voltage is not greater than the threshold voltage and configured to output the control signal to put the switch circuit into the high impedance state when the detection voltage is greater than the threshold voltage, wherein
the threshold voltage is set less than the detection voltage which the voltage detection circuit outputs when a voltage within a range where a voltage protection operation for the switching device is necessary is applied between the first terminal and the second terminal of the switching device, and
the threshold voltage is set greater than the detection voltage which the voltage detection circuit outputs when a voltage within a range where the voltage protection operation for the switching device is unnecessary is applied between the first terminal and the second terminal of the switching device.

2. The semiconductor apparatus according to claim 1, wherein
the voltage detection circuit includes a first circuit and a second circuit which are connected in series between the first terminal and the second terminal of the switching device across an output terminal to output the detection voltage.

3. The semiconductor apparatus according to claim 2, wherein
each of the first circuit and the second circuit has a capacitor.

4. The semiconductor apparatus according to claim 3, wherein
each of the first circuit and the second circuit has a resistor connected in series with the capacitor.

5. The semiconductor apparatus according to claim 4, wherein each of the first circuit and the second circuit has another resistor connected in parallel with a series circuit of the resistor and the capacitor.

6. The semiconductor apparatus according to claim 3, wherein
each of the first circuit and the second circuit has a resistor connected in parallel with the capacitor.

7. The semiconductor apparatus according to claim 2, wherein
each of the first circuit and the second circuit has a resistor.

8. The semiconductor apparatus according to claim 2, wherein
each of the first circuit and the second circuit has an energization circuit which conducts when an applied voltage exceeds a predetermined voltage.

9. The semiconductor apparatus according to claim 8, wherein
the energization circuit includes one or a plurality of semiconductor devices selected from a diode, a Zener diode, a MOS transistor, and a bipolar transistor, and
the predetermined voltage is defined by a forward voltage, a Zener voltage, a threshold voltage, or a combination of these voltages.

10. The semiconductor apparatus according to claim 1, wherein
the control circuit includes a P-channel transistor and an N-channel transistor which have the threshold voltage and are connected to form an inverter between power supply wires to supply a DC voltage necessary to output the control signal across an output terminal to output the control signal, and
the detection voltage is applied to gates of these transistors.

11. The semiconductor apparatus according to claim 1, wherein
the control circuit includes a resistor and a transistor which are connected in series between power supply wires to supply a DC voltage necessary to output the control signal across an output terminal to output the control signal, and
the transistor has the threshold voltage, and
the detection voltage is applied to a gate of the transistor.

12. The semiconductor apparatus according to claim 1, further comprising:
a first voltage control circuit provided between the second terminal and the gate terminal of the switching device and configured to conduct when a voltage between these terminals exceeds a predetermined voltage which is set less than a breakdown voltage between the first terminal and the second terminal of the switching device.

13. The semiconductor apparatus according to claim 12, further comprising:
a second voltage control circuit provided between the gate terminal and the first terminal of the switching device and configured to conduct when a voltage between these terminals exceeds a predetermined voltage which is set less than a breakdown voltage of the gate terminal in a positive direction with respect to the first terminal of the switching device.

14. The semiconductor apparatus according to claim 12, further comprising:
a second voltage control circuit provided between the gate terminal and the first terminal of the switching device and configured to conduct when a voltage between these terminals exceeds a predetermined voltage which is set less than a breakdown voltage of the gate terminal in a negative direction with respect to the first terminal of the switching device.

15. The semiconductor apparatus according to claim 12, wherein
the voltage control circuit includes one or a plurality of semiconductor devices selected from a diode, a Zener diode, a MOS transistor, and a bipolar transistor, and
the predetermined voltage is defined by a forward voltage, a Zener voltage, a threshold voltage, or a combination of these voltages.

16. The semiconductor apparatus according to claim 1, wherein
the switch circuit includes a N-channel MOS transistor with a diode having a forward direction toward the gate of the switching device through the gate drive wire.

17. A semiconductor apparatus comprising:
a switching device configured to change a conduction state between a first terminal and a second terminal according to a gate voltage applied between a gate terminal and the first terminal;
a first voltage detection circuit configured to output a first detection voltage according to a voltage applied between the first terminal and the second terminal of the switching device;
a second voltage detection circuit configured to output a second detection voltage according to a voltage applied between the first terminal and the second terminal of the switching device;
a switch circuit provided in series with a gate drive wire connected to the gate terminal of the switching device and configured to switch between a high impedance state and a low impedance state according to a control signal;
an unidirectional device connected between an output terminal of the second voltage detection circuit and the gate terminal of the switching device and configured to pass an electric current in a direction from the output terminal to the gate terminal, and
a control circuit having a threshold voltage, the control circuit configured to output the control signal to put the switch circuit into the low impedance state when the first detection voltage is not greater than the threshold voltage and configured to output the control signal to put the switch circuit into the high impedance state when the first detection voltage is greater than the threshold voltage, wherein
the threshold voltage is set less than the first detection voltage which the first voltage detection circuit outputs when a voltage within a range where a voltage protection operation for the switching device is necessary is applied between the first terminal and the second terminal of the switching device, the threshold voltage is set greater than the first detection voltage which the first voltage detection circuit outputs when a voltage within a range where the voltage protection operation for the switching device is unnecessary is applied between the first terminal and the second terminal of the switching device, and a voltage division ratio of the second voltage detection circuit is set so that when the first detection voltage is not greater than the threshold voltage of the control circuit, the second detection voltage is less than a sum of a gate threshold voltage of the switching device and a conduction voltage of the unidirectional device, and so that when the voltage within the range where the voltage protection operation is necessary is applied between the first terminal and the second terminal of the switching device, the second detection voltage is greater than the sum of the gate threshold voltage of the switching device and the conduction voltage of the unidirectional device.

18. The semiconductor apparatus according to claim 17, wherein the first voltage detection circuit includes a first circuit and a second circuit which are connected in series between the first terminal and the second terminal of the switching device across an output terminal to output the first detection voltage, and the second voltage detection circuit includes a third circuit and a fourth circuit which are connected in series between the first terminal and the second terminal of the switching device across an output terminal to output the second detection voltage.

19. The semiconductor apparatus according to claim 18, wherein each of the first to fourth circuits has a capacitor.

20. The semiconductor apparatus according to claim 19, wherein each of the first circuit and the second circuit and/or each of the third circuit and the fourth circuit has a resistor connected in series with the capacitor.

21. The semiconductor apparatus according to claim 20, wherein each of the first to fourth circuits has another resistor connected in parallel with the capacitor or a series circuit of the resistor and the capacitor.

22. The semiconductor apparatus according to claim 19, wherein each of the first circuit and the second circuit and/or each of the third circuit and the fourth circuit has a resistor connected in parallel with the capacitor.

23. The semiconductor apparatus according to claim 18, wherein the first voltage detection circuit and the second voltage detection circuit have a common circuit between the first terminal of the switching device and each of the second circuit and the fourth circuit, and the first voltage detection circuit and the second voltage detection circuit share a use of the common circuit.

24. The semiconductor apparatus according to claim 23, wherein the common circuit is identical in connection structure of a capacitor and/or a resistor with each of the first circuit and the second circuit or each of the third circuit and the fourth circuit.

25. A semiconductor apparatus comprising:

a switching device configured to change a conduction state between a first terminal and a second terminal according to a gate voltage applied between a gate terminal and the first terminal;

a voltage detection circuit configured to output a first detection voltage according to a voltage applied between the first terminal and the second terminal of the switching device;

a switch circuit provided in series with a gate drive wire connected to the gate terminal of the switching device and configured to switch between a high impedance state and a low impedance state according to a control signal;

an unidirectional device connected between an output terminal of the voltage detection circuit and the gate terminal of the switching device and configured to pass an electric current in a direction from the output terminal to the gate terminal, and a control circuit having a threshold voltage, the control circuit configured to output the control signal to put the switch circuit into the low impedance state when the first detection voltage is not greater than the threshold voltage and configured to output the control signal to put the switch circuit into the high impedance state when the first detection voltage is greater than the threshold voltage, wherein the threshold voltage is set less than the first detection voltage which the voltage detection circuit outputs when a voltage within a range where a voltage protection operation for the switching device is necessary is applied between the first terminal and the second terminal of the switching device, the threshold voltage is set greater than the first detection voltage which the voltage detection circuit outputs when a voltage within a range where the voltage protection operation for the switching device is unnecessary is applied between the first terminal and the second terminal of the switching device, and a voltage division ratio of the voltage detection circuit is set so that when the voltage within the range where the voltage protection operation is necessary is applied between the first terminal and the second terminal of the switching device, the first detection voltage is greater than a sum of a gate threshold voltage of the switching device and a conduction voltage of the unidirectional device.

26. The semiconductor apparatus according to claim 25, wherein the voltage detection circuit includes a first circuit and a second circuit which are connected in series between the first terminal and the second terminal of the switching device across the output terminal.

27. The semiconductor apparatus according to claim 26, wherein each of the first circuit and the second circuit has a resistor.

28. The semiconductor apparatus according to claim 26, wherein each of the first circuit and the second circuit has an energization circuit which conducts when an applied voltage exceeds a predetermined voltage.

29. The semiconductor apparatus according to claim 28, wherein the energization circuit includes one or a plurality of semiconductor devices selected from a diode, a Zener diode, a MOS transistor, and a bipolar transistor, and the predetermined voltage is defined by a forward voltage, a Zener voltage, a threshold voltage, or a combination of these voltages.

30. The semiconductor apparatus according to claim 25, wherein
the control circuit includes transistors which have the threshold voltage and are connected to form an inverter between power supply wires to supply a DC voltage necessary to output the control signal, and
the first detection voltage is applied to gates of these transistors.

31. The semiconductor apparatus according to claim 25, wherein
the switching device is a GaN device.

* * * * *